(12) United States Patent
Choi et al.

(10) Patent No.: US 9,450,151 B2
(45) Date of Patent: Sep. 20, 2016

(54) SEMICONDUCTOR LIGHT-EMITTING DEVICE

(71) Applicant: Samsung Electronics Co., Ltd., Suwon-si (KR)

(72) Inventors: Pun Jae Choi, Yongin-si (KR); Young Soo Park, Yongin-si (KR); Yung Ho Ryu, Suwon-si (KR); Tae Young Park, Yongin-si (KR); Jin Gi Hong, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/717,942

(22) Filed: May 20, 2015

(65) Prior Publication Data

US 2016/0064611 A1    Mar. 3, 2016

(30) Foreign Application Priority Data

Sep. 2, 2014    (KR) .......................... 10-2014-0116461

(51) Int. Cl.
| | |
|---|---|
| *H01L 21/00* | (2006.01) |
| *H01L 33/38* | (2010.01) |
| *H01L 33/42* | (2010.01) |
| *H01L 33/40* | (2010.01) |
| *H01L 33/62* | (2010.01) |

(52) U.S. Cl.
CPC ........... *H01L 33/382* (2013.01); *H01L 33/405* (2013.01); *H01L 33/42* (2013.01); *H01L 33/62* (2013.01); *H01L 2224/16225* (2013.01); *H01L 2224/16245* (2013.01); *H01L 2224/48091* (2013.01); *H01L 2224/48227* (2013.01); *H01L 2224/48237* (2013.01)

(58) Field of Classification Search
CPC .... H01L 33/382; H01L 33/62; H01L 33/405
See application file for complete search history.

(56) References Cited

U.S. PATENT DOCUMENTS

| | | | |
|---|---|---|---|
| 6,287,882 B1 | 9/2001 | Chang et al. | |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,784,463 B2 * | 8/2004 | Camras | ................... H01L 33/02 257/103 |
| 6,818,465 B2 | 11/2004 | Biwa et al. | |
| 6,818,530 B2 | 11/2004 | Shimoda et al. | |
| 6,858,081 B2 | 2/2005 | Biwa et al. | |

(Continued)

FOREIGN PATENT DOCUMENTS

| | | |
|---|---|---|
| KR | 10-1007113 B1 | 1/2011 |
| KR | 10-1106151 B1 | 1/2012 |

*Primary Examiner* — Laura Menz
(74) *Attorney, Agent, or Firm* — Muir Patent Law, PLLC

(57) ABSTRACT

A semiconductor light-emitting device includes a laminated semiconductor structure having a first surface and a second surface opposing each other, a first conductivity-type semiconductor layer and a second conductivity-type semiconductor layer respectively forming the first surface and the second surface, and an active layer. First and second electrodes are disposed on the first surface of the laminated semiconductor structure and the second surface of the laminated semiconductor structure, respectively. A connecting electrode extends to the first surface to be connected to the second electrode. A support substrate is disposed on the second electrode, and an insulating layer insulates the connecting electrode from the active layer and the first conductivity-type semiconductor layer.

20 Claims, 39 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,166,865 B2 | 1/2007 | Kurahashi et al. |
| 7,172,909 B2 | 2/2007 | Liu et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,335,523 B2 * | 2/2008 | Liu ............... H01L 33/507 257/E25.021 |
| 7,422,915 B2 | 9/2008 | Chen |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,875,473 B2 | 1/2011 | Fan et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,211,722 B2 | 7/2012 | Lu |
| 8,236,582 B2 | 8/2012 | Neff et al. |
| 8,263,987 B2 | 9/2012 | Choi et al. |
| 8,319,243 B2 | 11/2012 | Fudeta |
| 8,324,646 B2 | 12/2012 | Lee et al. |
| 8,329,482 B2 | 12/2012 | Yao et al. |
| 8,399,944 B2 | 3/2013 | Kwak et al. |
| 8,405,106 B2 | 3/2013 | Hsu et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,155,146 B2 * | 10/2015 | Lee ............... H05B 33/0818 |
| 9,318,647 B2 * | 4/2016 | Kim ............... H01L 33/0075 |
| 2006/0081869 A1 * | 4/2006 | Lu ............... H01L 33/405 257/99 |
| 2008/0191215 A1 * | 8/2008 | Choi ............... H01L 33/382 257/76 |
| 2010/0029023 A1 * | 2/2010 | Neff ............... H01L 33/0095 438/15 |
| 2010/0127285 A1 | 5/2010 | Jeong |
| 2011/0156064 A1 * | 6/2011 | Seo ............... H01L 25/0753 257/88 |
| 2011/0266560 A1 | 11/2011 | Yao et al. |
| 2011/0294242 A1 | 12/2011 | Lu |
| 2012/0223334 A1 | 9/2012 | Sung |
| 2014/0054638 A1 | 2/2014 | Lester et al. |
| 2014/0070714 A1 * | 3/2014 | Lee ............... H05B 33/0818 315/186 |
| 2015/0221843 A1 * | 8/2015 | Choi ............... H01L 33/20 257/98 |
| 2016/0064611 A1 * | 3/2016 | Choi ............... H01L 33/382 257/98 |
| 2016/0109096 A1 * | 4/2016 | Park ............... F21V 7/0033 362/84 |

* cited by examiner

SEMICONDUCTOR LIGHT-EMITTING DEVICE

CROSS-REFERENCE TO RELATED APPLICATION

This application claims priority under 35 U.S.C. §119 to Korean Patent Application No. 10-2014-0116461 filed on Sep. 2, 2014, with the Korean Intellectual Property Office, the entire disclosure of which is incorporated herein by reference.

BACKGROUND

The present inventive concept relates to a semiconductor light emitting device.

Semiconductor light-emitting diodes (LEDs) are widely used as light sources due to a range of advantages thereof, such as low power consumption and high degrees of brightness. In particular, recently, semiconductor light-emitting devices have been employed as illumination apparatuses and backlight devices in large-sized liquid crystal displays (LCDs). Such semiconductor light-emitting devices may have a structure (e.g. a package structure) able to be connected to an external circuit in order to allow for the installation thereof in various devices such as illumination apparatuses.

Meanwhile, a substrate used in an epitaxial growth process for a semiconductor light-emitting device (hereinafter referred to as 'a growth substrate') may be removed after semiconductor light-emitting device growth. The substrate may be removed due to electrical connection or optical loss issues arising therefrom. In this case, another method of supporting an epitaxially grown thin-film may be required. For example, an electrode structure having a certain thickness (e.g. a thickness of 60 μm to 150 μm) or more, or a substrate including the electrode structure, may be employed in a semiconductor light-emitting device.

However, the method may be disadvantageous for dissipating heat emitted from an active layer, and particularly, may deteriorate device characteristics due to heat generated during high-current operations, causing degradations in reliability.

SUMMARY

An aspect of the present disclosure relates to a semiconductor light-emitting device having a novel electrode structure aimed at addressing problems existing in current light-emitting devices.

According to an exemplary embodiment, a semiconductor light-emitting device includes a laminated semiconductor structure having a first surface and a second surface opposing each other, a first conductivity-type semiconductor layer and a second conductivity-type semiconductor layer respectively forming the first surface and the second surface, and an active layer disposed between the first conductivity-type semiconductor layer and the second conductivity-type semiconductor layer. A first electrode is disposed on the first surface of the laminated semiconductor structure and connected to the first conductivity-type semiconductor layer, and a second electrode is disposed on a majority of the second surface of the laminated semiconductor structure and connected to the second conductivity-type semiconductor layer. A connecting electrode is connected to the second electrode and extends to the first surface of the laminated semiconductor structure. A support substrate is disposed on the second electrode, and an insulating layer is disposed to insulate the connecting electrode from the active layer and the first conductivity-type semiconductor layer.

The first conductivity-type semiconductor layer may be an n-type semiconductor layer, and the second conductivity-type semiconductor layers may be a p-type semiconductor layer.

The second electrode may include a light-transmissive electrode, and the support substrate may include a light-transmissive substrate.

The first electrode may include a reflective electrode.

The semiconductor light-emitting device may further include first and second conductive bumps respectively disposed on portions of the first electrode and the connecting electrode on the first surface.

The first surface of the laminated semiconductor structure may be provided as a main light-emitting surface, and the first electrode may be disposed on a portion of the first surface of the laminated semiconductor structure.

The laminated semiconductor structure may include a through-hole extending from the first surface to the second surface to expose a portion of the second electrode, and the connecting electrode may be connected to the exposed portion of the second electrode, disposed on an inner sidewall of the through-hole, and may extend to the first surface of the laminated semiconductor structure.

The semiconductor light-emitting device may further include an etch-stop layer disposed on the portion of the second electrode connected to the through-hole.

The etch-stop layer may include a conductive material and may be disposed between the second electrode and the support substrate. At least a section of the portion of the second electrode on which the through-hole is formed may be removed to expose a portion of the etch-stop layer, and the connecting electrode may be connected to the exposed portion of the etch-stop layer. The semiconductor light-emitting device may further include at least one finger electrode connected to the etch-stop layer and extending into a space between the second electrode and the support substrate.

Alternatively, the etch-stop layer may include an insulating material, and may be located to surround the exposed portion of the second electrode.

The semiconductor light-emitting device may further include a planarization layer located between the second electrode and the support substrate, and having a planarized surface bonded to the support substrate.

The insulating layer may be disposed on the inner sidewall of the through-hole and may extend to the first surface of the laminated semiconductor structure. In this case, the insulating layer may extend to cover a portion of the first electrode, and the connecting electrode may extend onto the extending portion of the insulating layer.

The semiconductor light-emitting device may further include an insulating member surrounding side surfaces of the laminated semiconductor structure. The connecting electrode may be disposed on the side surfaces of the laminated semiconductor structure, and the insulating layer may be disposed between the connecting electrode and the side surfaces of the laminated semiconductor structure.

The insulating member may include a light-transmissive adhesive material and may be disposed between the second surface of the laminated semiconductor structure and the support substrate to bond the laminated semiconductor structure to the support substrate. The insulating member may be formed of the same material as the support substrate.

The semiconductor light-emitting device may further include an electrode protection layer disposed between the second electrode and the support substrate and configured to protect the second electrode.

The support substrate may be formed of glass or a polymer resin. The support substrate may include a phosphor or a quantum dot.

According to an exemplary embodiment, a semiconductor light-emitting device includes a laminated semiconductor structure including a first surface and a second surface opposing each other, a first conductivity-type semiconductor layer and a second conductivity-type semiconductor layer respectively forming the first surface and the second surface, and an active layer disposed between the first conductivity-type semiconductor layer and the second conductivity-type semiconductor layer. A first electrode is disposed on the first surface of the laminated semiconductor structure and is connected to the first conductivity-type semiconductor layer. A second electrode is disposed on a majority of the second surface of the laminated semiconductor structure, is connected to the second conductivity-type semiconductor layer, and is formed of a light-transmissive electrode. A connecting electrode is connected to the second electrode to extend to the first surface of the laminated semiconductor structure, and a portion of the connecting electrode disposed on the first surface is provided as a pad area. A light-transmissive substrate is disposed on the second electrode, and an insulating layer is disposed to insulate the connecting electrode from the active layer and the first conductivity-type semiconductor layer. The insulating layer extends to cover a portion of the first electrode, and the pad area of the connecting electrode is disposed on the extended portion of the insulating layer.

In one example, a light-transmissive adhesive layer is disposed between the light-transmissive substrate and the second electrode. The connecting electrode may be disposed on side surfaces of the laminated semiconductor structure, and the insulating layer may be disposed between the connecting electrode and the side surfaces of the laminated semiconductor structure. The semiconductor light-emitting device may further include an insulating member surrounding the side surfaces and the first surface of the laminated semiconductor structure and formed of a light-transmissive adhesive material to be bonded to the light-transmissive substrate. The side surfaces of the laminated semiconductor structure may include a surface inclined toward the second surface.

According to an exemplary embodiment, a semiconductor light-emitting device includes a support substrate including an upper surface divided into a first region and a second region, wherein the first region is provided as a pad area. A laminated semiconductor structure includes a second conductivity-type semiconductor layer, an active layer, and a first conductivity-type semiconductor layer sequentially disposed in the second region of the upper surface of the support substrate. A first electrode is disposed on the first conductivity-type semiconductor layer, and a second electrode is disposed between the second conductivity-type semiconductor layer and the support substrate and extends to the first region.

The support substrate may include a light-transmissive substrate. The second electrode may include a light-transmissive electrode disposed between the second conductivity-type semiconductor layer and the support substrate, a metal electrode connected to the light-transmissive electrode and disposed in the second region, and a pad electrode disposed on the metal electrode.

The metal electrode may include a first surface having a portion connected to the light-transmissive electrode, and a second surface opposite to the first surface. The second surface may be buried in the support substrate. The metal electrode may include at least one finger electrode extending into a space between the light-transmissive electrode and the support substrate.

According to a further exemplary embodiment, a semiconductor light-emitting device includes a laminated semiconductor structure including a second conductivity-type semiconductor layer, an active layer, and a first conductivity-type semiconductor layer that are sequentially stacked. A first electrode is disposed on the first conductivity-type semiconductor layer, and a second electrode is disposed on the second conductivity-type semiconductor layer. An insulating layer is disposed on an exposed edge of the sequential stack of the second conductivity-type semiconductor layer, the active layer, and the first conductivity-type semiconductor layer. A connecting electrode is connected to the second electrode and extends on the insulating layer to a surface of the laminated semiconductor having the first conductivity-type semiconductor layer.

The laminated semiconductor structure may have a plurality of through-holes extending through the second conductivity-type semiconductor layer, the active layer, and the first conductivity-type semiconductor layer. The insulating layer may be disposed on an exposed edge of each of the plurality of through-holes. The connecting electrode may be disposed on the insulating layer of each through-hole to extend from the insulating layer to the surface of the laminated semiconductor having the first conductivity-type semiconductor layer.

The semiconductor light-emitting device may further include a light-transmissive substrate disposed on the second electrode. A plurality of etch stop contacts may be disposed between the light-transmissive substrate and the second electrode, and may each be aligned with a respective through-hole of the plurality of through-holes. A plurality of finger electrodes may be disposed between the light-transmissive substrate and the second electrode, and may extend from each of the plurality of etch stop contacts.

The semiconductor light-emitting device may alternatively include a plurality of etch stop contacts disposed between the second conductivity-type semiconductor layer and the second electrode, and each etch stop contact may be aligned with a respective through-hole of the plurality of through-holes. The through-holes and the connecting electrode may extend through the etch stop contacts.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
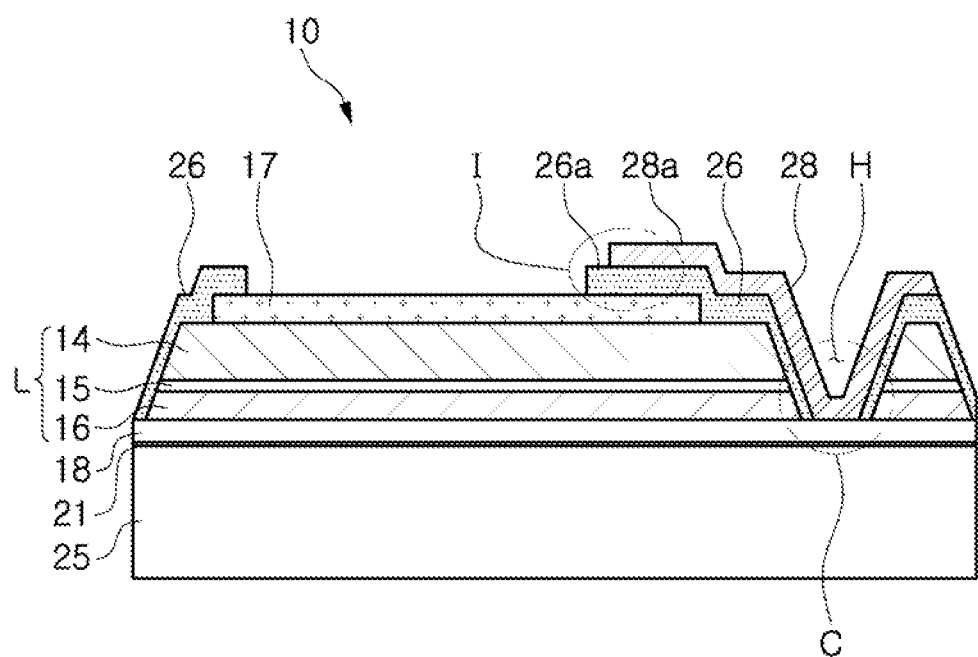
FIG. 1 is a cross-sectional view of a semiconductor light-emitting device according to an exemplary embodiment.

Hereinafter, embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements. Throughout this disclosure, directional terms, such as "upper portion," "upper surface," "lower portion," "lower surface," or "side surface", indicate positions relative to the particular orientations shown in the drawings. The terms should be understood to more broadly refer to relative positions of various elements, and may thus vary depending on a direction or orientation in which a light-emitting device is held or disposed.

Reference throughout this disclosure to "one exemplary embodiment" or "an exemplary embodiment" are provided to emphasize particular features, structures, or characteristics, and do not necessarily refer to the same embodiment. Furthermore, the particular features, structures, or characteristics may be combined in any suitable manner in one or more embodiments. For example, a context described in a specific exemplary embodiment may be used in other embodiments, even if it is not described in the other embodiments, unless it is specifically described as being contrary to or inconsistent with the context in the other embodiments.

FIG. 1 is a cross-sectional view of a semiconductor light-emitting device according to an exemplary embodiment of the present disclosure.

Referring to FIG. 1, a semiconductor light-emitting device 10 according to the exemplary embodiment of the present disclosure may include a laminated semiconductor structure L having a first conductivity-type semiconductor layer 14, a second conductivity-type semiconductor layer 16, an active layer 15 disposed between the first conductivity-type semiconductor layer 14 and the second conductivity-type semiconductor layer 16. The semiconductor light-emitting device 10 may further include first and second electrodes 17 and 18 respectively connected to the first conductivity-type semiconductor layer 14 and the second conductivity-type semiconductor layer 16.

In the exemplary embodiment, the first and second electrodes 17 and 18 may be disposed on a first surface and a second surface opposing each other in the laminated semiconductor structure L. A support substrate 25 may be disposed on the second electrode 18 to support the laminated semiconductor structure L.

The semiconductor light-emitting device 10 may further include a connecting electrode 28 as an electrode component related to the second electrode 18. The connecting electrode 28 may be connected to the second electrode 18 and may extend to the first surface of the laminated semiconductor structure L.

The connecting electrode 28 according to the exemplary embodiment may be formed using a through-hole H extending through the laminated semiconductor structure L and connecting the first surface and the second surface of the laminated semiconductor structure L. A portion of the second electrode 18 may be exposed by the through-hole H, and the exposed portion may be provided as a contact area C connected to the connecting electrode 28. The connecting electrode 28 may be connected to the contact area C of the second electrode 18 and formed on an inner sidewall of the through-hole H. A portion 28*a* of the connecting electrode 28, disposed on the first surface of the laminated semiconductor structure L, may be provided as a pad area.

In this manner, the second electrode 18 disposed on the second surface of the laminated semiconductor structure L may be drawn to the first surface opposing the second surface by the connecting electrode 28, and thus a pad area connecting the second electrode 18 to an external circuit may be provided on the first surface of the laminated semiconductor structure L.

Such an electrode structure may be more beneficially applied in the case that the first conductivity-type semiconductor layer 14 and the second conductivity-type semiconductor layer 16 are n-type and p-type nitride semiconductor layers, respectively. Since the p-type nitride semiconductor layer has a greater degree of contact resistance than the n-type nitride semiconductor layer, it is difficult to implement an ohmic contact. However, in this exemplary embodiment, since the second electrode 18 is disposed on the second surface of the laminated semiconductor structure L, a contact area between the second electrode 18 and the second conductivity-type semiconductor layer 16 may be enlarged, and thus an ohmic contact with the p-type nitride semiconductor layer may be secured.

The semiconductor light-emitting device 10 according to the exemplary embodiment may be a flip-chip structure in which light is mainly emitted in the direction of the support substrate 25.

The first electrode 17 may include an electrode material having high reflectance as well as ohmic contact characteristics. For example, the first electrode 17 may include Ag, Ni, Al, Rh, Pd, Ir, Ru, Mg, Zn, Pt, Au, or the like. Alternatively, the first electrode 17 may include a transparent conductive oxide such as indium tin oxide (ITO), or a transparent conductive nitride. For example, the first electrode 17 may be implemented as a combination of the light-transmissive electrode and a reflective electrode, or a combination of the light-transmissive electrode and an insulating material such as $SiO_2$.

The second electrode 18 may include a light-transmissive electrode, and the support substrate 25 may include a light-transmissive substrate. The second electrode 18 may be a light-transmissive metal such as Ni/Au, a transparent conductive oxide such as ITO, or a transparent conductive nitride. The support substrate 25 may be a glass substrate or a substrate formed of a light-transmissive polymer resin.

The connecting electrode 28 may be electrically isolated from the first conductivity-type semiconductor layer 14 and the active layer 15 by an insulating layer 26. As illustrated in FIG. 1, the insulating layer 26 may be formed on the inner sidewall of the through-hole H. The insulating layer 26 may be formed on side surfaces of the laminated semiconductor structure L and provided as a passivation layer for the semiconductor light-emitting device 10. The insulating layer 26 may also be formed to extend onto a surface of the first electrode 17. The insulating layer 26 may be silicon oxide or silicon nitride.

In the exemplary embodiment, the first electrode 17 may have a sufficient area in order to efficiently reflect light. Meanwhile, the pad area 28*a* disposed on the first surface of the laminated semiconductor structure L may extend onto a portion of an upper surface of the first electrode 17 so that the connecting electrode 28 has a sufficient pad area connected to (or for connection to) the external circuit. The insulating layer 26 may include an additionally extending portion 26*a* (please see "I" in FIG. 1) disposed between the pad area 28*a* and the first electrode 17 so that the pad area 28*a* and the first electrode 17 are not electrically connected to each other.

Figure 2A:
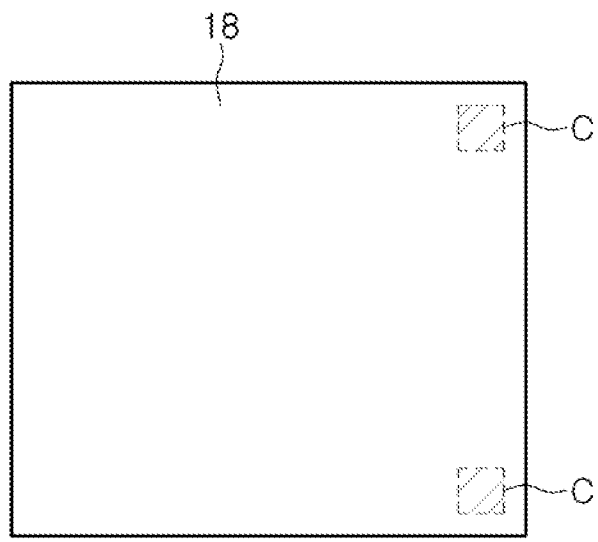
FIGS. 2A and 2B are bottom and top plan views, respectively, illustrating an example of an electrode layout of the semiconductor light-emitting device illustrated in FIG. 1.
Figure 2B:
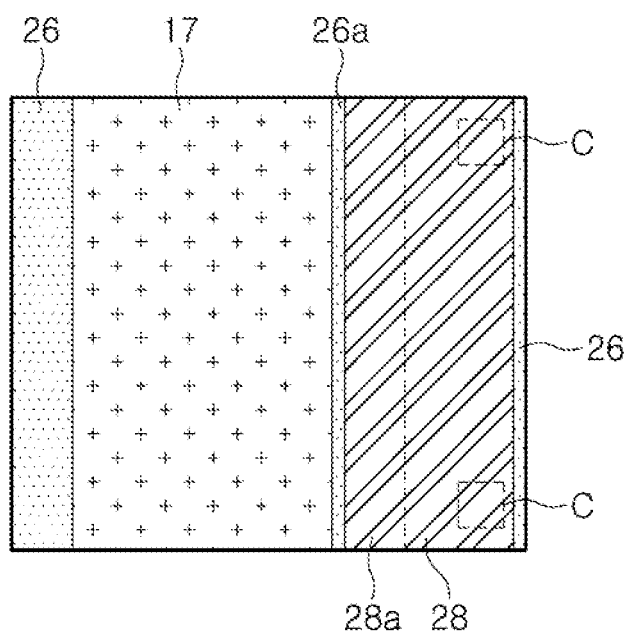

A specific example of an electrode layout employable in the exemplary embodiment of the present disclosure is illustrated in FIGS. 2A and 2B. FIGS. 2A and 2B illustrate an example of layouts of electrodes respectively disposed on a second surface and a first surface of a laminated semiconductor structure L.

As illustrated in FIG. 2A, the second electrode 18 may be formed on a majority of one surface of the second conductivity-type semiconductor layer 16. As described above, since the second electrode 18 is formed on the majority of the surface of the second conductivity-type semiconductor layer 16, contact resistance may be lowered. The second electrode 18 may be connected to a connecting electrode 28 through two contact areas C located at (or adjacent to, or proximate to) two corners of the second electrode 18.

As illustrated in FIG. 2B, since a pad area 28*a* of the connecting electrode 28 extends to a portion of an upper surface of the first electrode 17, a relatively sufficient pad area may be secured. The insulating layer 26 may also have an extending portion 26*a* extending to the portion of the upper surface of the first electrode 17 in order to electrically isolate the first electrode 17 from the connecting electrode 28.

The electrode layout employable in the semiconductor light-emitting device illustrated in FIG. 1 may not be limited to the above-described example, and may be modified in various manners. For example, the electrode layout may be implemented in the same manner as that illustrated in FIG. 3.

Figure 3:
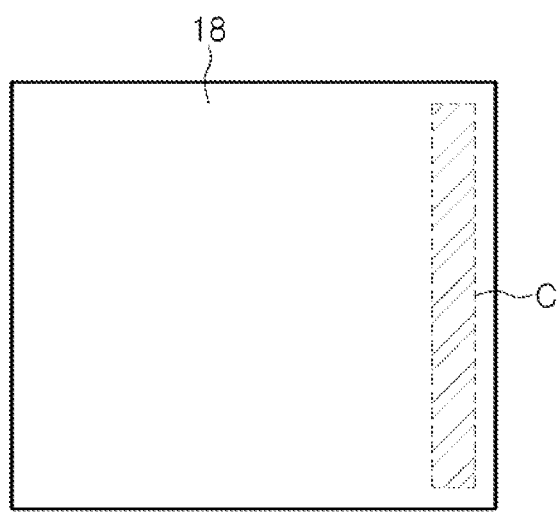
FIG. 3 is a bottom plan view illustrating another example of an electrode layout of the semiconductor light-emitting device illustrated in FIG. 1.

As illustrated in FIG. 3, a contact area C may be provided in the form of a line adjacent or proximate to an edge of the laminated semiconductor structure L. Such a contact area C may be obtained by forming a through-hole H adjacent to the edge of the laminated semiconductor structure L and connecting the connecting electrode to a portion of second electrode 18, exposed through the through-hole H.

Figure 4:
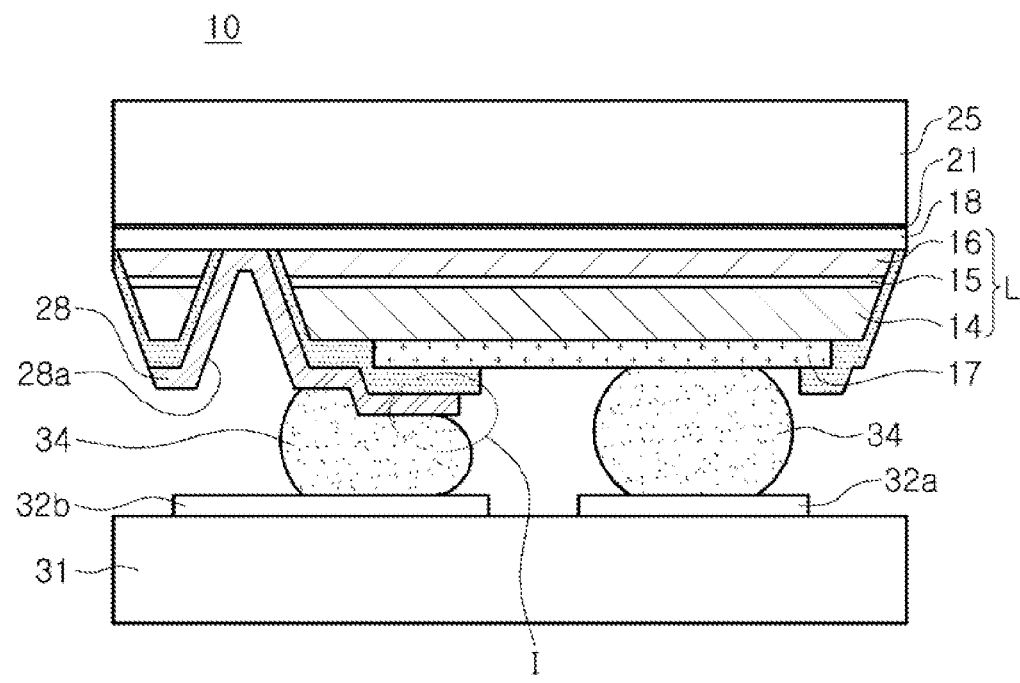
FIG. 4 illustrates an example in which the semiconductor light-emitting device illustrated in FIG. 1 is flip-chip bonded to a circuit substrate.

FIG. 4 illustrates an example in which the semiconductor light-emitting device illustrated in FIG. 1 is flip-chip bonded to a circuit substrate.

Referring to FIG. 4, a circuit substrate 31 including the semiconductor light-emitting device 10 mounting thereon is illustrated.

The semiconductor light-emitting device 10 may be a flip-chip structure in which conductive bumps 34 respectively arranged on the first electrode 17 and the pad area 28*a* of the connecting electrode 28, disposed on the first surface, are further included. The conductive bump 34 may be bumps formed of a conductive metal such as Au/Sn. The semiconductor light-emitting device 10 may be electrically connected to first and second circuit patterns 32*a* and 32*b* disposed on the circuit substrate 31 by the conductive bump 34. In the exemplary embodiment, as described above, the second electrode 18 may be a light-transmissive electrode such as ITO, and the support substrate 25 may be a light-transmissive substrate such as a glass substrate, so that light is emitted in the direction of the support substrate 25.

FIGS. 5A to 5G are cross-sectional views illustrating main processes in a method of fabricating the semiconductor light-emitting device illustrated in FIG. 1. Here, although only a part corresponding to two semiconductor light-emitting devices is illustrated in the drawings for convenience and easier understanding of description, the processes may be understood as wafer-level processes, and a substrate 11 may be a part of a wafer.

Figure 5A:
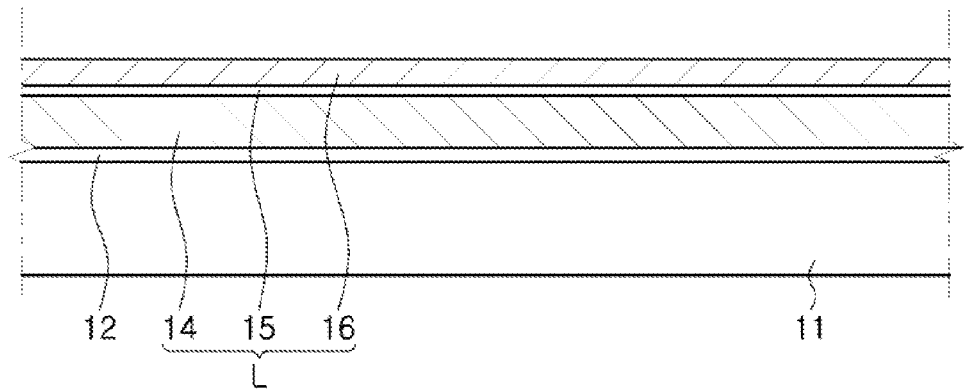
FIGS. 5A to 5G are cross-sectional views illustrating main process steps in a method of fabricating the semiconductor light-emitting device illustrated in FIG. 1.

As illustrated in FIG. 5A, a laminated semiconductor structure L may be formed on a growth substrate 11 to form a plurality of light-emitting devices.

The laminated semiconductor structure L may include a first conductivity-type semiconductor layer 14, an active layer 15, and a second conductivity-type semiconductor layer 16 that are sequentially grown on a surface of the substrate 11. The growth process may include a process well-known in the art, such as metal organic chemical vapor deposition (MOCVD), hydride vapor phase epitaxy (HVPE), or molecular beam epitaxy (MBE).

As necessary, an insulating, a conductive, or a semiconductor substrate may be used as the growth substrate 11. For example, the growth substrate 11 may be sapphire, SiC, Si, $MgAl_2O_4$, MgO, $LiAlO_2$, $LiGaO_2$, or GaN.

The laminated semiconductor structure L may be a nitride semiconductor material. For example, the first conductivity-type semiconductor layer 14 and the second conductivity-type semiconductor layer 16 may be a single-crystalline nitride having a composition of $Al_xIn_yGa_{1-x-y}N$ ($0 \le x \le 1$, $0 \le y \le 1$, and $0 \le x+y \le 1$), but are not limited thereto. An AlGaInP-based semiconductor material or an AlGaAs-based semiconductor material may be used as the first conductivity-type semiconductor layer 14 and the second conductivity-type semiconductor layer 16. The first conductivity-type semiconductor layer 14 and the second conductivity-type semiconductor layer 16 may include n-type and p-type semiconductor materials, respectively. The active layer 15 may be a multi-quantum well (MQW) structure in which quantum well layers and quantum barrier layers are alternately stacked. For example, in the case of a nitride semiconductor material, the active layer 15 may be a GaN/InGaN MQW structure. Alternatively, the active layer 15 may be a single-quantum well (SQW) structure.

The laminated semiconductor structure L may be formed (e.g., grown) on a buffer layer 12 disposed on the substrate 11. The buffer layer 12 may be used in order to reduce displacements caused by mismatches in lattice constants between the substrate 11 and the laminated semiconductor structure L which will be formed in a subsequent process, deformation caused by a difference in thermal expansion coefficients, and crack generation. The buffer layer 12 may be formed (e.g., grown) as a single layer or a multilayer having a plurality of layers on the surface of the substrate 11 prior to forming the laminated semiconductor structure L.

For example, when a silicon substrate is used as a growth substrate 11 for single crystalline nitride, a (111) plane of silicon may be used as a plane for the crystal growth. In this case, the buffer layer 12 may include an AlN nucleation layer and a lattice buffer layer consisting of Al-containing nitride crystal. Various examples of the buffer layer 12 will be described with reference to FIGS. 25A to 25D.

Figure 5B:
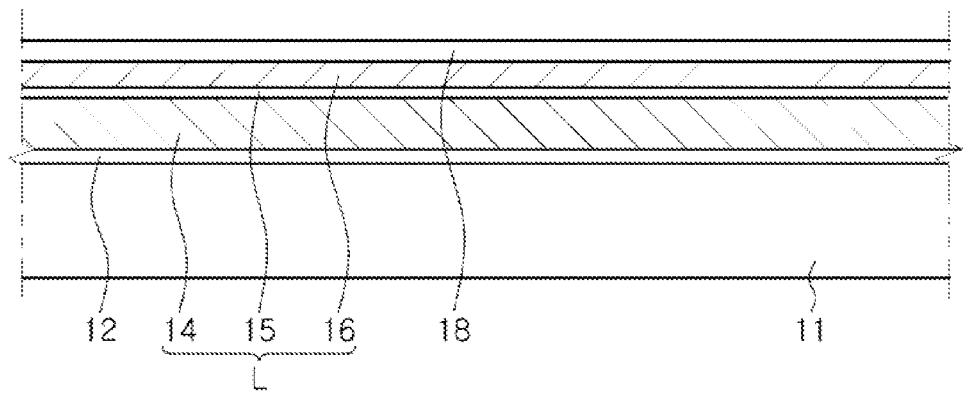

Next, as illustrated in FIG. 5B, a second electrode 18 connected to the second conductivity-type semiconductor layer 16 may be formed on an upper surface (that is, a second surface) of the laminated semiconductor structure L.

The second electrode 18 may be formed to have a large area of contact with the second conductivity-type semiconductor layer 16. In the exemplary embodiment, the second electrode 18 may be formed to cover the entire upper surface (or substantially the entire upper surface) of the second conductivity-type semiconductor layer 16.

The second electrode 18 may be a transparent conductive oxide or nitride layer. For example, the transparent conductive oxide layer may be at least one of ITO, zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \le x \le 1$). In some embodiments, the second electrode 18 may include a light-transmissive metal layer such as Ni/Au, or graphene. The process may be performed in a thin film formation process, such as physical vapor deposition (PVD) or chemical vapor deposition (CVD).

Figure 5C:
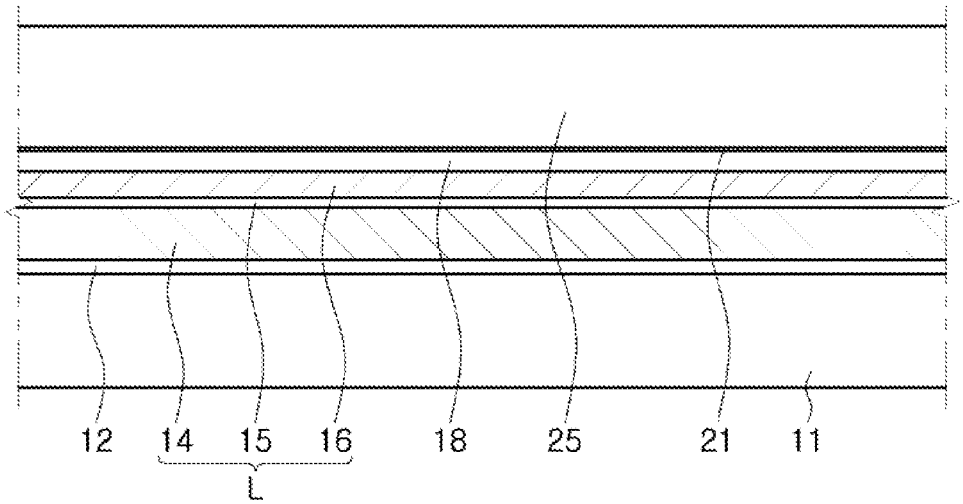

Next, as illustrated in FIG. 5C, the support substrate 25 may be bonded to the second electrode 18.

The support substrate 25 may be bonded to the second electrode 18 by using an adhesive layer 21. In the exemplary embodiment, the support substrate 25 may be a light-transmissive substrate such as a glass substrate. The adhesive layer 21 may be a light-transmissive adhesive material.

For example, the process may be carried out by coating the second electrode 18 with an adhesive material such as benzocyclobutene (BCB) using a process such as a spin coating process, then bonding the glass substrate to the second electrode 18, and then performing a heat treatment to harden the adhesive material. The adhesive layer 21 employable in the exemplary embodiment of the present invention may not be limited to BCB, and may include various light-transmissive adhesive materials. For example, another adhesive layer, such as a dry film resin (DFR), an epoxy, and a silicone resin, may be used.

The adhesive layer 21 may be used as an electrode protection layer for protecting the second electrode 18. However, as necessary, a separated electrode protection layer may be formed, and then a process of bonding the support substrate 25 using an adhesive material may be applied. As the electrode protection layer, silicon oxide or silicon nitride may be used.

Figure 5D:
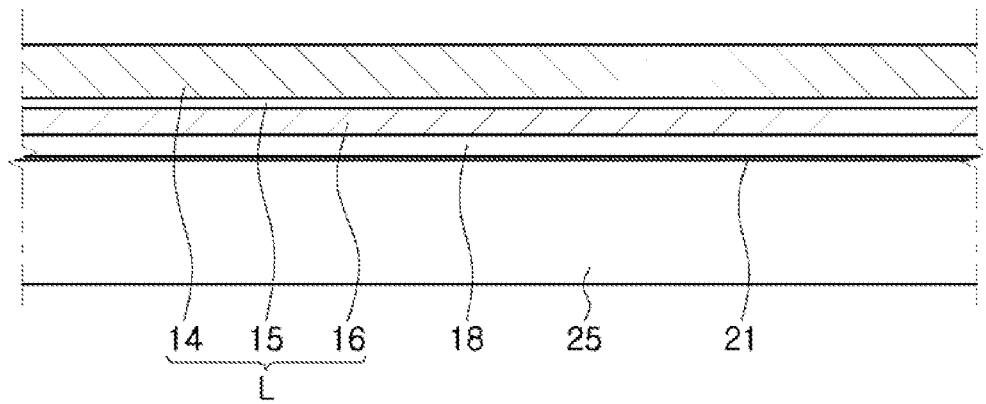

Next, as illustrated in FIG. 5D, the growth substrate 11 may be removed from the laminated semiconductor structure L.

The growth substrate removal process may be performed using a process such as laser lift-off, or a process of directly removing the growth substrate 11, such as mechanical polishing or chemical etching. For example, in the case that the growth substrate 11 is formed of a transparent material such as sapphire, the sapphire substrate may be separated using the laser lift-off process in which an interface between the laminated semiconductor structure L and the growth substrate 11 is irradiated with a laser. In the case that the growth substrate 11 is a silicon substrate having relatively low hardness, the silicon substrate may be removed using the process of directly removing the growth substrate, such as mechanical polishing or chemical etching.

According to the exemplary embodiment of the present disclosure, when the buffer layer 12 has a high electrical resistance, the removal process may be performed to expose a surface of the first conductivity-type semiconductor layer 14 which can be electrically connected.

Figure 5E:
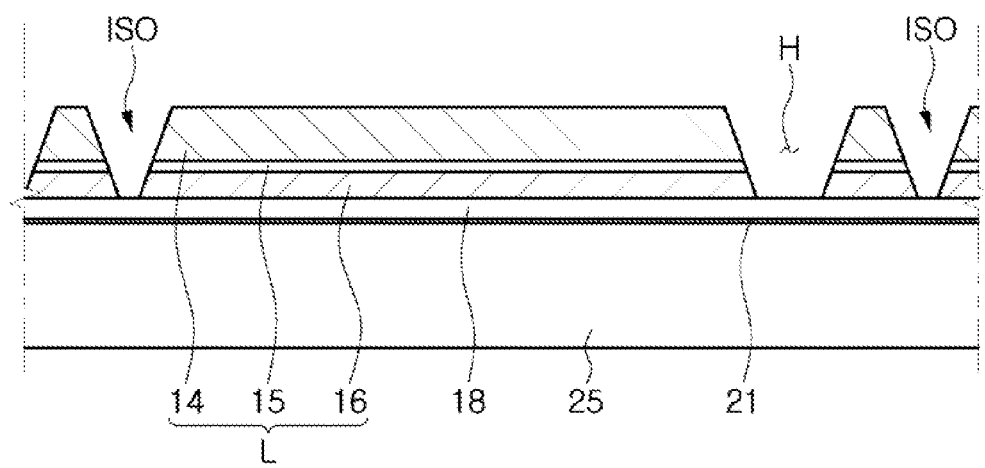

Next, as illustrated in FIG. 5E, a through-hole H may be formed in the laminated semiconductor structure L to expose a portion of the second electrode 18.

The process may be performed by selectively removing the laminated semiconductor structure L. Such a selective-removal process may be performed using mechanical cutting, chemical etching, or dry etching using plasma. The process may be performed along with a device isolation process. A device isolation trench ISO may be formed along with the through-hole H. Alternatively, the through-hole H may be formed in a different process from the device isolation trench ISO. For example, after the through-hole H is formed, a necessary electrode-forming process may be performed and then a device isolation process, such as the process of forming the trench ISO, may be performed.

Figure 5F:
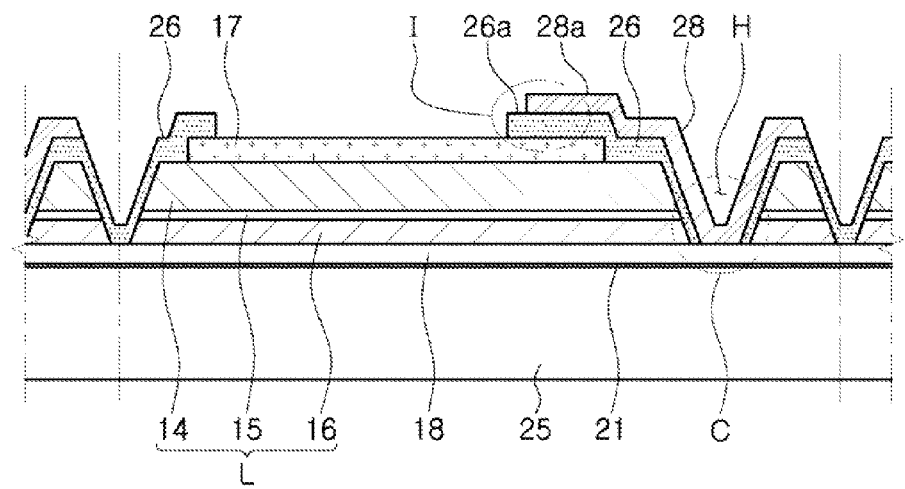

Next, as illustrated in FIG. 5F, a first electrode 17 and a connecting electrode 28 may be formed on appropriate areas.

Through the process, both pad areas related to the first and second electrodes 17 and 18 may be formed on the first surface of the laminated semiconductor structure L. More specifically, after the first electrode 17 is formed, an insulating layer may be formed to cover the entire first surface of the laminated semiconductor structure L. Next, the insulating layer may be selectively etched to re-open a contact area C, and the connecting electrode 28 may be formed to be connected to the contact area C of the second electrode 18 and extend to the first surface. Next, the insulating layer may be selectively etched to expose the pad area of the first electrode 17. Thus, the resultant structure illustrated in FIG. 5F may be obtained.

The finally obtained insulating layer 26 may be formed on an inner sidewall of the through-hole H such that the connecting electrode 28 is not connected to the active layer 15 and the first conductivity-type semiconductor layer 14. The insulating layer 26 may include an extending portion 26a so that a portion 28a of the connecting electrode 28, disposed on the first surface, is not connected to the first electrode 17.

The first electrode 17 may include a reflective electrode capable of forming an ohmic contact. For example, the first electrode 17 may include Ag, Ni, Al, Rh, Pd, Ir, Ru, Mg, Zn, Pt, or Au. In some embodiments, the first electrode 17 may be a multilayer structure including the reflective electrode and an ohmic contact electrode. For example, the first electrode 17 may have a structure of the Ni/Ag, Zn/Ag, Ni/Al, Zn/Al, Pd/Ag, Pd/Al, Ir/Ag, Ir/Au, Pt/Ag, Pt/Al, or Ni/Ag/Pt. The connecting electrode 28 may also be formed of a similar material to the first electrode 17. The insulating layer 26 may be silicon oxide or silicon nitride.

As described above, in some embodiments, the first electrode 17 may have an electrode structure with which a transparent conductive oxide such as ITO or a transparent conductive nitride is combined. For example, the first electrode 17 may be implemented as a combination of a light-transmissive electrode and a reflective electrode, or a combination of a light-transmissive electrode and an insulating material such as $SiO_2$.

Figure 5G:
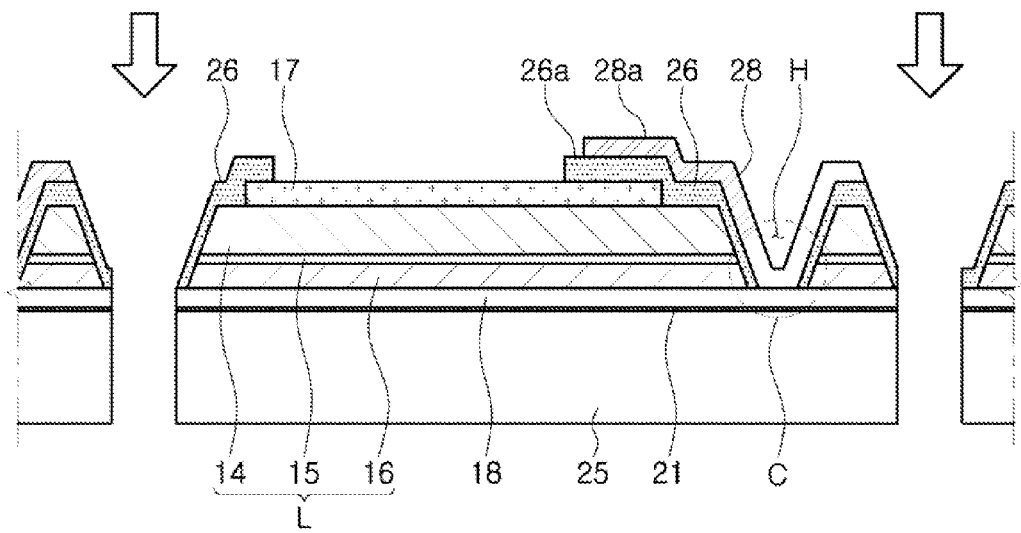

Next, as illustrated in FIG. 5G, a semiconductor light-emitting device 10 may be obtained by separating the resultant structure illustrated in FIG. 5G into individual device units.

In the exemplary embodiment, since the laminated semiconductor structure L has been already separated into the device units in the previous process, the process may be easily implemented when the support substrate 25 is a substrate having a low degree of hardness, such as a glass substrate. On the contrary, in the case that the device isolation trench ISO has not been formed in the previous process, a device isolation process may be performed in such a manner that the support substrate 25 is separated along with the laminated semiconductor structure L in this process.

The above-described embodiment may be modified in various ways. For example, an etch-stop layer may be formed in order to effectively control an etch depth when the through-hole H for the connecting electrode 28 is formed.

Figure 6:
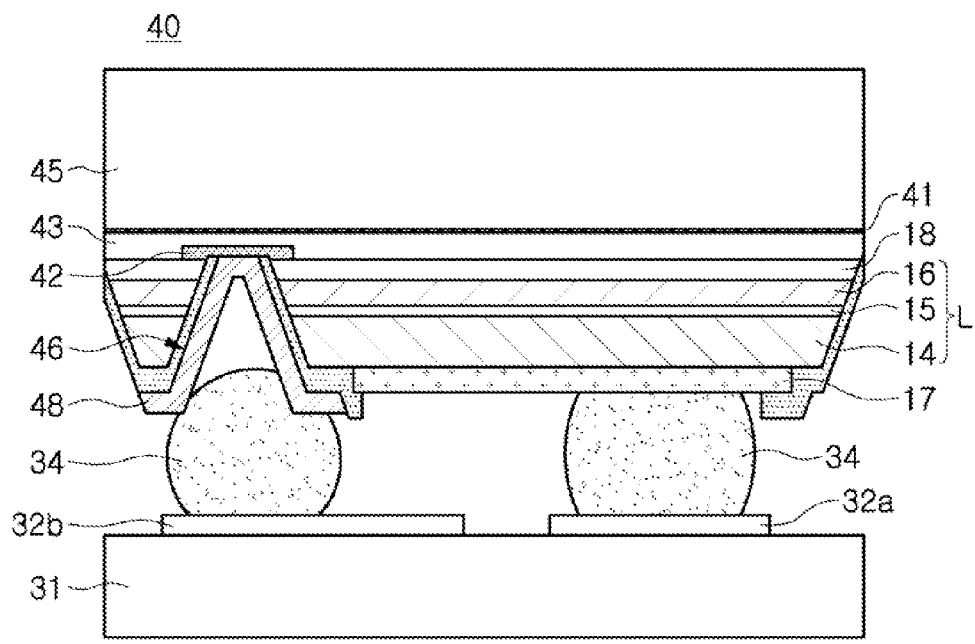
FIG. 6 is a cross-sectional view illustrating a flip-chip bonded semiconductor light-emitting device according to an exemplary embodiment.

FIG. 6 is a cross-sectional view illustrating a flip-chip semiconductor light-emitting device employing an etch-stop layer formed of a conductive material, according to an exemplary embodiment of the present disclosure.

Referring to FIG. 6, a flip-chip semiconductor light-emitting device 40 according to the exemplary embodiment of the present disclosure may include a laminated semiconductor structure L, first and second electrodes 17 and 18, and a support substrate 45.

In the exemplary embodiment, similar to the light-emitting device 10 illustrated in FIG. 1, the first and second electrodes 17 and 18 may be disposed on a first surface and a second surface opposing each other in the laminated semiconductor structure L. The support substrate 45 may be disposed on the second electrode 18. A connecting electrode 48 may be electrically connected to the second electrode 18 through a through-hole H and extends to the first surface of the laminated semiconductor structure L.

In this manner, the semiconductor light-emitting device 40 may have a flip-chip structure including pad areas on the first surface of the laminated semiconductor structure L in order for the first and second electrodes 17 and 18 to be connected to an external circuit. A conductive bump 34 may be provided to each of the first electrode 17 and the connecting electrode 48 provided as pad areas.

As illustrated in FIG. 6, the semiconductor light-emitting device 40 may be connected to first and second circuit patterns 32a and 32b of a circuit substrate 31 using the conductive bumps 34.

In the exemplary embodiment, the first electrode 17 may include an electrode material having a high reflective rate as well as forming an ohmic contact with a second conductivity-type semiconductor layer. The second electrode 18 may be a light-transmissive metal such as Ni/Au, a transparent conductive oxide such as ITO, or a nitride. The support substrate 45 may be a glass substrate or a light-transmissive polymer resin substrate.

The semiconductor light-emitting device 40 according to the exemplary embodiment of the present disclosure may include an etch-stop layer 42 disposed between the second electrode 18 and the support substrate 45, in contrast to the above-described exemplary embodiments. The etch-stop layer 42 according to the exemplary embodiment may be a conductive material. The etch-stop layer 42 may be disposed on a portion of the second electrode 18 to be directly connected to the second electrode 18.

As illustrated in FIG. 6, a portion of the etch-stop layer 42 may be exposed by the through-hole H, and the connecting electrode 48 may be connected to the exposed portion of the etch-stop layer 42. Accordingly, the connecting electrode 48 may be electrically connected to the second electrode 18 through the etch-stop layer 42. The connecting electrode 48 may be electrically isolated from a first conductivity-type semiconductor layer 14 and an active layer 15 by an insulating layer 46 formed on an inner sidewall of the through-hole H. The insulating layer 46 may be formed on the other surface of the semiconductor light-emitting device 40 to be provided as a passivation layer.

The etch-stop layer 42 may include a material having a lower etch rate than that of the second electrode 18. For example, when the second electrode 18 is an oxide such as ITO, the etch-stop layer 42 may be a metal, such as Al, Au, Ag, Ti, or TiW.

In the exemplary embodiment, the etch-stop layer 42 is illustrated as being disposed between the second electrode 18 and the support substrate 45. However, in the case that a composition material of the etch-stop layer 42 has a sufficient etch selectivity with respect to a composition material of the laminated semiconductor structure L, the etch-stop layer 42 may be disposed between the second electrode 18 and the laminated semiconductor structure L.

Meanwhile, the second electrode 18 is illustrated as being fully removed at an area corresponding to the through-hole H. However, the second electrode 18 may partially remain in the area corresponding to the through-hole H. In some embodiments, the etch-stop layer 42 may also be partially removed.

The semiconductor light-emitting device 40 may further include a planarization layer 43 so as to be easily bonded to the support substrate 45. The planarization layer 43 may be formed on the second electrode 18 on which the etch-stop layer 42 is disposed. When a bonding surface is uneven or rough, it is difficult to ensure robust bonding due to a void or the like generated during the bonding process. Accordingly, when the etch-stop layer 42 is disposed on the portion of the second electrode 18 as in the exemplary embodiment of the present disclosure, the planarization layer 43 may be introduced to implement robust bonding with the support substrate 45.

The planarization layer 43 may provide a planar bonding surface using a transparent insulating material. For example, the planarization layer 43 may be formed using silicon oxide, silicon nitride, or a curable resin. As necessary, an additional polishing process may be performed to provide a planarization layer 43 having a more advantageous bonding surface.

In the exemplary embodiment, the planarization layer 43 may also function as an electrode protection layer by using a stable material which does not react with the second electrode 18.

The support substrate 45 may be bonded to the planarization layer 43 using an adhesive layer 41. Alternatively, the planarization layer 43 may be formed of an adhesive material to be directly bonded to the support substrate 45 without any separated adhesive layer.

Meanwhile, when pad areas related to the first and second electrodes 17 and 18 are sufficiently ensured, the connecting electrode 48 may not overlap the first electrode 17 as in the exemplary embodiment.

Figure 7:
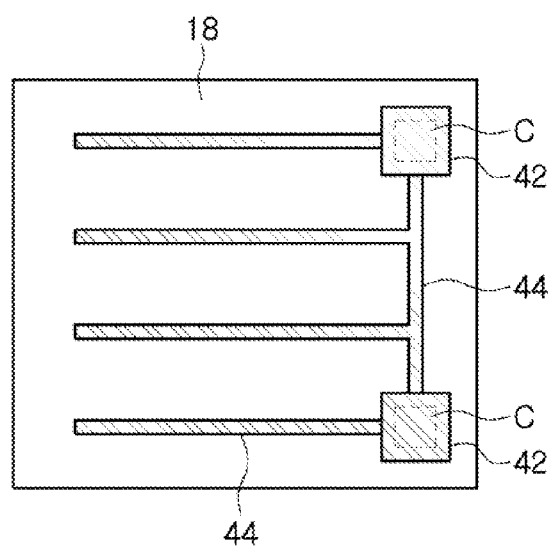
FIG. 7 is a bottom plan view illustrating an example of an electrode layout employable in the semiconductor light-emitting device illustrated in FIG. 6.

A more specific example of an electrode layout employable in the exemplary embodiment is illustrated in FIG. 7. FIG. 7 is an example of a layout of an electrode disposed on a second surface of a laminated semiconductor structure L according to the exemplary embodiment.

As illustrated in FIG. 7, the second electrode 18 may be formed on a majority of one surface of the second conductivity-type semiconductor layer 16, and two etch-stop layers 42 may be disposed on areas corresponding to contact areas C disposed at (or proximate to) both corners on the second electrode 18. The second electrode 18 may be connected to the connecting electrode 48 through the etch-stop layer 42 formed of a conductive material.

A plurality of finger electrodes 44 extending from the etch-stop layer 42 may be formed on the second electrode 18. The plurality of finger electrodes 44 may distribute currents uniformly throughout the second electrode 18. Such finger electrodes 44 may be formed of the same material as the etch-stop layer 42.

FIGS. 8A to 8G are cross-sectional views illustrating steps of main processes in a method of fabricating the semiconductor light-emitting device illustrated in FIG. 6. The process may be understood as a wafer-level manufacturing process, and a growth substrate 11 may be a part of a wafer.

Figure 8A:
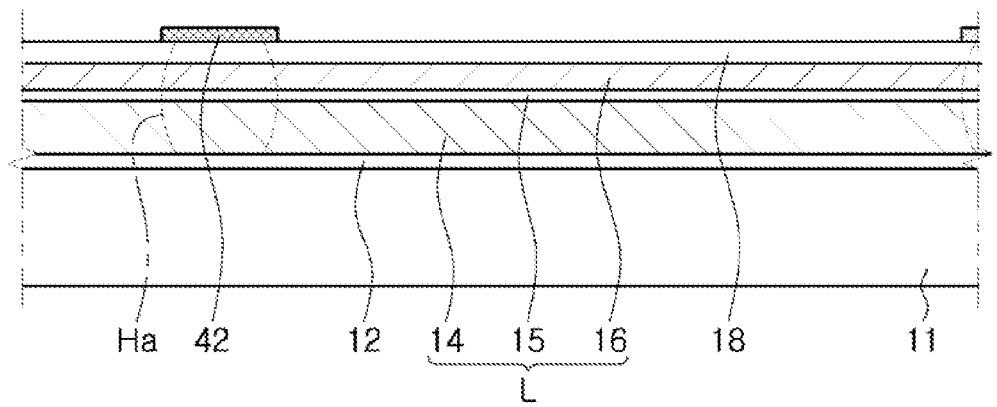
FIGS. 8A to 8G are cross-sectional views illustrating main process steps in a method of fabricating the semiconductor light-emitting device illustrated in FIG. 6.

As illustrated in FIG. 8A, an etch-stop layer 42 may be formed on a second electrode 18 disposed on a laminated semiconductor structure L.

The laminated semiconductor structure L illustrated in FIG. 8A may correspond to the laminated semiconductor structure L illustrated in FIG. 5B, and the process may be understood with reference to FIGS. 5A and 5B and related descriptions thereof. The etch-stop layer 42 may be disposed on an area Ha of the second electrode 18 in which a through-hole H is to be formed. The etch-stop layer 42 may have a larger area than an area to be exposed by the through-hole H. The etch-stop layer 42 may be made of a material having high etch selectivity with respect to the second electrode 18. For example, when the second electrode 18 is a transparent conductive oxide such as ITO, the etch-stop layer 42 may be a metal, such as Al, Au, Ag, Ti, and TiW.

In the process, as illustrated in FIG. 7, a plurality of finger electrodes 44 connected to the etch-stop layer 42 may be formed on the second electrode 18. The plurality of finger electrodes 44 may be formed of the same material as the etch-stop layer 42. The plurality of finger electrodes 44 may be formed during the same process step illustrated in FIG. 8A.

Figure 8B:
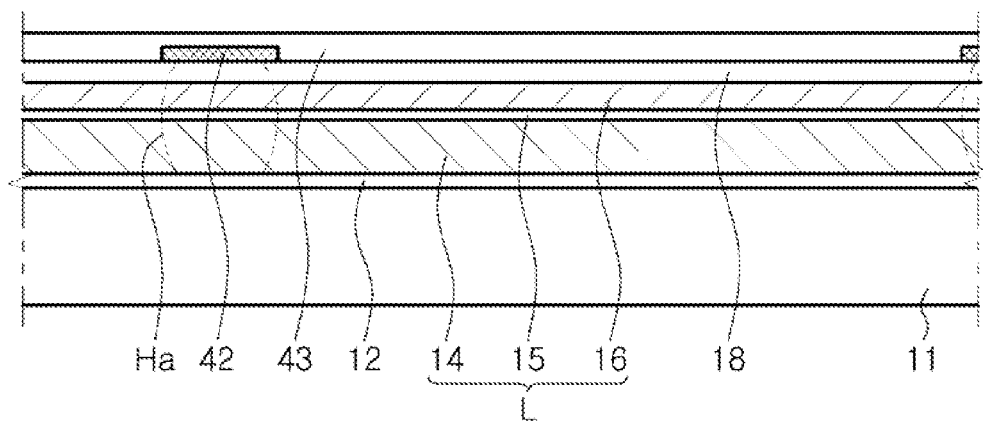

Next, as illustrated in FIG. 8B, a planarization layer 43 may be formed on the second electrode 18 on which the etch-stop layer 42 is disposed.

The planarization layer 43 may remove unevenness caused by the etch-stop layer 42 and provide a flat surface advantageous for the subsequent bonding process. In a flip-chip structure as in the exemplary embodiment, the planarization layer 43 may be formed of a light-transmissive material, that is, of any of a variety of curable resins as well as silicon oxide or silicon nitride. For example, tetra-ethyl-ortho-silane (TEOS), boro-phosphosilicate glass (BPSG), spin-on glass (SOG) or spin-on dielectric (SOD) may be used as the planarization layer 43. Since such materials have fluidity during processing, a layer having a relatively flat surface may be provided using a spin process or a reflow process. Alternatively or in combination, after the material layer for planarization is formed, a surface thereof may be planarized using a polishing process (for example, the surface roughness may be polished to less than 1 nm of variation). Thus, the appropriate planarization layer 43 may be formed.

Figure 8C:
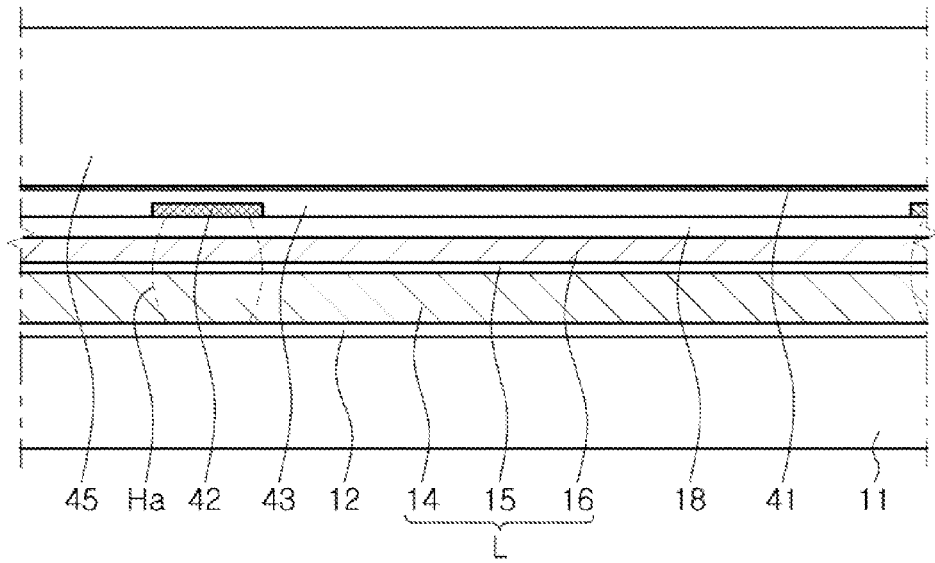

Next, as illustrated in FIG. 8C, a support substrate 45 may be bonded onto the planarization layer 43.

In the process, the support substrate 45 may be bonded to the planarization layer 43 using an adhesive layer 41. The support substrate 45 may be a light-transmissive material such as a glass substrate. The adhesive layer 41 may be a light-transmissive adhesive material. For example, BCB, DFR, epoxy, or silicone resin may be used. Alternatively, the support substrate 45 may be directly bonded to the planarization layer 43 without another adhesive layer.

Figure 8D:
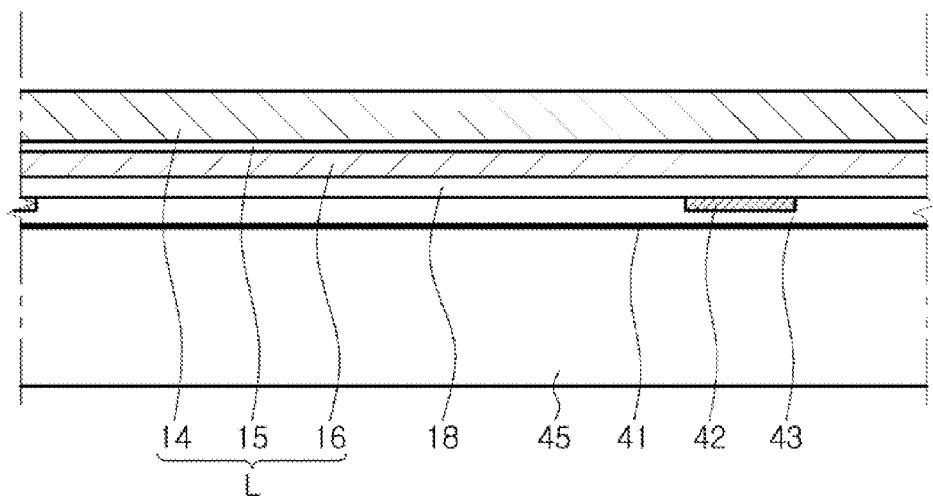

Next, as illustrated in FIG. 8D, the growth substrate 11 may be removed from the laminated semiconductor structure L.

In the removal process, a buffer layer 12 having high electrical resistance may be removed together with the growth substrate 11. Thus, an electrically connectable surface of a first conductivity-type semiconductor layer 14 may be exposed, and a process of forming an electrode pad may be performed on a first surface of the laminated semiconductor structure L. The substrate removal process may be performed using a process of separating the growth substrate 11 such as a laser lift-off process, or a process of directly removing the growth substrate 11 such as a mechanical polishing process or a chemical etching process.

Figure 8E:
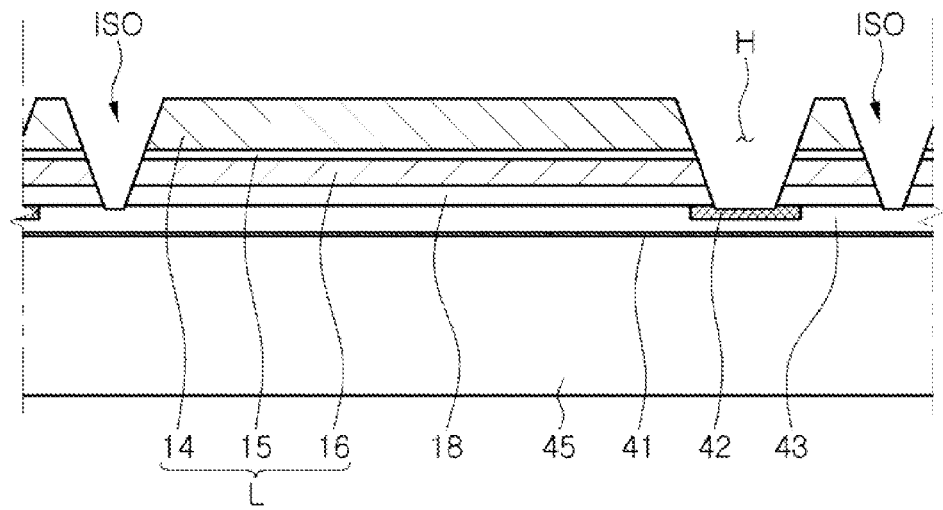

Next, as illustrated in FIG. 8E, a through-hole H may be formed in the laminated semiconductor structure L.

The through-hole H may be formed to expose a portion of the etch-stop layer 42. Although the second electrode 18 is formed of a light-transmissive material, light transmittance may decrease as the thickness of the light-transmissive material increases. Accordingly, the thickness of the second electrode 18 may be restricted to ensure high light transmittance. In this case, the second electrode 18 may be vulnerable to damage while forming the through-hole H in the laminated semiconductor structure L, and it may therefore be difficult to ensure good contact with the connecting electrode 48.

For example, in the case that the second electrode 18 is ITO, the thickness of the second electrode 18 may be 100 Å to 1000 Å. Accordingly, while the through-hole is formed in the laminated semiconductor structure L having a thickness of 2 to 5 µm, ITO may be damaged, which will cause a contact failure.

However, according to the exemplary embodiment, by employing the etch-stop layer 42, an etch depth may be easily controlled, and good contact with the second electrode 18 may be ensured.

The process may be divided into several etching processes according to the etch depth. For example, a first etching process may be performed to remove the laminated semiconductor structure L, and then a second etching process may be performed to selectively remove the second electrode 18, such as ITO, to expose the etch-stop layer 42.

In this process, while forming the through-hole H, a device isolation region may also be exposed to form a device isolation trench ISO.

Figure 8F:
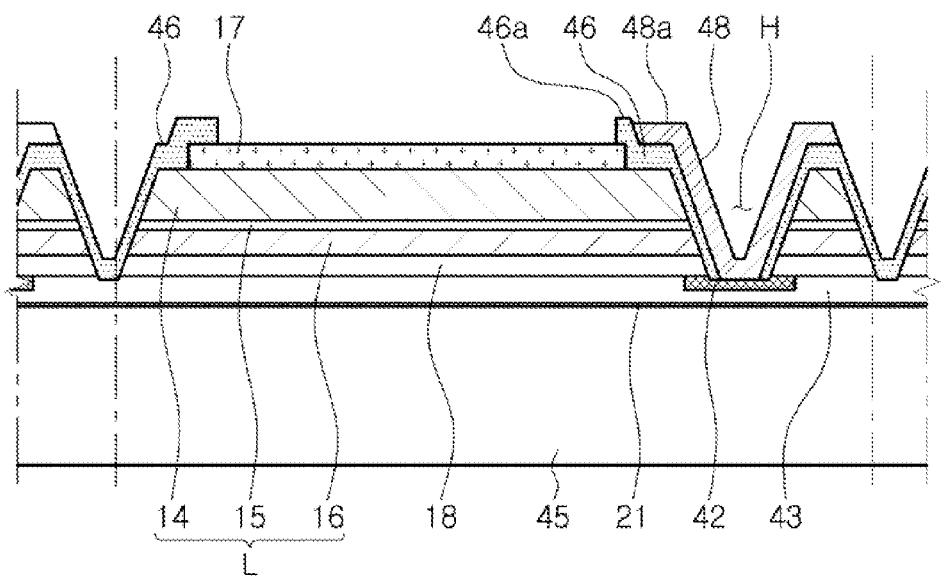

Next, as illustrated in FIG. 8F, the connecting electrode 48 may be formed in a contact area C exposed by the through-hole H.

Through this process, both pad areas related to the first and second electrodes 17 and 18 may be formed on the first surface of the laminated semiconductor structure L. An insulating layer 46 may be formed on an inner sidewall of the through-hole H so that the connecting electrode 48 is not connected to the active layer 15 or the first conductivity-type semiconductor layer 14. The insulating layer 46 may include a portion 46a extending to the first surface of the laminated semiconductor structure L so that a portion 48a of the connecting electrode 48, located on the portion 46a extending to the first surface, is not connected to the first conductivity-type semiconductor layer 14. In addition, the insulating layer 46 deposited in this process may be provided to the other surface of the semiconductor light-emitting device 40 as a passivation layer.

Figure 8G:
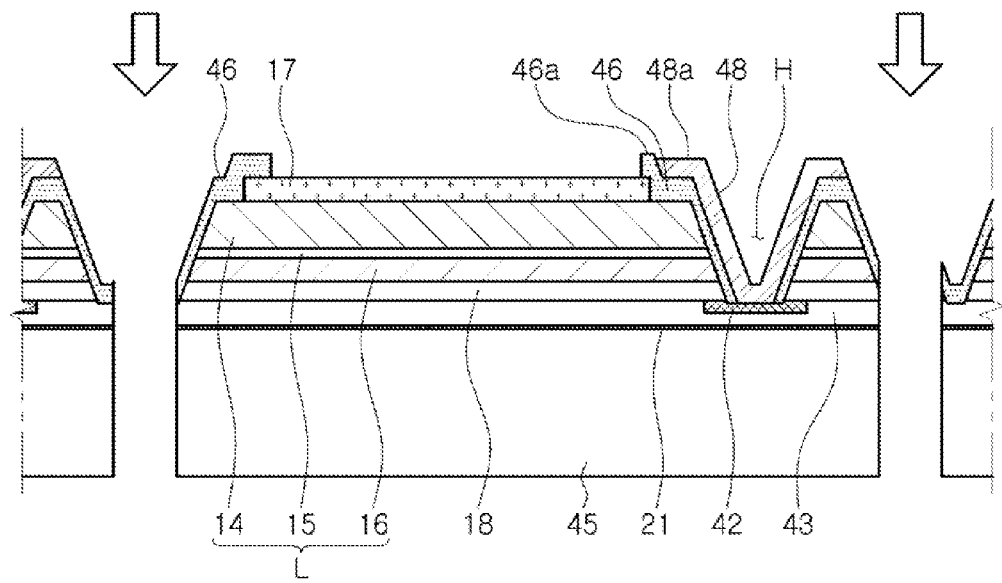

Next, as illustrated in FIG. 8G, the semiconductor light-emitting device 40 may be obtained by separating the resultant structure illustrated in FIG. 8E into individual device units.

The etch-stop layer employed in the above-described embodiment may be modified in various manners. For example, a material and/or location of the etch-stop layer may be changed.

Figure 9:
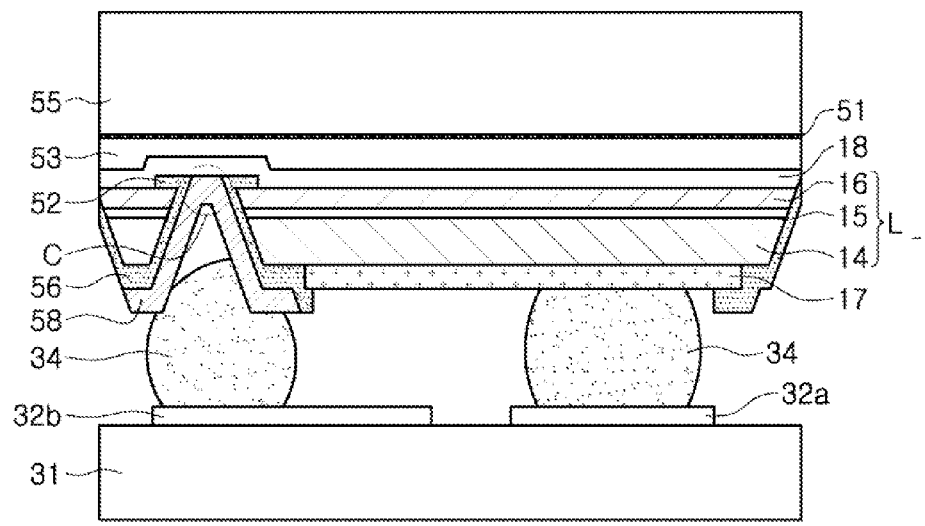
FIG. 9 is a cross-sectional view illustrating a flip-chip bonded semiconductor light-emitting device according to an exemplary embodiment.

FIG. 9 is a cross-sectional view illustrating a flip-chip semiconductor light-emitting device including an etch-stop layer 52 formed of an insulating material, according to an exemplary embodiment.

Referring to FIG. 9, a flip-chip semiconductor light-emitting device 50 according to the exemplary embodiment may include a laminated semiconductor structure L, first and second electrodes 17 and 18, and a support substrate 55.

In the exemplary embodiment, the flip-chip semiconductor light-emitting device 50 may have a similar flip-chip structure to the above-described embodiments. More specifically, the first and second electrodes 17 and 18 may be disposed on a first surface and a second surface opposing each other in the laminated semiconductor structure L, respectively. The support substrate 55 may be disposed on the second electrode 18. The connecting electrode 58 may be electrically connected to the second electrode 18 via the through-hole H, and extend to the first surface of the laminated semiconductor structure L.

As illustrated in FIG. 9, the semiconductor light-emitting device 50 may include conductive bumps 34 respectively formed on the first electrode 17 and connecting electrode 58, provided as pad areas. The semiconductor light-emitting device 50 may be connected to first and second circuit patterns 32a and 32b of a circuit substrate 31 using the conductive bumps 34. The conductive bump 34 disposed on the connecting electrode 58 may not fully fill a portion recessed by the through-hole H, as illustrated in FIG. 9.

The semiconductor light-emitting device 50 illustrated in FIG. 9 may include an etch-stop layer 52. However, the etch-stop layer 52 according to the exemplary embodiment of the present disclosure may be disposed between the second electrode 18 and the laminated semiconductor structure L and may be formed of an electrically insulating material, unlike the conductive etch-stop layer 42 illustrated in FIG. 6.

In the exemplary embodiment, the second electrode 18 may include an area C exposed by the through-hole H, and the etch-stop layer 52 may be disposed around the exposed area C. The connecting electrode 58 may be connected to the exposed area C of the second electrode 18. The connecting electrode 58 may be electrically insulated from the first conductivity-type semiconductor layer 14 and the active layer 15 by an insulating layer 56 formed on side surfaces of the through-hole H. The insulating layer 56 may be provided to the other side of the semiconductor light-emitting device 50 as a passivation layer.

The etch-stop layer 52 may include a material having a higher etch rate than the second electrode 18 in a specific etching condition. For example, when the second electrode 18 is a light-transmissive oxide such as ITO, the etch-stop layer 52 may be silicon oxide or silicon nitride.

Since the etch-stop layer 52 is at least partially removed to provide (or ensure) a contact area C of the second electrode 18, the etch-stop layer 52 may remain only around the contact area C of the second electrode 18, as illustrated in FIG. 9. However, depending on wet-etching conditions, the etch-stop layer 52 may partially remain in the contact area C, or be fully removed without remaining around the contact area C. Unlike the exemplary embodiment, even in the case that the etch-stop layer 52 is almost entirely removed without remaining around the contact area C, whether the etch-stop layer 52 is used or not may be determined by whether the contact area C of the second electrode 18 has unevenness or not.

The semiconductor light-emitting device 50 may further include a planarization layer 53 for easier bonding with the support substrate 55. The planarization layer 53 may be formed on the second electrode 18 to planarize the uneven surface caused by the etch-stop layer 52.

The planarization layer 53 may provide an even bonding surface using a transparent insulating material. For example, the planarization layer 53 may be silicon oxide, silicon nitride, or a curable resin. As necessary, an additional polishing process may be introduced to provide the planarization layer 53 with a more planer and thereby advantageous bonding surface. The support substrate 55 may be bonded to the planarization layer 53 using an adhesive layer 51.

FIGS. 10A to 10E are cross-sectional views illustrating steps of main processes in a method of fabricating the semiconductor light-emitting device illustrated in FIG. 9. The process may be understood as a wafer-level process, and a substrate 11 illustrated in FIGS. 10A to 10E may be a part of a wafer.

Figure 10A:
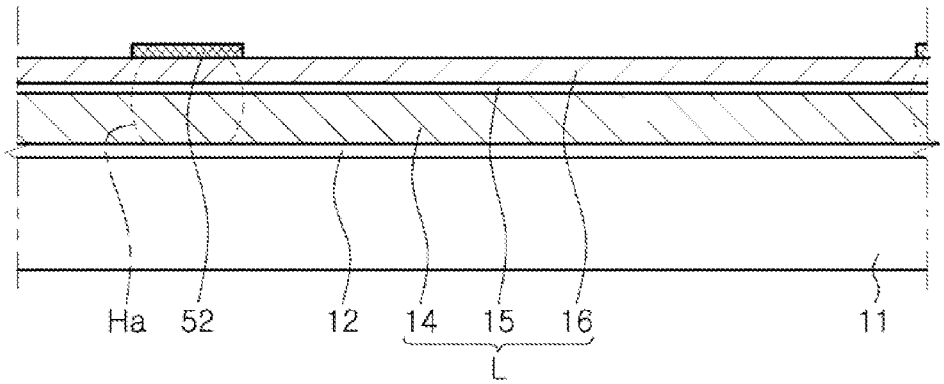
FIGS. 10A to 10E are cross-sectional views illustrating main process steps in a method of fabricating the semiconductor light-emitting device illustrated in FIG. 9.

As illustrated in FIG. 10A, an etch-stop layer 52 is formed on a portion of an upper surface of the laminated semiconductor structure L, and then a second electrode 18 may be formed on a majority of the upper surface of the laminated semiconductor structure L.

The etch-stop layer 52 may be disposed on an area Ha of the laminated semiconductor structure L in which a through-hole H (FIG. 10C) is to be formed, before the second electrode 18 is formed. The etch-stop layer 52 may have a greater area than an area which will be exposed by the through-hole H. The etch-stop layer 52 may be a material having high etch selectivity with respect to the second electrode 18. For example, when the second electrode 18 is ITO, the etch-stop layer 52 may be $SiO_2$.

Figure 10B:
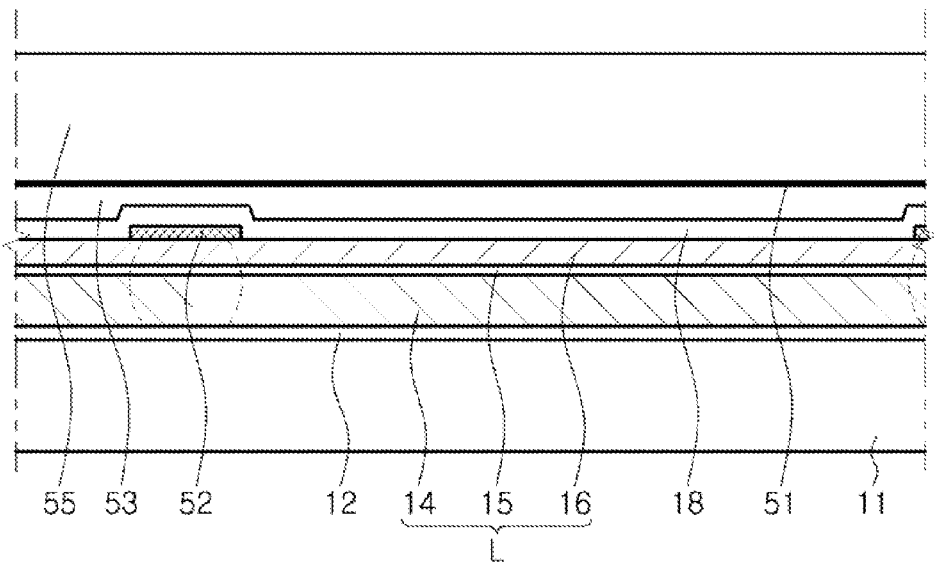

Next, as illustrated in FIG. 10B, a planarization layer 53 may be formed on the second electrode 18, and the support substrate 55 may be bonded to the planarization layer 53 using an adhesive layer 51.

The planarization layer 53 may provide a planar surface advantageous for the subsequent bonding process by planarizing an uneven surface of the second electrode 18 due to the etch-stop layer 52. In a flip-chip structure as in the exemplary embodiment, a light-transmissive material, such as various curable resins as well as silicon oxide or silicon nitride, may be used as the planarization layer 53. As necessary, after a material layer for planarization is formed, a surface of the material layer may be planarized by performing a polishing process.

On the other hand, by selecting a material capable of bonding with the support substrate 55, as a component of the planarization layer 53, the support substrate 55 may be directly bonded to the planarization layer 53 with no additional adhesive layer.

Figure 10C:
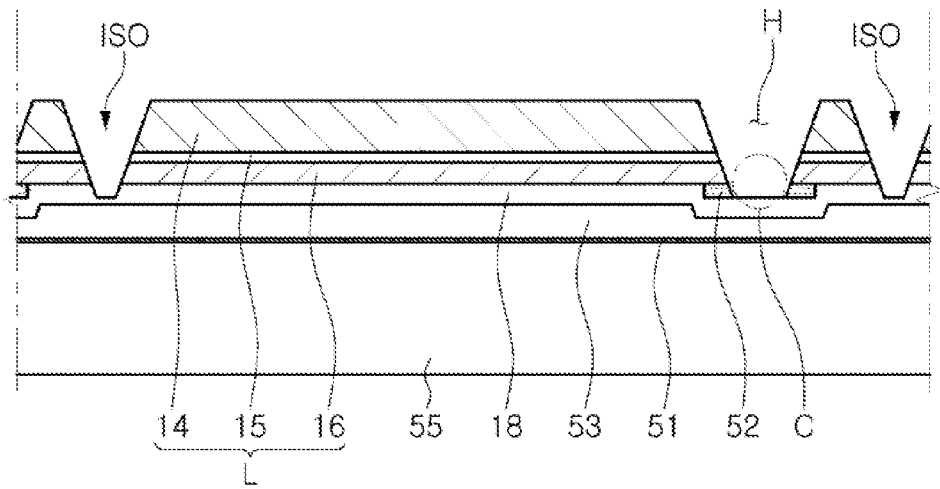

Next, as illustrated in FIG. 10C, the growth substrate 11 may be removed from the laminated semiconductor structure L, and a through-hole H may be formed in the laminated semiconductor structure L.

In the substrate removal process, a buffer layer 12 having high electrical resistance may be removed together with the substrate 11. In the process of forming the through-hole H, an etch depth may be properly controlled using the etch-stop layer 52 to expose the second electrode 18 with no significant damage. In consideration of variation in the etch depth of the laminated semiconductor structure L, the etch-stop layer 52 may be provided with a proper thickness to protect the second electrode 18 while the laminated semiconductor structure L is etched. After the laminated semiconductor structure L is etched, the etch-stop layer 52 (used to protect the second electrode 18 while the laminated semiconductor structure L is etched) may be at least partially removed using a subsequent etching process. For example, when the second electrode 18 and the etch-stop layer 52 are formed of ITO and $SiO_2$, respectively, the second electrode 18, ITO, may have a thickness of 100 Å to 1000 Å, and the etch-stop layer 52 may have a thickness of 100 Å to 1000 Å. The subsequent etching process for removing the etch-stop layer 52 may be performed using methods such as a buffered oxide etchant (BOE) etching process in which a high etch selectivity (for example, 1:2) between two materials is ensured.

In the process, while forming the through-hole H, a region for isolating devices may also be exposed to form a device isolation trench ISO.

Figure 10D:
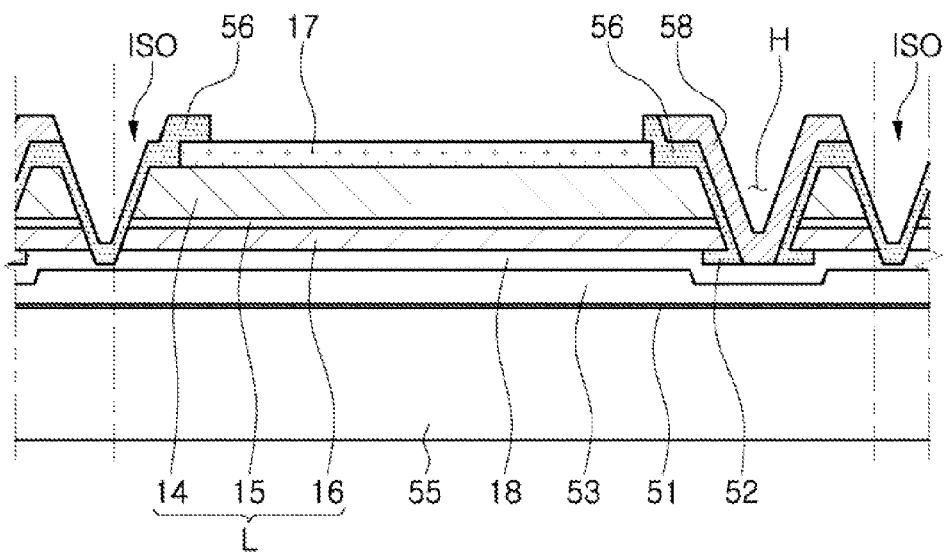

Next, as illustrated in FIG. 10D, a connecting electrode 58 may be formed to be connected to the second electrode 18 at a contact area exposed by the through-hole H.

The connecting electrode 58 may be formed to extend to a first surface of the laminated semiconductor structure L. A portion of the connecting electrode 58, located on the first surface of the laminated semiconductor structure L, may be provided as a pad area. Through the process, both pad areas related to the first and second electrodes 17 and 18 may be formed on the first surface of the laminated semiconductor structure L. More specifically, in this process, the insulating layer 56 may be formed on an inner sidewall of the through-hole H so that the connecting electrode is not connected to the active layer 15 or the first conductivity-type semiconductor layer 14. In addition, the insulating layer 56 deposited in this process may be provided to the other side of the semiconductor light-emitting device 50 as a passivation layer.

Figure 10E:
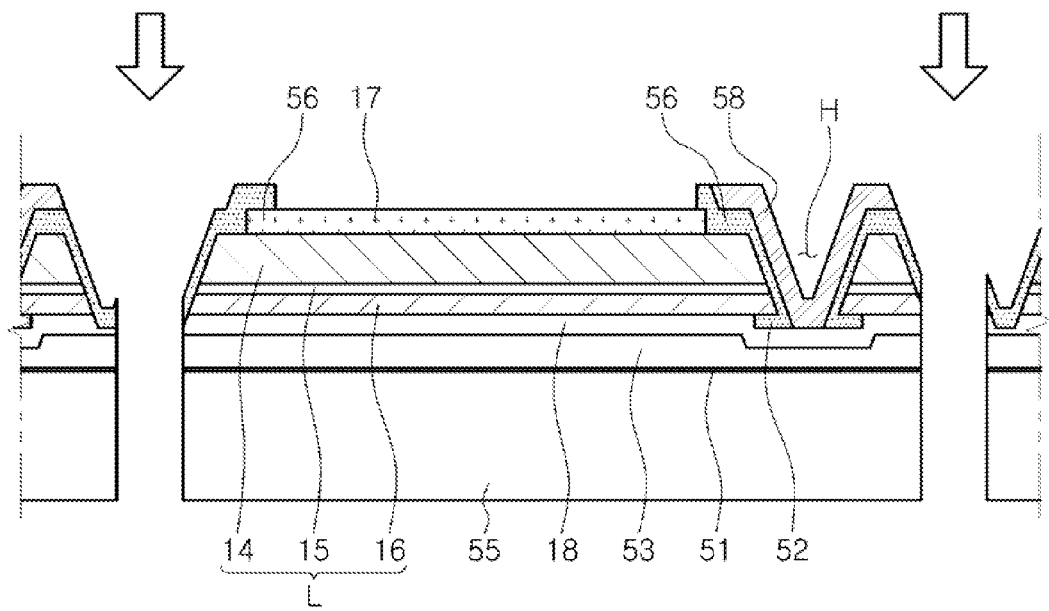

Next, as illustrated in FIG. 10E, the semiconductor light-emitting device 50 may be obtained by separating the resultant structure illustrated in FIG. 10D into individual device units.

Figure 11:
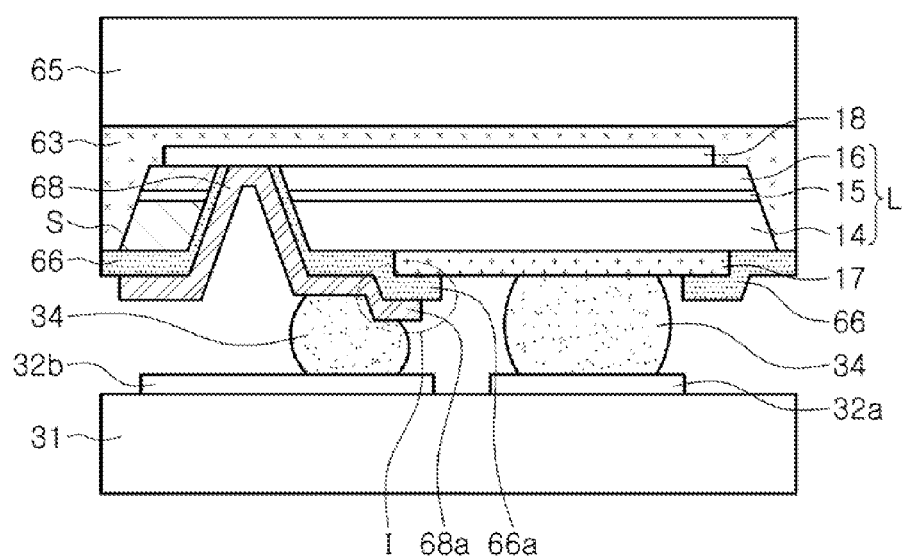
FIG. 11 is a cross-sectional view illustrating a flip-chip bonded semiconductor light-emitting device according to an exemplary embodiment.

FIG. 11 is a cross-sectional view illustrating a flip-chip bonded semiconductor light-emitting device according to an exemplary embodiment of the present disclosure.

Referring to FIG. 11, a flip-chip semiconductor light-emitting device 60 according to the exemplary embodiment may include a laminated semiconductor structure L, first and second electrodes 17 and 18, and a support substrate 65.

In the exemplary embodiment, similar to the above-described exemplary embodiments, the first and second electrodes 17 and 18 may be disposed on a first surface and a second surface opposing each other in the laminated semiconductor structure L. The connecting electrode 68 may be electrically connected to the second electrode 18 via a through-hole H and extend to the first surface of the laminated semiconductor structure L.

In this manner, the semiconductor light-emitting device 60 may have a flip-chip structure including pad areas on the first surface of the laminated semiconductor structure L so as to connect the first and second electrodes 17 and 18 to external circuits. Conductive bumps 34 may be respectively provided to the first electrode 17 and the connecting electrode 68 provided as pad areas. As illustrated in FIG. 11, the semiconductor light-emitting device 60 may be connected to first and second circuit patterns 32*a* and 32*b* of a circuit substrate 31 by using the conductive bumps 34.

In the exemplary embodiment, the first electrode 17 may include an electrode material having high reflectance as well as forming an ohmic contact with a second conductivity-type semiconductor layer 16. In other embodiments, the first electrode 17 may have a structure including a light-transmissive electrode. The second electrode 18 may be a light-transmissive metal such as Ni/Au, or a transparent conductive oxide such as ITO or a transparent conductive nitride. The support substrate 65 may be a glass substrate or a substrate formed of a light-transmissive polymer resin.

The semiconductor light-emitting device 60 may further include an insulating member 63 surrounding side surfaces S of the laminated semiconductor structure L. The insulating member 63 may be provided on the second surface of the laminated semiconductor structure L, that is, the second electrode 18. The insulating member 63 according to the exemplary embodiment of the present disclosure may include a light-transmissive material. The insulating member 63 may include a light-transmissive material, such as silicon oxide, silicon nitride, or various curable resins. For example, the insulating member 63 may be TEOS, BPSG, SOG, or SOD. Such a material may be formed using a spin process or a reflow process to provide a relatively flat upper surface. An additional planarization process may be performed so that the insulating member 63 has a planarized upper surface, advantageous for bonding with the support substrate, similar to the above-described planarization layer. In addition, the insulating member 63 may function as an electrode protection layer for the second electrode 18.

Figure 15:
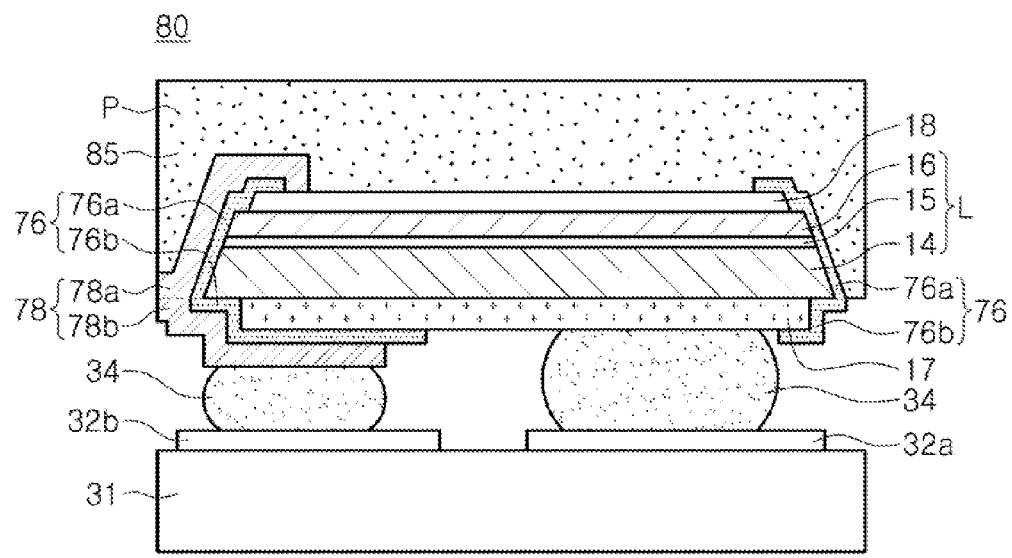
FIG. 15 is a cross-sectional view illustrating an improved example of the semiconductor light-emitting device illustrated in FIG. 13.

The insulating member 63 may be a material bondable to the support substrate 65 so as to bond the laminated semiconductor structure L to the support substrate 65. For example, the insulating member 63 may be another light-transmissive adhesive material, such as BCB, DFR, an epoxy, or silicone resin. In some embodiment, the insulating member 63 surrounding side surfaces of the laminated semiconductor structure L may be formed of a material used to form the support substrate 65 (FIGS. 15 and 16).

The insulating member 63 according to the exemplary embodiment may be provided as a passivation layer protecting the laminated semiconductor structure L. In a subsequent process, a process of forming an additional passivation layer on the side surfaces of the laminated semiconductor structure L may not be required in embodiments including the insulating member 63.

In order to ensure a sufficient pad area for connecting the connecting electrode 68 to an external circuit, a pad area 68a disposed on the first surface of the laminated semiconductor structure L may extend to a portion of an upper surface of the first electrode 17. An insulating layer 66 may have a portion 66a extending into a space between the extending pad area 68a and the first electrode 17 so that the extending pad area 68a and the first electrode 17 are not electrically connected (see, e.g., "I").

The exemplary embodiment may be modified in various manners. For example, the semiconductor light-emitting device 60 may further include a etch-stop layer as described with reference to FIG. 6 or FIG. 9 on a portion corresponding to the through-hole H.

The semiconductor light-emitting device 60 illustrated in FIG. 11 may be obtained by separating the laminated semiconductor structure L into device units before a growth substrate is removed, and forming an insulating member 63 in a separated portion. Detailed processes will be described with reference to FIGS. 12A to 12F.

Figure 12A:
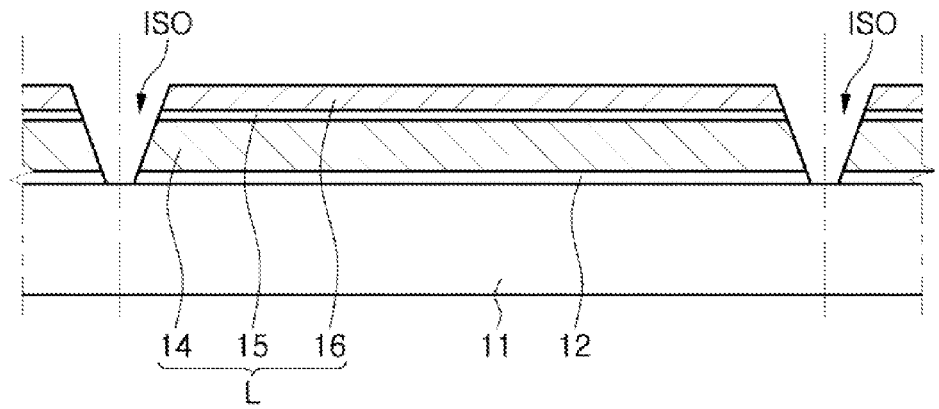
FIGS. 12A to 12F are cross-sectional views illustrating main process steps of fabricating the semiconductor light-emitting device illustrated in FIG. 11.

As illustrated in FIG. 12A, a device isolation trench ISO may be formed in a laminated semiconductor structure L grown on a growth substrate 11.

As described in the above exemplary embodiments, a buffer layer 12 may be formed on the substrate 11, and the laminated semiconductor structure L may be formed on the buffer layer 12. However, in the exemplary embodiment, unlike in the above exemplary embodiments, a process of separating devices illustrated in FIG. 12A may be performed before the substrate 11 is removed. In this process, the device isolation trench ISO may be formed in the laminated semiconductor structure L to separate the laminated semiconductor structure L into individual device units. The process may be performed using mechanical cutting, chemical etching, or dry etching using plasma. The laminated semiconductor structure L may have an inclined side surface depending on the kind of crystal and process (for example, the kind of an etching process) of the laminated semiconductor structure L. For example, when the laminated semiconductor structure L is a nitride semiconductor material, the side surfaces of the laminated semiconductor structure L obtained after a dry etching process using plasma may be an inclined sidewall.

Figure 12B:
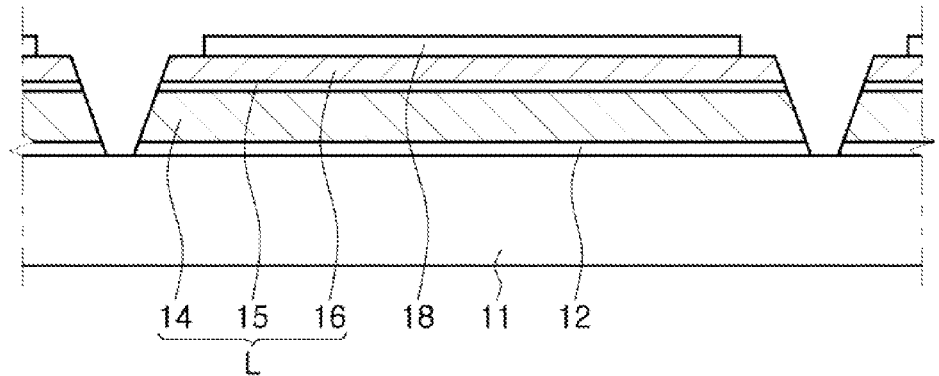

Next, as illustrated in FIG. 12B, a second electrode 18 connected to a second conductivity-type semiconductor layer 16 may be formed on an upper surface (that is, a second surface) of the laminated semiconductor structure L.

The second electrode 18 may be formed to have a wide area of contact with the second conductivity-type semiconductor layer 16. According to the exemplary embodiment, the second electrode 18 may be formed to cover the entire upper surface of the second conductivity-type semiconductor layer 16. The second electrode 18 may be a transparent conductive oxide or a transparent conductive nitride. For example, the transparent conductive oxide layer may be at least one of ITO, ZITO, ZIO, GIO, ZTO, FTO, AZO, GZO, $In_4Sn_3O_{12}$, or $Zn_{(1-x)}Mg_xO$ ($0 \leq x \leq 1$). In some embodiment, the second electrode 18 may include a light-transmissive metal layer such as Ni/Au, or graphene. In the exemplary embodiment, the second electrode formation process is performed after the device isolation process. However, the second electrode formation process may be performed before the device isolation process, and the second electrode 18 may be separated into device units in the device isolation process.

Figure 12C:
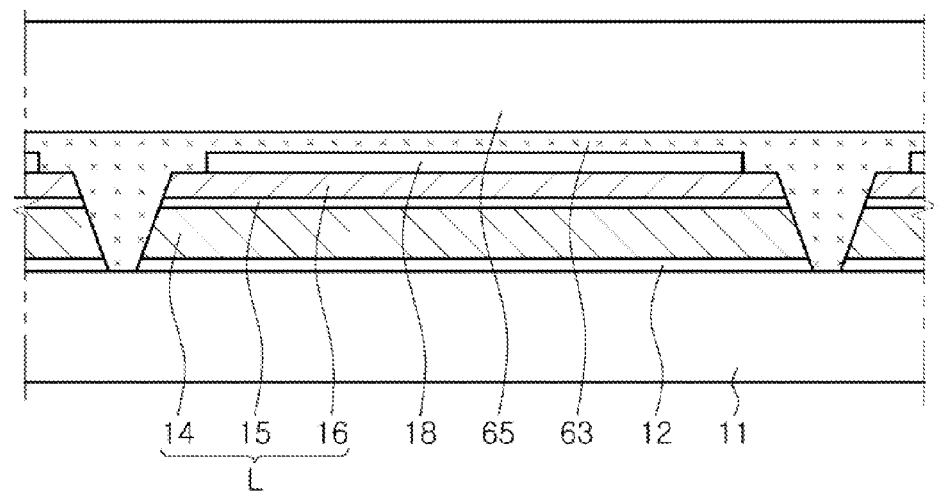

As illustrated in FIG. 12C, an insulating member 63 may be applied to the laminated semiconductor structure L separated into the device units, and a support substrate 65 may be disposed on the insulating member 63.

The insulating member 63 may fill the device isolation trench ISO and cover the upper surface of the laminated semiconductor structure L. The insulating member 63 according to the exemplary embodiment of the present disclosure may include a light-transmissive material. The insulating member 63 may be a light-transmissive material, such as silicon oxide, silicon nitride, or various curable resins. The process may be performed using a spin process or a reflow process. For example, the insulating member 63 may be TEOS, BPSG, SOG, or SOD. As necessary, a process of planarizing a surface of the insulating member 63 may be additionally performed.

The support substrate 65 may be bonded to the insulating member 63 using an additional adhesive layer. Alternatively, the insulating member 63 may be a material bondable to the support substrate 65 to bond the laminated semiconductor structure L to the support substrate 65. For example, the insulating member 63 may be another adhesive material, such as BCB, DFR, an epoxy, and silicone resin.

Figure 12D:
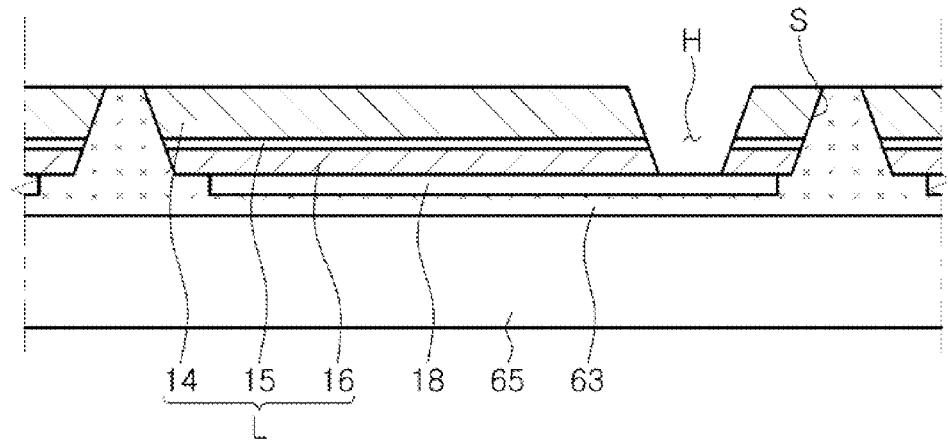

Next, as illustrated in FIG. 12D, the growth substrate 11 may be removed from the laminated semiconductor structure L, and a through-hole H may be formed in the laminated semiconductor structure L.

In the process, the buffer layer 12 having high electrical resistance may be removed together with the substrate 11. The process of forming the through-hole H may be performed by selectively removing the laminated semiconductor structure L. The selective removal process may be performed using mechanical cutting, chemical etching, or dry etching using plasma. A portion of the second electrode 18 may be exposed by the through-hole H formed in the process. The exposed portion of the second electrode 18 may be provided as a contact area (region "C" in FIG. 12E).

Figure 12E:
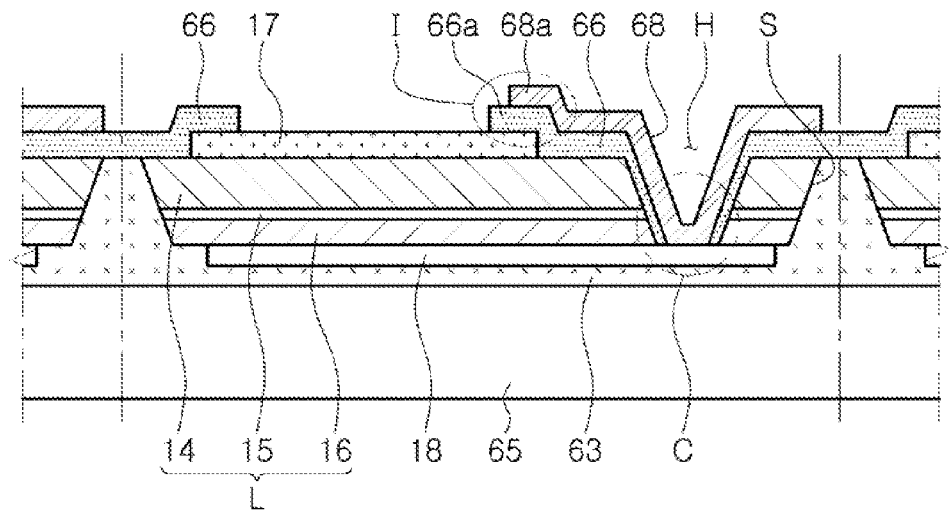

Next, as illustrated in FIG. 12E, a connecting electrode 68 may be formed in the contact area C exposed by the through-hole H to be connected to the second electrode 18.

The connecting electrode 68 may extend to the first surface of the laminated semiconductor structure L. A portion 68a of the connecting electrode 68, disposed on the first surface, may be provided as a pad area. The insulating layer 66 may be formed on an inner sidewall of the through-hole H and a portion of the first surface so that the connecting electrode 68 is not connected to the active layer 15 or the first conductivity-type semiconductor layer 14. Through the process, both pad areas related to the first and second electrodes 17 and 18 may be formed on the first surface of the laminated semiconductor structure L.

In the exemplary embodiment, the pad area 68a of the connecting electrode 68 may extend to a portion of the first electrode 17, and the insulating layer 66 may include a portion 66a extending onto the first electrode 17 such that the pad area 68a of the connecting electrode 68 is electrically isolated from the first electrode 17 (please see region "I"). In addition, the insulating layer 66 deposited in this process may be provided to the other side of the semiconductor light-emitting device 60 as a passivation layer.

Figure 12F:
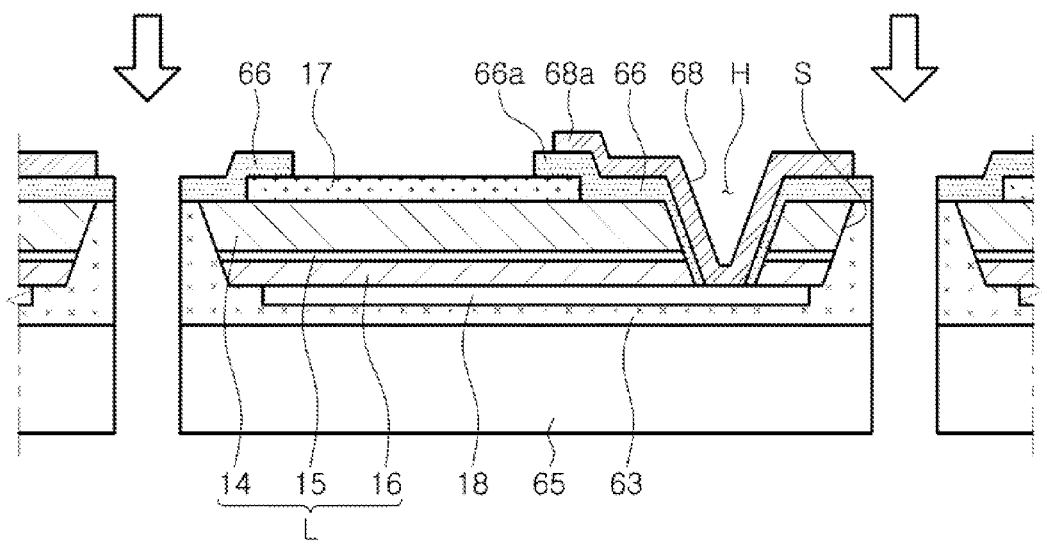

Next, as illustrated in FIG. 12F, a preferred semiconductor light-emitting device 60 may be obtained by separating the resultant structure illustrated in FIG. 12E into individual device units.

Figure 13:
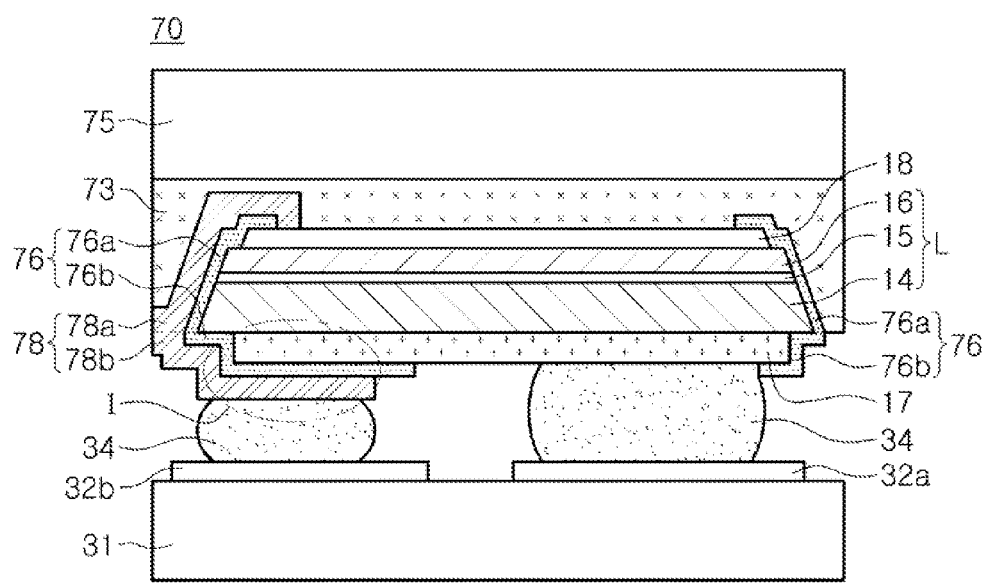
FIG. 13 is a cross-sectional view illustrating a flip-chip bonded semiconductor light-emitting device according to an exemplary embodiment.

FIG. 13 is a cross-sectional view illustrating a flip-chip bonded semiconductor light-emitting device according to an exemplary embodiment of the present disclosure.

Referring to FIG. 13, a flip-chip semiconductor light-emitting device 70 according to the exemplary embodiment of the present disclosure may include a laminated semiconductor structure L, first and second electrodes 17 and 18, and a support substrate 75.

In the exemplary embodiment, similar to the above-described embodiments, the first and second electrodes 17 and 18 may be disposed on a first surface and a second surface opposing each other in the laminated semiconductor structure L. The connecting electrode 78 may be connected to the second electrode disposed on the second electrode 18 of the laminated semiconductor structure L to extend to the first electrode 17 of the laminated semiconductor structure L. The connecting electrode according to the exemplary embodiment, unlike the above-described embodiments, may be disposed on side surface(s) of the laminated semiconductor structure L. The connecting electrode 78 may be divided into a first connecting electrode 78a disposed on the side surface(s) and the second surface of the laminated semiconductor structures L, and a second connecting electrode 78b disposed on the first surface and provided as a pad area. Thus, in the exemplary embodiment, connecting electrode 78 may be formed using the side surfaces of the laminated semiconductor structure L without using a through-hole.

In order to ensure a sufficient pad area for connecting the connecting electrode 78 to an external circuit, the second connecting electrode 78b disposed on the first surface of the laminated semiconductor structure L may extend to a portion of an upper/outer surface of the first electrode 17. The insulating layer 76 may be divided into a first insulating layer 76a disposed on the side surfaces of the semiconductor material and a second insulating layer 76b disposed on the first surface of the laminated semiconductor structure L. The first insulating layer 76a may prevent undesirable connection between the first connecting electrode 78a and the laminated semiconductor structure L, and the second insulating layer 76b may prevent the second connecting electrode 78b from being electrically connected to the first electrode 17 as well as the first conductivity-type semiconductor layer 14 (please see region "I").

In this manner, the semiconductor light-emitting device 70 may have a flip-chip structure including pad areas for connecting the first and second electrodes 17 and 18 to external circuits, on the first surface of the laminated semiconductor structure L. Conductive bumps 34 may be respectively provided to the first electrode 17 and the connecting electrode 78 provided as pad areas. As illustrated in FIG. 13, the semiconductor light-emitting device 70 may be connected to first and second circuit patterns 32a and 32b of a circuit substrate 31 using the conductive bumps 34.

The semiconductor light-emitting device 70 may further include an insulating member 73 surrounding side surface S of the laminated semiconductor structure L. The insulating member 73 may also be provided to cover the second surface of the laminated semiconductor structure L, that is, the second electrode 18. The insulating member 73 according to the exemplary embodiment may be the same as or similar to the insulating material 63 described in the above embodiment with reference to FIG. 11.

A method of fabricating the semiconductor light-emitting device 70 illustrated in FIG. 13 may be described with reference to FIGS. 14A to 14E.

Figure 14A:
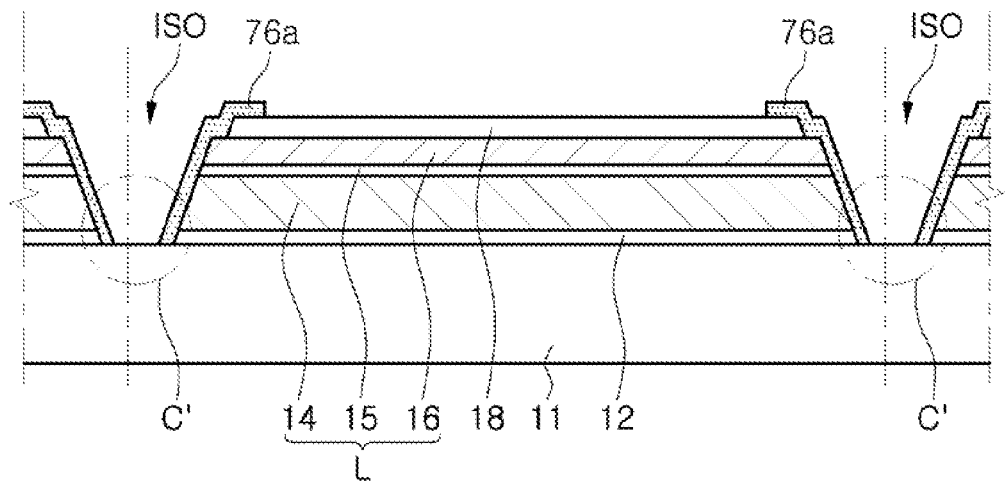
FIGS. 14A to 14E are cross-sectional views illustrating main process steps of fabricating the semiconductor light-emitting device illustrated in FIG. 13.

As illustrated in FIG. 14A, a first insulating layer 76a may be formed on side surfaces of a laminated semiconductor structure L separated into device units (e.g., separated by a device isolation trench ISO).

A process of forming the first insulating layer 76a may be understood as being performed after a device isolation process of the laminated semiconductor structure L (refer to FIG. 12A) and a second electrode formation process (refer to FIG. 12B) are performed. The first insulating layer 76a may be deposited on an entire first surface of the laminated semiconductor structure L separated into the device units, and then selectively removed from an upper surface of the second electrode 18 and a contact area C' of a device isolation region.

Figure 14B:
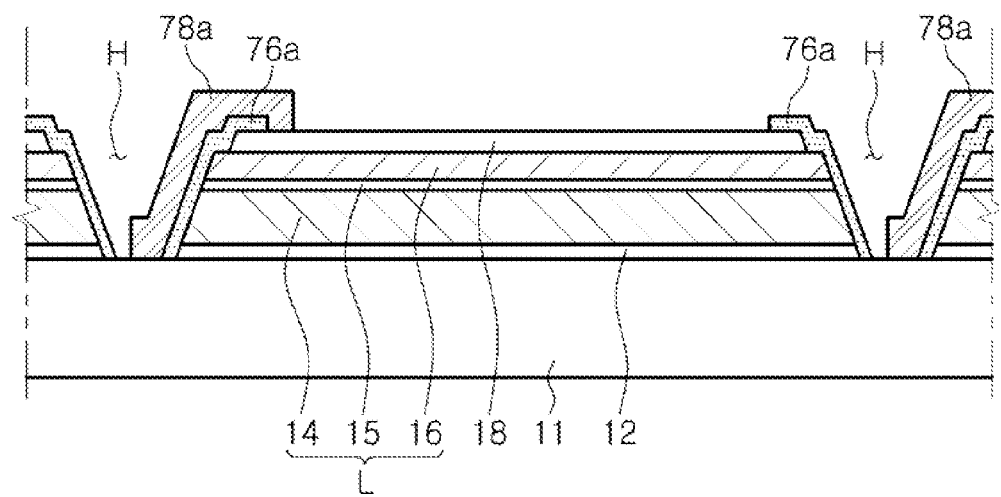

Next, as illustrated in FIG. 14B, a first connecting electrode 78a may be formed on the side surfaces of the laminated semiconductor structure L.

The first connecting electrode 78a may be connected to the second electrode 18 disposed on a second surface of the laminated semiconductor structure L, and extend on the side surfaces of the laminated semiconductor structure L to the contact area C' disposed between the laminated semiconductor structures L. The first connecting electrode 78a may be formed on the first insulating layer 76a to cover at least a portion of the first insulating layer 76a, as shown in FIG. 14B.

Figure 14C:
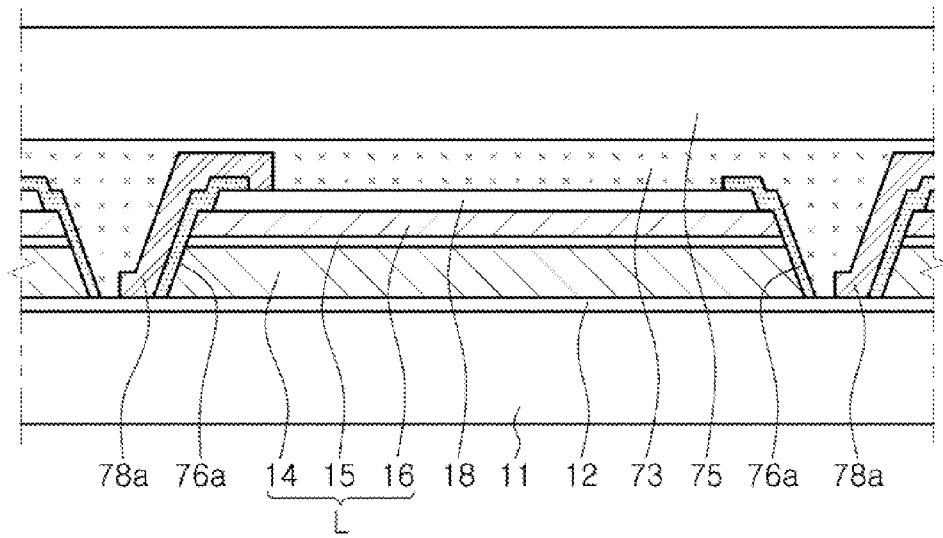

Next, as illustrated in FIG. 14C, an insulating member 73 may be formed on the laminated semiconductor structure L separated into the device units, and a support substrate 75 may be formed on the insulating member 73.

Similar to the above-described embodiment, the insulating member 73 may fill a device isolation trench ISO and cover an upper surface of the laminated semiconductor structure L. A process of bonding the support substrate 75 may be performed using an additional adhesive layer. However, the insulating member 73 itself may be formed of a material bondable to the support substrate 75, as necessary.

Figure 14D:
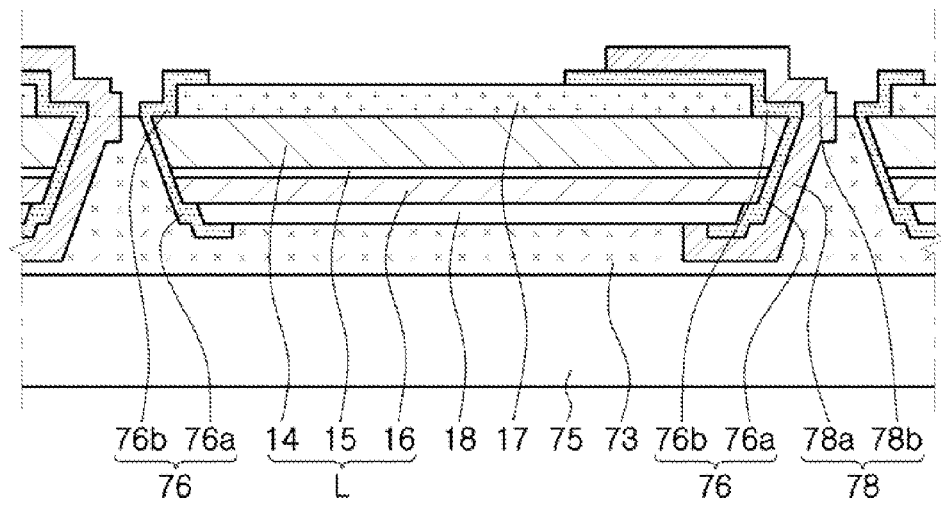

Next, as illustrated in FIG. 14D, a growth substrate 11 may be removed from the laminated semiconductor structure L, and a first electrode 17 and a second connecting electrode 78b may be formed on the first surface of the laminated semiconductor structure L.

In this process, a buffer layer 12 having high electrical resistance may be removed together with the growth substrate 11 to expose the second surface (that is, a first conductivity-type semiconductor layer 14) of the laminated semiconductor structure L. The first electrode 17 may be formed on the second surface of the laminated semiconductor structure L to be connected to the first conductivity-type semiconductor layer 14. In the flip-chip structure according to the exemplary embodiment of the present disclosure, the first electrode 17 may have an ohmic contact structure having high reflectance. Next, after forming the first electrode 17, the second insulating layer 76b and the second connecting electrode 78b may be formed. While removing the growth substrate 11, a portion of the first connecting electrode 78a, located at the contact area C', may be exposed. Although only the exposed portion of the first connecting electrode 78a is provided as a pad area, the second connecting electrode 78b may be additionally formed to ensure a sufficient pad area, as in the exemplary embodiment. The second connecting electrode 78b may be formed on the first surface of the laminated semiconductor structure L to be connected to the exposed portion of the first connecting electrode 78a. In addition, as shown in the exemplary embodiment, the second connecting electrode 78b may extend to overlap with a portion of the first electrode 17 to additionally expand the pad area.

Figure 14E:
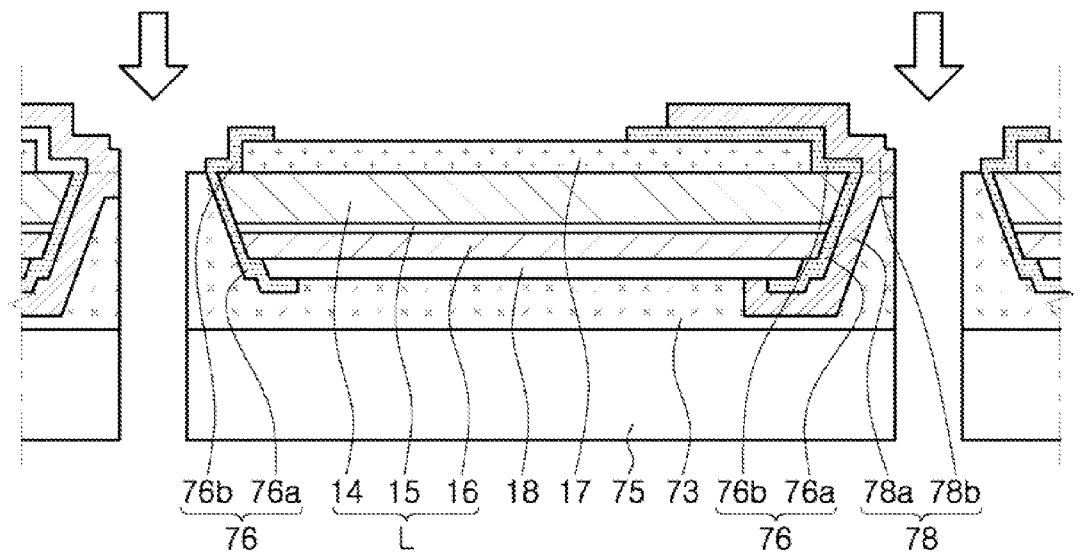

Next, as illustrated in FIG. 14E, the semiconductor light-emitting device 70 may be obtained by separating the resultant structure illustrated in FIG. 14D into individual device units.

FIG. 15 is a cross-sectional view illustrating a flip-chip bonded semiconductor light-emitting device according to an exemplary embodiment of the present disclosure.

A semiconductor light-emitting device 80 illustrated in FIG. 15 may have the same electrode structure as the semiconductor light-emitting device 70 illustrated in FIG. 13. However, unlike the above-described embodiments, a support substrate according to the exemplary embodiment may be a support 85 formed of a light-transmissive resin containing a wavelength conversion material P such as a phosphor or a quantum dot. As the light-transmissive resin, a curable resin, such as silicone resin or epoxy resin may be used. In the above-described embodiments, the process of FIG. 14C may be replaced by a process of applying a light-transmissive liquid resin mixed with the wavelength conversion material P to the laminated semiconductor structure L and curing it, to fabricate the semiconductor light-emitting device illustrated in FIG. 15. The support 85 according to the exemplary embodiment may replace other support substrates described in the above-described embodiments. Such a support 85 may be bonded to the second electrode 18 with no additional adhesive layer. In addition, instead of applying the liquid resin to the laminated semiconductor structure L as in this exemplary embodiment, the support 85 may be shaped in advance, and applied to the laminated semiconductor structure L in a cured or semi-cured state.

The support 85 is illustrated as a polymer-based resin, however, another light-transmissive material such as glass may be used. For example, in the case of a glass substrate, a glass substrate containing a phosphor may be fabricated by mixing a wavelength conversion material P such as a phosphor into a glass composition and sintering it at a low temperature.

The phosphor or the quantum dot QD employable in the exemplary embodiment may have a variety of compositions and wavelength characteristics. As the phosphor, a ceramic phosphor, such as an oxide group, a silicate group, a nitride group, and a fluoride group may be used.

Oxide group: yellow and green $Y_3Al_5O_{12}$:Ce, $Tb_3Al_5O_{12}$:Ce, $Lu_3Al_5O_2$:Ce Silicate group: yellow and green $(Ba,Sr)_2SiO_4$:Eu, yellow and orange $(Ba,Sr)_3SiO_5$:Ce Nitride group: green $\beta$-SiAlON:Eu, yellow $La_3Si_6N_{11}$:Ce, orange $\alpha$-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, and $0 < y \leq 4$) (Here, Ln is at least one element selected from the group consisting of a IIIa group element and a rare earth element, and M is at least one element selected from the group consisting of Ca, Ba, Sr, and Mg.)

Fluoride group: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$ The composition of the phosphor may be basically stoichiometric and each element may be substituted by another element within a corresponding group on the periodic table. For example, Sr may be substituted by Ba, Ca, or Mg in the alkaline-earth (II) group, and Y may be substituted by Tb, Lu, Sc, or Gd in the lanthanide group. In addition, an activator, Eu, may be substituted by Ce, Tb, Pr, Er, or Yb depending on a preferred energy level. The activator may be used alone, or a co-activator may be additionally used to change characteristics thereof.

In addition, a quantum dot may replace the phosphor, or the phosphor and the quantum dot may be used alone or as a mixture.

The quantum dot may have a structure consisting of a core such as CdSe or InP (3 to 10 nm), a shell such as ZnS or ZnSe (0.5 to 2 nm), and a ligand for stabilizing the core and the shell. In addition, the quantum dot may implement a variety of colors according to a size thereof.

The bellow Table 1 illustrates various types of phosphors of a white light-emitting device using a UV LED chip (200 to 440 nm) or a blue LED chip (440 to 480 nm), listed by applications.

TABLE 1

| Purpose | Phosphor |
|---|---|
| LED TV BLU | $\beta$-SiAlON:$Eu^{2+}$, (Ca, Sr)AlSiN$_3$:$Eu^{2+}$, La$_3$Si$_6$N$_{11}$:Ce$^{3+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, and $0 < y \leq 4$), K$_2$TiF$_6$:Mn$^{4+}$, NaYF$_4$:Mn$^{4+}$, NaGdF$_4$:Mn$^{4+}$ |
| Illuminations | Lu$_3$Al$_5$O$_{12}$:Ce$^{3+}$, Ca-$\alpha$-SiAlON:Eu$^{2+}$, La$_3$Si$_6$N$_{11}$:Ce$^{3+}$, (Ca, Sr)AlSiN$_3$:Eu$^{2+}$, Y$_3$Al$_5$O$_{12}$:Ce$^{3+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, and $0 < y \leq 4$), K$_2$TiF$_6$:Mn$^{4+}$, NaYF$_4$:Mn$^{4+}$, NaGdF$_4$:Mn$^{4+}$ |
| Side View (Mobile, Note PC) | Lu$_3$Al$_5$O$_{12}$:Ce$^{3+}$, Ca-$\alpha$-SiAlON:Eu$^{2+}$, La$_3$Si$_6$N$_{11}$:Ce$^{3+}$, (Ca, Sr)AlSiN$_3$:Eu$^{2+}$, Y$_3$Al$_5$O$_{12}$:Ce$^{3+}$, (Sr, Ba, Ca, Mg)$_2$SiO$_4$:Eu$^{2+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 < z < 0.3$, and $0 < y \leq 4$), K$_2$TiF$_6$:Mn$^{4+}$, NaYF$_4$:Mn$^{4+}$, NaGdF$_4$:Mn$^{4+}$ |

TABLE 1-continued

| Purpose | Phosphor |
| --- | --- |
| Electronics (Head Lamp, etc.) | $Lu_3Al_5O_{12}:Ce^{3+}$, $Ca-\alpha-SiAlON:Eu^{2+}$, $La_3Si_6N_{11}:Ce^{3+}$, $(Ca, Sr)AlSiN_3:Eu^{2+}$, $Y_3Al_5O_{12}:Ce^{3+}$, $K_2SiF_6:Mn^{4+}$, $SrLiAl_3N_4:Eu$, $Ln_{4-x}(Eu_zM_{1-z})_xSi_{12-y}Al_yO_{3+x+y}N_{18-x-y}$ $(0.5 \le x \le 3, 0 < z < 0.3, \text{ and } 0 < y \le 4)$, $K_2TiF_6:Mn^{4+}$, $NaYF_4:Mn^{4+}$, $NaGdF_4:Mn^{4+}$ |

As such, various kinds of wavelength conversion materials, such as phosphors or quantum dots, may be used to convert light emitted from an active layer. Further, white light may be implemented as finally emitted light, using the wavelength conversion material. The exemplary embodiment is illustrated as being implemented as a chip, but may be implemented at a package level including the chip (refer to FIGS. 26 and 27).

Figure 16A:
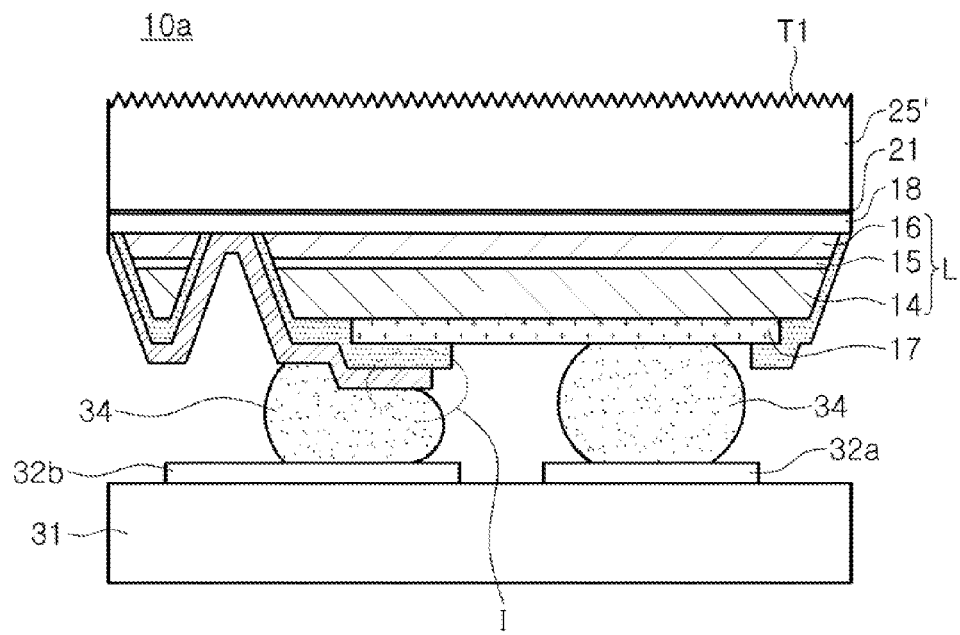
FIGS. 16A to 16C are cross-sectional views illustrating flip-chip bonded semiconductor light-emitting devices having improved light extraction efficiency according to various exemplary embodiments.
Figure 16B:
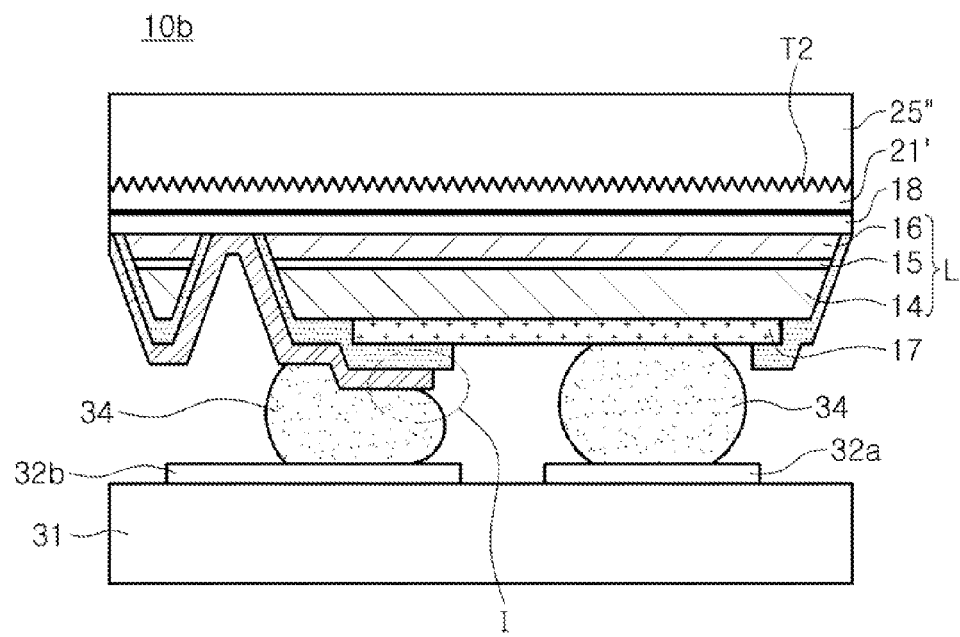
Figure 16C:
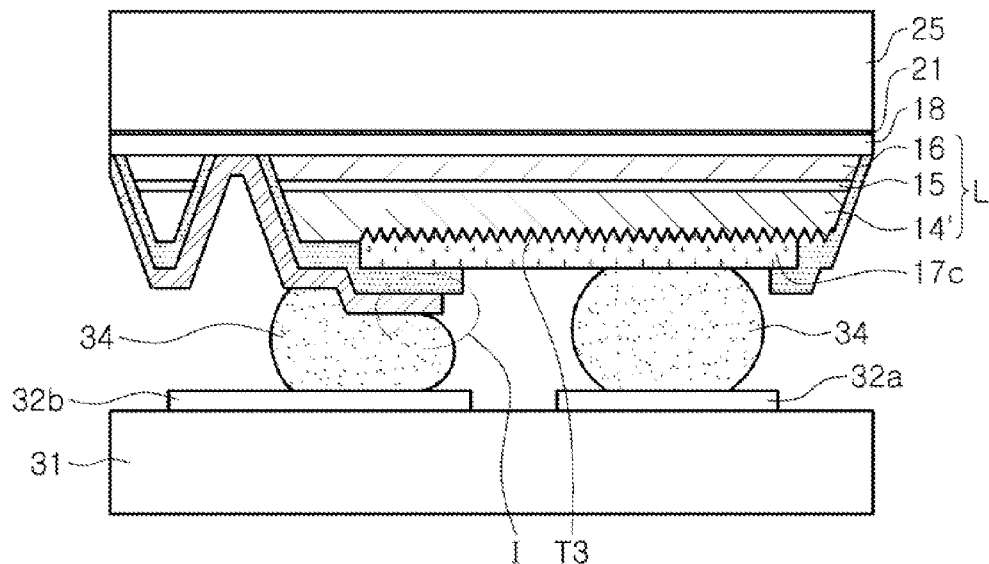

FIGS. 16A to 16C are cross-sectional views illustrating flip-chip bonded semiconductor light-emitting devices according to various exemplary embodiments of the present disclosure.

Semiconductor light-emitting devices (10a, 10b, and 10c) illustrated in FIGS. 16A to 16C are examples in which textured structures for improving light extraction efficiency are introduced to interfaces disposed at different locations. It may be understood that some configurations of the semiconductor light-emitting devices are modified from the semiconductor light-emitting device illustrated in FIG. 4.

A semiconductor light-emitting device 10a illustrated in FIG. 16A may include a support substrate 25' having a light-emitting surface on which texture T1 is formed. The texture T1 of the support substrate 25' may be formed before or after the support substrate 25' is bonded to a laminated semiconductor structure L.

A semiconductor light-emitting device 10b illustrated in FIG. 16B may include a support substrate 25" and an adhesive layer 21' bonding the support substrate 25". A texture T2 for improving light extraction efficiency may be provided to an interface between the support substrate 25" and the adhesive layer 21'. That is, the texture T2 may be previously formed on a bonding surface of the support substrate 25", and then the support substrate 25" is bonded to the adhesive layer 21' before the adhesive layer 21' is cured.

A semiconductor light-emitting device 10c illustrated in FIG. 16C may include a texture T3 on an interface between a first electrode 17c provided as a reflective electrode and the first conductivity-type semiconductor layer 14'. Such a structure may be obtained by forming the texture T3 on a surface of the first conductivity-type semiconductor layer 14' and depositing the first electrode 17c thereon. The texture T3 of the first conductivity-type semiconductor layer 14' may be formed during a process of separating a growth substrate or by an additional etching process after separating the growth substrate.

In addition to the textures described in the above-described embodiments, a texture may be introduced to an interface between two layers having different refractive indices. For example, when the second electrode 18 is a light-transmissive electrode such as ITO, the texture may be additionally introduced to a surface of the light-transmissive electrode (e.g., a surface shared by the second electrode 18 and the second conductivity-type semiconductor layer 16).

Although the above-described exemplary embodiments describe the flip-chip semiconductor light-emitting devices, the inventive concept may be implemented in a chip structure (with wire bonding structure) in which a support substrate provides amounting surface. FIGS. 17 to 21 are cross-sectional views illustrating semiconductor light-emitting devices according to various exemplary embodiments of the present disclosure.

Figure 17:
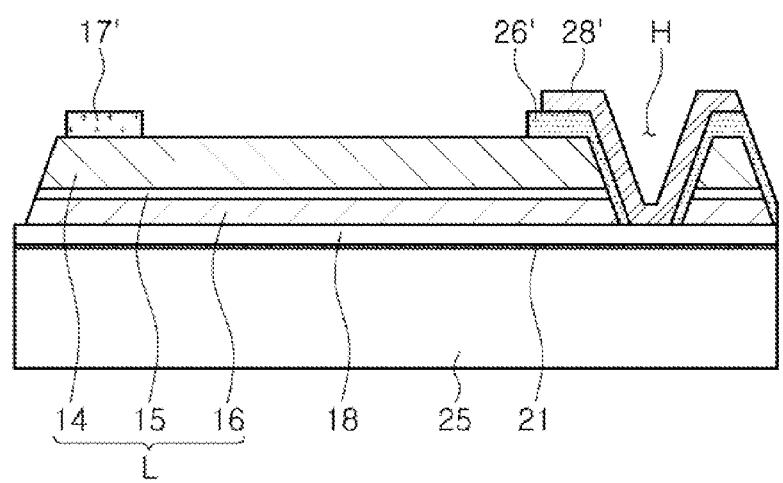
FIGS. 17 to 21 are cross-sectional views illustrating semiconductor light-emitting devices according to various exemplary embodiments.

As illustrated in FIG. 17, a semiconductor light-emitting device 10' may have a similar structure to the semiconductor light-emitting device 10 illustrated in FIG. 1, except that an electrode arrangement on a first surface of the laminated semiconductor structure L is different. The electrode arrangement according to the exemplary embodiment of the present disclosure may be modified in order to smoothly extract light through the first surface. The first electrode 17' may be formed on a portion of the first surface of the laminated semiconductor structure L, and a portion of the connecting electrode 28', disposed on the first surface, may be smaller than the pad area of the connecting electrode 28 illustrated in FIG. 1.

In the exemplary embodiment, the second electrode 18 may be a light-transmissive electrode such as ITO, and the support substrate 25 may be a light-transmissive substrate such as a glass substrate. In this case, light emitted from the semiconductor light-emitting device 10' may be extracted from side surfaces of a device as well as an upper surface of a device (that is, the first surface of the laminated semiconductor structure L). Alternatively, the second electrode 18 may be configured with a high reflectivity electrode. For example, the second electrode 18 may include Ag, Ni, Al, Rh, Pd, Ir, Ru, Mg, Zn, Pt, or Au. In this case, alight non-transmissive substrate may be used as the support substrate 25.

A method of fabricating a semiconductor light-emitting device according to the exemplary embodiment of the present disclosure may be described with reference to FIGS. 5A to 5G as described above. However, the process related to the electrode arrangement on the first surface (refer to FIG. 5F) may be modified to a process of implementing the electrode arrangement illustrated in FIG. 17.

Figure 18:
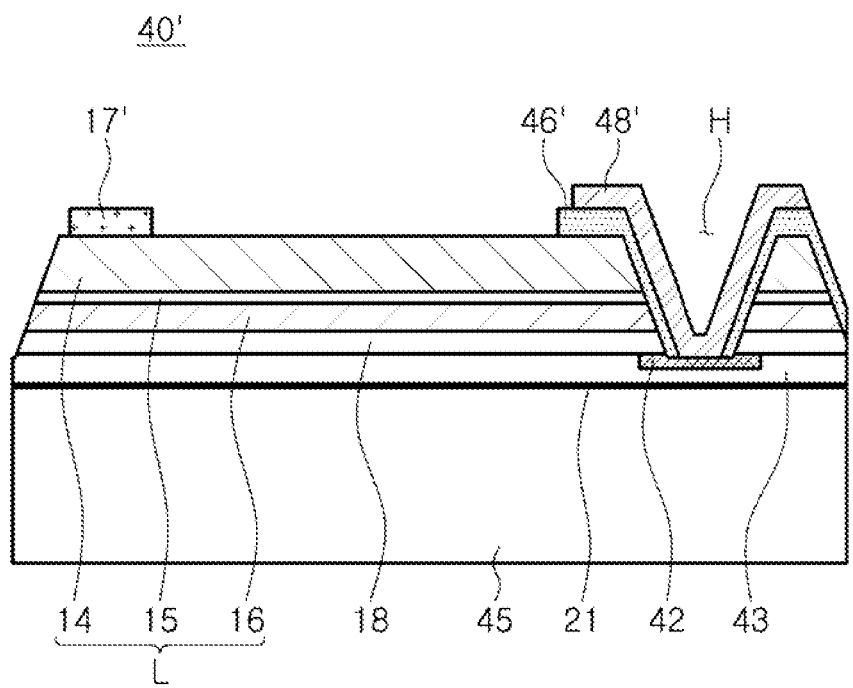
Figure 19:
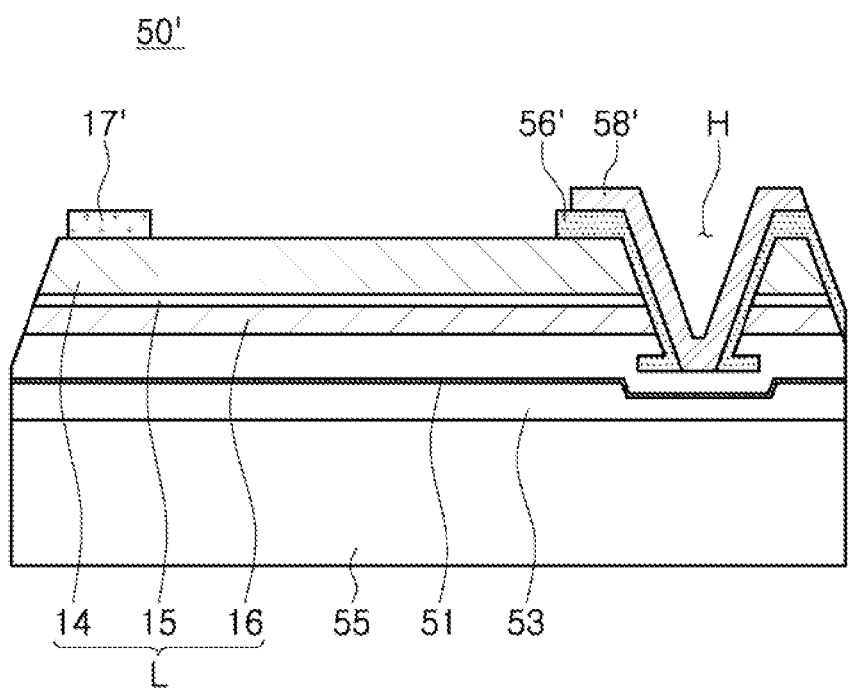

Semiconductor light-emitting devices 40' and 50' illustrated in FIGS. 18 and 19 are examples in which an etch-stop layer is employed, and have similar structures to the semiconductor light-emitting devices 40 and 50 respectively illustrated in FIGS. 6 and 9 except that the electrode arrangement on the first surface of the laminated semiconductor structure L is different.

Figure 20:
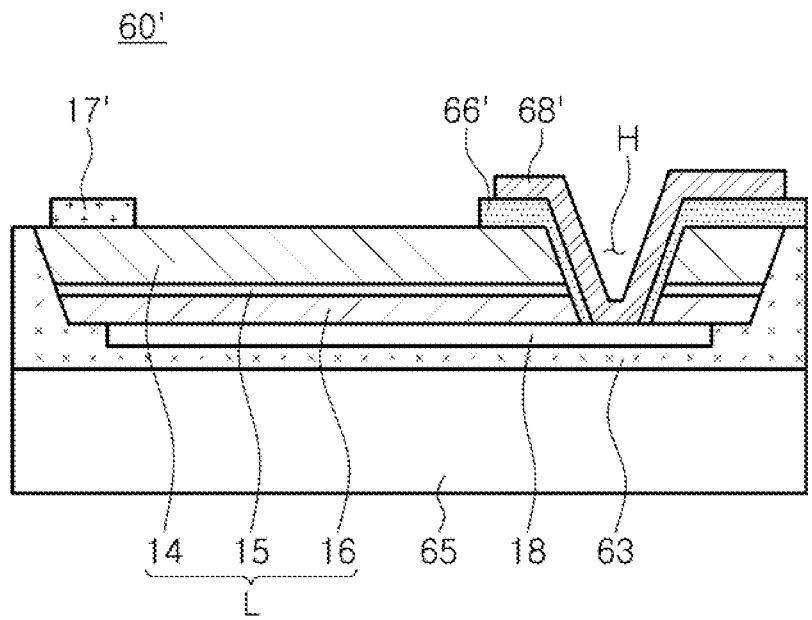
Figure 21:
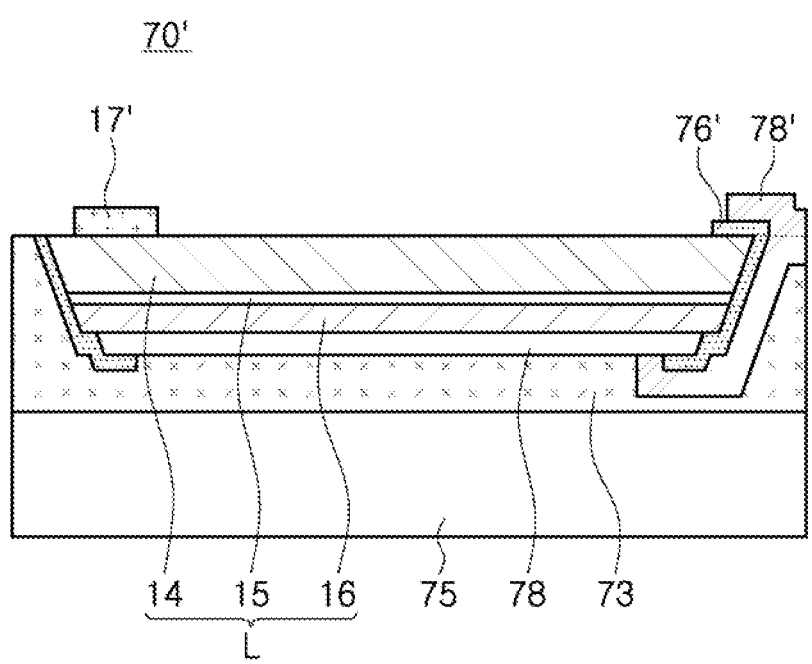

Similarly, semiconductor light-emitting devices 60' and 70' illustrated in FIGS. 20 and 21 are examples in which a device isolation process is applied before the substrate is removed, and have a similar structure to the semiconductor light-emitting devices 60 and 70 illustrated in FIGS. 11 and 13 except that the electrode arrangement on the first surface of the laminated semiconductor structure L is different.

The electrode arrangement employed in the semiconductor light-emitting devices illustrated in FIGS. 18 to 21, as described in the above-described embodiment with reference to FIG. 17, may be modified so that light is smoothly extracted through the first surface. The first electrode 17' may be formed on only a portion of the first surface of the laminated semiconductor structure L, and a portion of the connecting electrode, located on the first surface, may have a relatively smaller area. Processes of fabricating the semiconductor light-emitting devices according to the exemplary embodiments described with reference to FIGS. 17 to 21 may be similar to the processes of fabricating the corresponding semiconductor light-emitting devices described with reference to FIGS. 1, 6, 9, 11, and 13 except the process related to the electrode arrangement on the first surface.

FIGS. 22A to 22F are cross-sectional views illustrating main processes in a method of fabricating a semiconductor light-emitting device, and FIGS. 23A to 23D are plan views illustrating mask patterns used in respective processes.

Figure 22A:
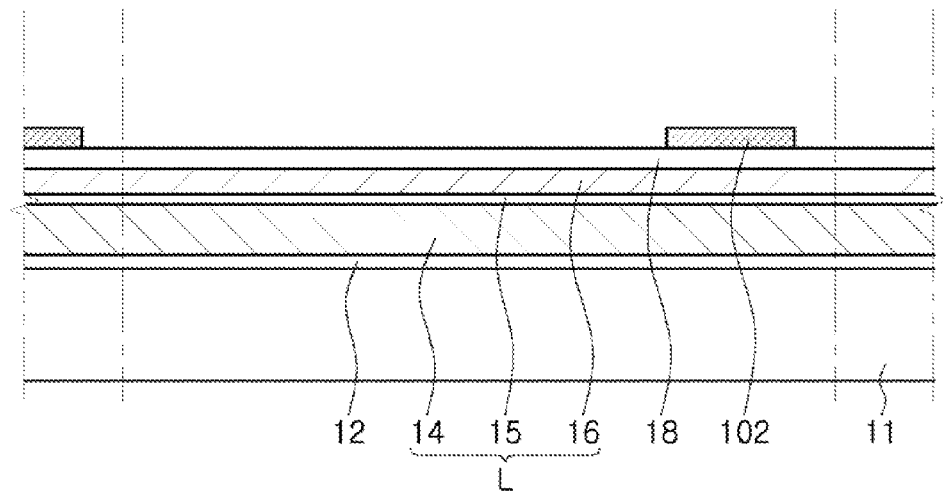
FIGS. 22A to 22F are cross-sectional views illustrating main process steps in a method of fabricating a semiconductor light-emitting device according to an exemplary embodiment.

First, as illustrated in FIG. 22A, a metal electrode 102 may be formed on a second electrode 18 disposed on a laminated semiconductor structure L. In the process, the metal electrode 102 may be formed to be disposed on an area in which the laminated semiconductor structure L is to be removed in the subsequent process. The metal electrode 102 may be a material having high etch selectivity with respect to the second electrode 18. For example, the second electrode 18 may be a light-transmissive electrode, for example a conductive oxide such as ITO. The metal electrode 102 may be a metal material, such as Al, Au, Ag, Ti, or TiW.

Figure 23A:
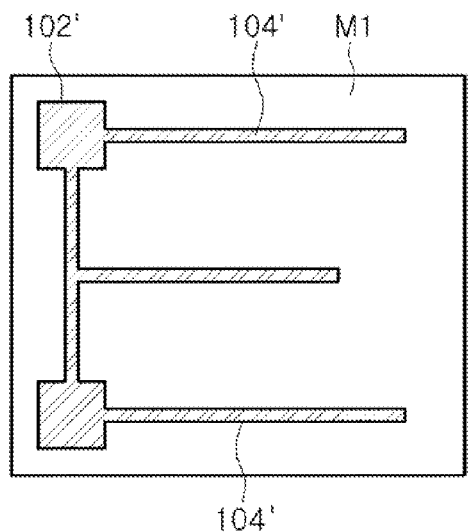
FIGS. 23A to 23D are plan views illustrating mask patterns used in the main process steps illustrated in FIGS. 22A to 22F.

A mask M1 illustrated in FIG. 23A is an example of a mask available for use in the electrode formation process. As illustrated in FIG. 23A, the mask M1 may include not only a pattern 102' for the metal electrode 102 but also a pattern 104' for a plurality of finger electrodes extending from the metal electrode pattern 102'. The plurality of finger electrodes may ensure uniform current spread in the device. The plurality of finger electrodes may be deposited using the same material as is used to form the metal electrode 102.

Figure 22B:
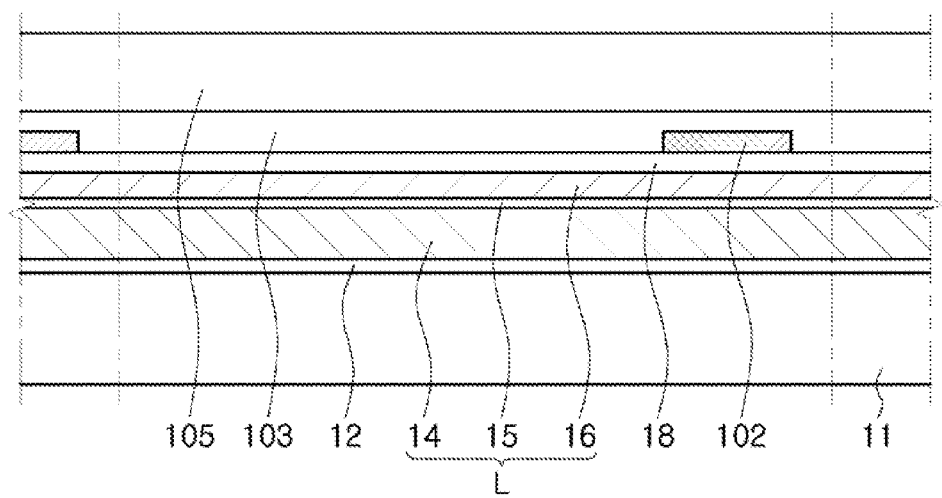

Next, as illustrated in FIG. 22B, a support substrate 105 may be formed on the second electrode 18 on which the metal electrode 102 is disposed.

The process may include forming a planarization layer 103 on the second electrode 18 and bonding the support substrate 105 to the planarization layer 103.

As illustrated in the exemplary embodiment, the planarization layer 103 may remove unevenness due to the metal electrode 102 and provide a flat surface advantageous for a subsequent bonding process. The planarization layer 103 may be a light-transmissive material, such as silicon oxide, silicon nitride, or various curable resins. For example, the planarization layer 103 may be TEOS, BPSG, SOG, or SOD. Since such a material has fluidity during processing, a relatively flat surface may be provided using a spin process or a reflow process. Alternatively or in combination, the planarization layer 103 may be obtained by forming a material layer for planarization and planarizing a surface thereof using a polishing process.

In this process, the support substrate 105 is illustrated as being directly bonded to the planarization layer 103 with no additional adhesive layer. However, as necessary, the support substrate 105 may be bonded to the planarization layer 103 using an additional adhesive layer.

Figure 22C:
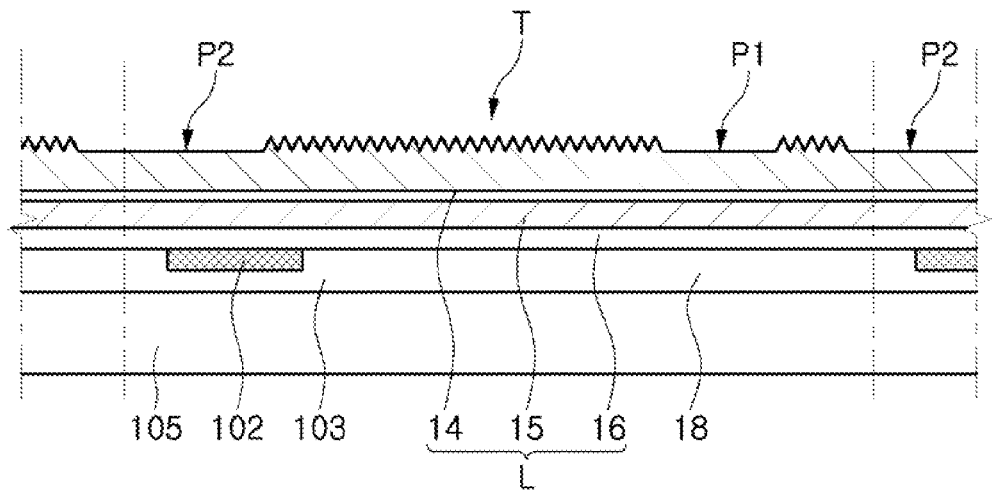

Next, as illustrated in FIG. 22C, the growth substrate 11 may be removed from the laminated semiconductor structure L, and a texture T may be formed on the first surface of the laminated semiconductor structure L.

The process of removing the growth substrate 11 may be performed using a laser lift-off process, a mechanical polishing process, or a chemical etching process. In this process, a buffer layer 12 having high electrical resistance may be removed together with the growth substrate 11. Through the removal process, the first surface of the laminated semiconductor structure L, that is, a surface of the first conductivity-type semiconductor layer 14 may be exposed. The texture T may be formed on the surface of the first conductivity-type semiconductor layer 14.

Figure 23B:
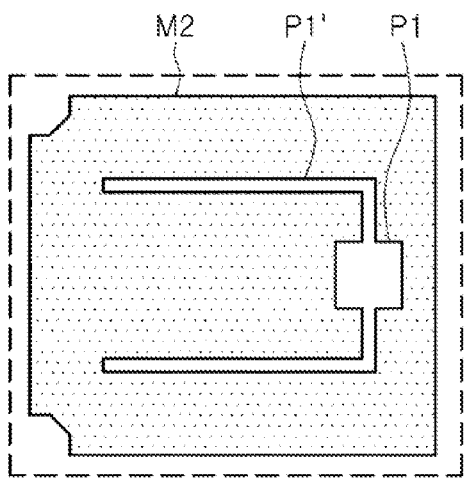
Figure 23C:
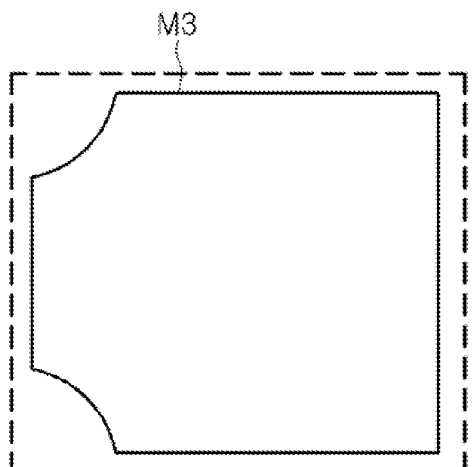

A mask M2 illustrated in FIG. 23B is an example of a mask usable in the texture formation process. Referring to FIG. 23B along with FIG. 22C, the mask M2 may include a pattern for removing the texture from electrode formation areas P1 and P1', after forming the texture T on the first surface of the laminated semiconductor structure L. Further, in this process, the mask M2 may include an additional pattern for removing the texture from a peripheral area P2. The mask M2 may define electrode formation areas P1 and P1', and the electrode formation areas P1 and P1' may include a pad formation area P1 and two finger electrode formation areas P1' extending therefrom. As in the exemplary embodiment, the two finger formation areas P1' may be disposed not to overlap the finger electrode pattern 102' illustrated in FIG. 23A, to reduce current crowding.

Figure 22D:
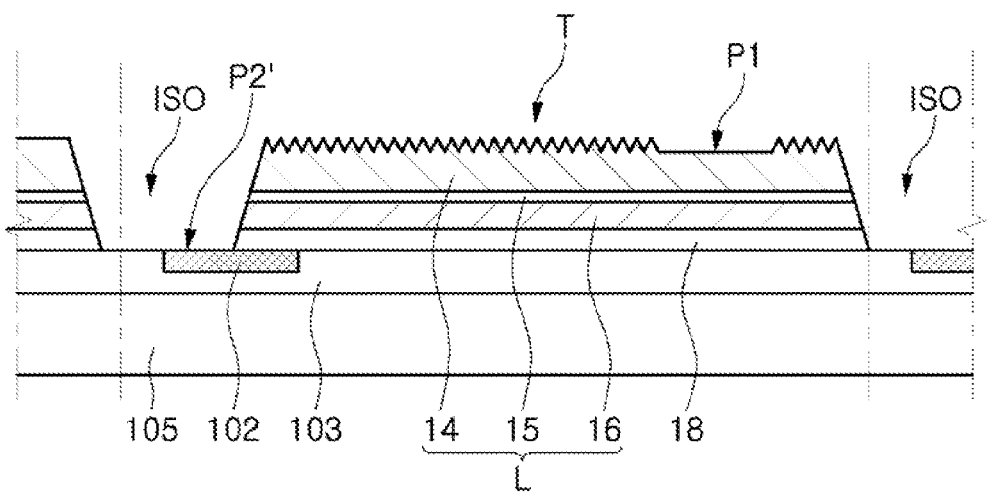

Next, as illustrated in FIG. 22D, a device isolation trench ISO may be formed to divide the laminated semiconductor structure L into individual device units.

Through the process, a portion of the laminated semiconductor structure L may be removed to expose a portion of the metal electrode 102. That is, the portion of the metal electrode 102 may be exposed, and another other portion of the metal electrode 102 may maintain the state of being connected to (and in direct contact with) the second electrode 18. A portion of the metal electrode 102 may be provided as a pad formation area. A mask M3 illustrated in FIG. 23C may have open areas P2' for forming the device isolation trench ISO and contact areas at both corners.

In the exemplary embodiment, since the metal electrode 102 has a low etch rate compared to the second electrode 18, the metal electrode 102 may be stably and reliably provided to the area in which the laminated semiconductor structure L is removed even when the second electrode 18 has a small thickness. One surface of the metal electrode 102 may have a portion connected to the second electrode, and the other surface of the metal electrode 102 may be in a state of being buried in the support substrate (in the exemplary embodiment, in planarization layer 103).

Figure 22E:
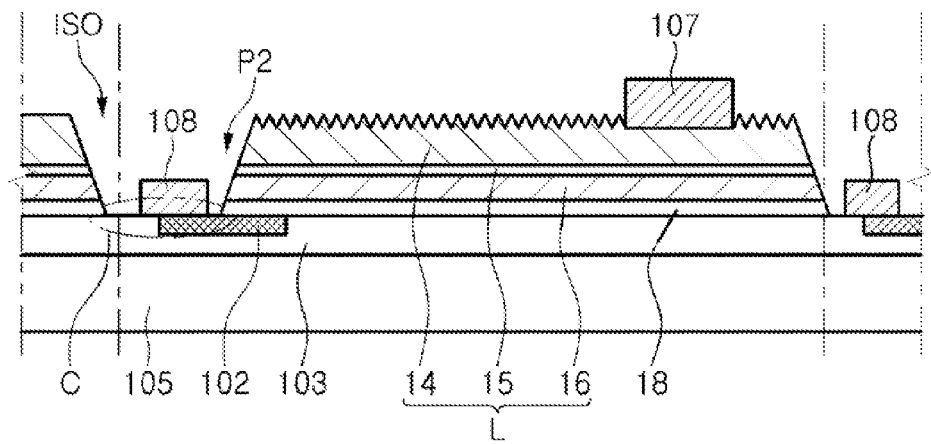

Next, as illustrated in FIG. 22E, first and second electrode pads 107a and 108 may respectively be formed on a portion of the first conductivity-type semiconductor layer 14 and on the metal electrode 102 disposed (and exposed) in the contact area on which a pad is to be formed.

Figure 23D:
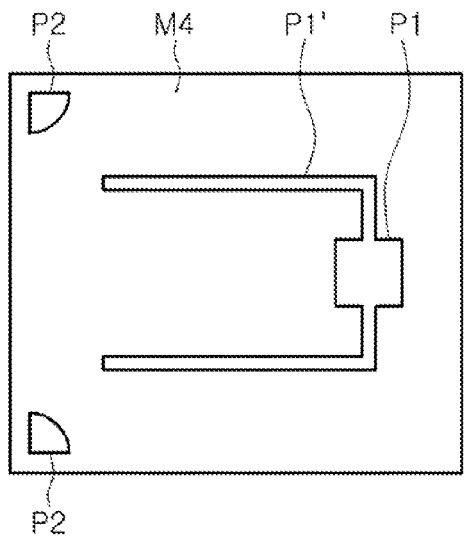

The mask M4 available for use in the process of electrode pad formation is illustrated in FIG. 23D. The mask M4 may have a pattern 107a' for the first electrode pad 107a and the pattern 108' for a second electrode pad 108. In addition, the mask M4 may include the finger electrode patterns 107b' extending from the first electrode pad pattern 107a'. The first electrode pad 107a and the finger electrodes extending therefrom may be formed on portions of the first conductivity-type semiconductor layer 14 using the mask M4, and the second electrode pad 108 may be formed on an area of the metal electrode 102, located on the contact area.

Figure 22F:
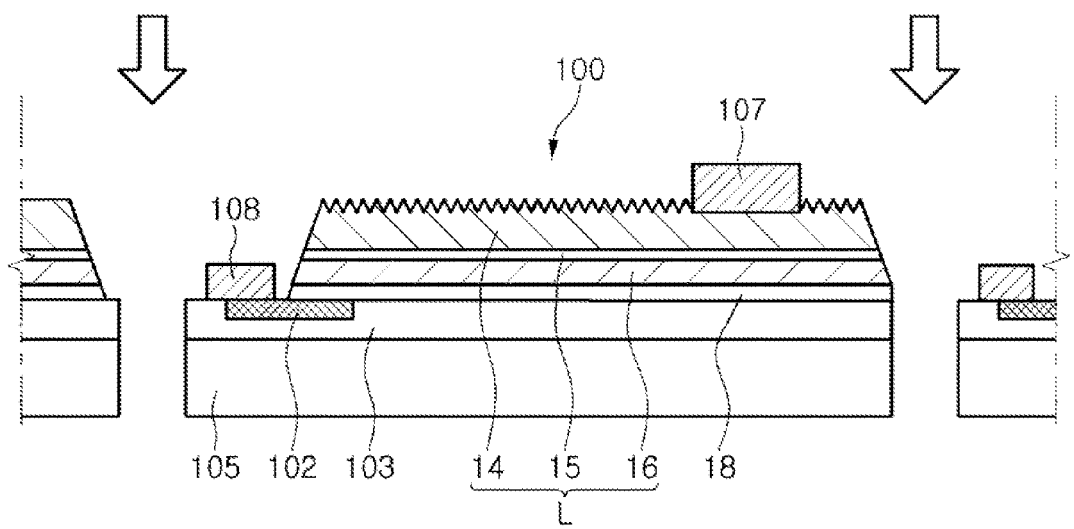

Next, as illustrated in FIG. 22F, a preferred semiconductor light-emitting device 100 may be obtained by separating the resultant structure illustrated in FIG. 22E into individual device units.

In the semiconductor light-emitting device 100 illustrated in FIG. 22F, an upper surface of the support substrate 105 (and/or an upper surface provided by the planarization layer 103) may be divided into a first area providing the contact area C and a second area in which the laminated semiconductor structure L is located. The first electrode pad 107 may be disposed on the first conductivity-type semiconductor layer 14. The second electrode 18 disposed between the second conductivity-type semiconductor layer 16 and the support substrate 105 may extend to the first area to provide an electrode pad. In the exemplary embodiment, the second electrode 18 may be removed in the first area to expose the metal electrode 102, but is not limited thereto. Portions of the second electrode 18 may remain in the first area according to the progress of the etching process.

In the exemplary embodiment, the support substrate 105 may include a light-transmissive substrate, and the second electrode 18 may include a light-transmissive electrode. The second electrode 18 may include a light-transmissive electrode disposed between the second conductivity-type semiconductor layer 16 and the support substrate 15, and a metal electrode 102 disposed on the first area and connected to the light-transmissive electrode, and a second electrode pad 108 disposed on the metal electrode 102.

The present invention may be applied not only to a semiconductor light-emitting device having a flip-chip structure but also to a semiconductor light-emitting device having a structure having a mounting direction opposite to the flip-chip structure, that is, a structure in which the laminated semiconductor structure L faces upward.

FIGS. 24A to 24F are cross-sectional views illustrating main processes in a method of fabricating a semiconductor light-emitting device, and FIGS. 25A to 25D are cross-sectional views illustrating various examples of a buffer structure employable in exemplary embodiment of the present disclosure.

Figure 24A:
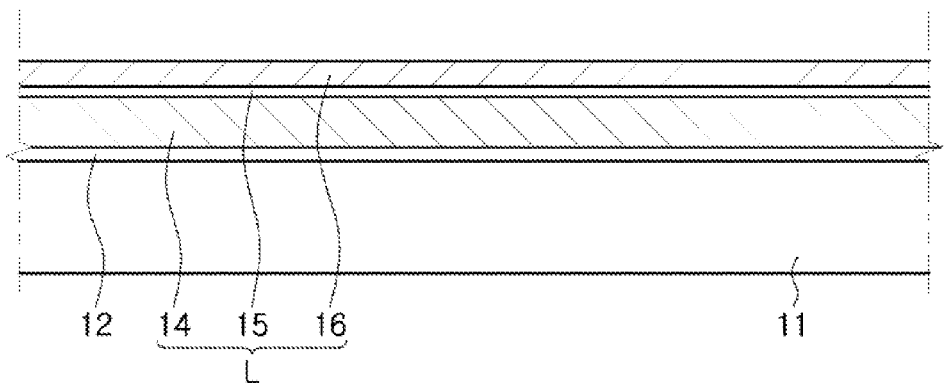
FIGS. 24A to 24F are cross-sectional views illustrating main process steps in a method of fabricating a semiconductor light-emitting device according to an exemplary embodiment.

As illustrated in FIG. 24A, a laminated semiconductor structure L for a plurality of light-emitting devices may be formed on a growth substrate 11.

The laminated semiconductor structure L may include a first conductivity-type semiconductor layer 14, an active layer 15, and a second conductivity-type semiconductor layer 16. The growth substrate 11 may be sapphire, SiC, Si, MgAl$_2$O$_4$, MgO, LiAlO$_2$, LiGaO$_2$, or GaN. The laminated semiconductor structure L may be a nitride semiconductor material. The laminated semiconductor structure L may be formed on a buffer layer 12 disposed on the substrate 11.

Figure 24B:
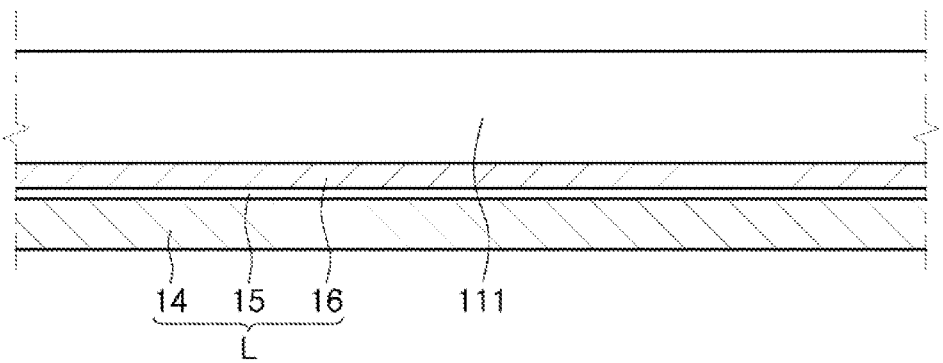

Next, as illustrated in FIG. 24B, an upper surface of the laminated semiconductor structure L (that is, a second surface) may be bonded to a temporary substrate 111, and the growth substrate 11 may be removed.

As the temporary substrate 111, various types of supports may be used, and the laminated semiconductor structure L may be bonded to the temporary substrate 111 using an adhesive material, such as glue. A process of removing the growth substrate 11 may be performed in the state of being bonded to the temporary substrate 111 (e.g., after the laminated semiconductor structure L is bonded to the temporary substrate 111). Various removal processes described with reference to FIG. 5D may be used.

Figure 24C:
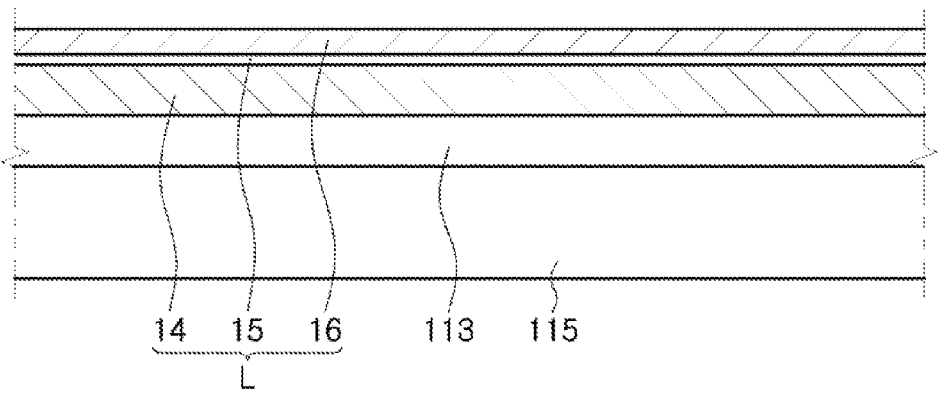

Next, as illustrated in FIG. 24C, a support substrate 115 may be bonded to a lower surface of the laminated semiconductor structure L (that is, a first surface), and the temporary substrate 111 may be removed from the laminated semiconductor structure L.

The support substrate 115 may be a glass substrate. As in the exemplary embodiment, the support substrate may be bonded using an adhesive layer 113. For example, the bonding process may be performed by coating the lower surface of the laminated semiconductor structure L with an adhesive material such as BCB using a method such as a spin coating process, bonding the glass substrate, and performing a heat treatment. Various forms of bonding processes described with reference to FIG. 5C may be used. As necessary, before the adhesive layer 113 is provided, a planarization process may be additionally introduced on the lower surface of the laminated semiconductor structure L. The temporary substrate 111 may be removed in a state in which the laminated semiconductor structure L is already bonded to the support substrate 115. As described above, in the case that the laminated semiconductor structure L is bonded to the temporary substrate 111 using glue, the temporary substrate 111 may be removed from the laminated semiconductor structure L through a simple heat treatment process.

Figure 24D:
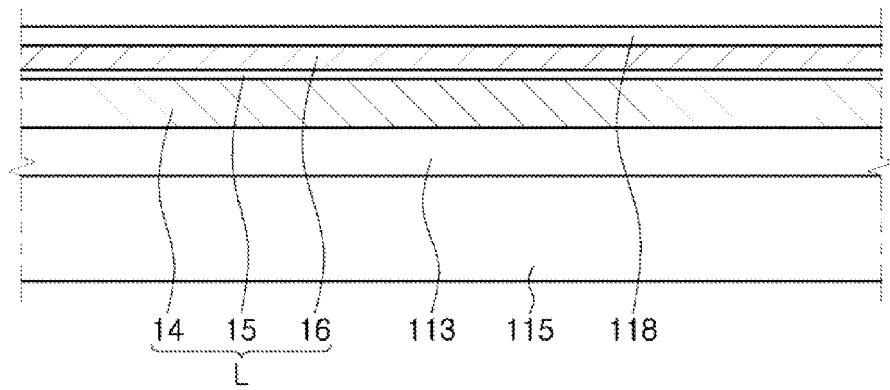

Next, as illustrated in FIG. 24D, a second electrode 118 connected to the second conductivity-type semiconductor layer 16 may be formed on the upper surface of the laminated semiconductor structure L (that is, the second surface).

The second electrode 118 may be a light-transmissive electrode such as ITO. The second electrode 118 may be formed on the entire upper surface of the second conductivity-type semiconductor layer 16 so as to have a wide area of contact with the second conductivity-type semiconductor layer 16.

Figure 24E:
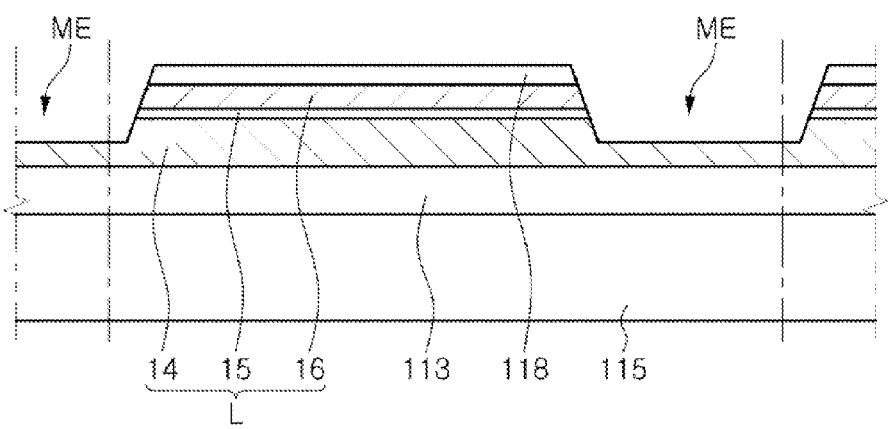

Next, as illustrated in FIG. 24E, portions of the second conductivity-type semiconductor layer 16 and the active layer 15 may be removed to expose a portion ME of the first conductivity-type semiconductor layer 14.

The process may be performed by selectively removing portions of the laminated semiconductor structure L. The selective removal process may be performed using mechanical cutting, chemical etching, or dry etching using plasma.

Figure 24F:
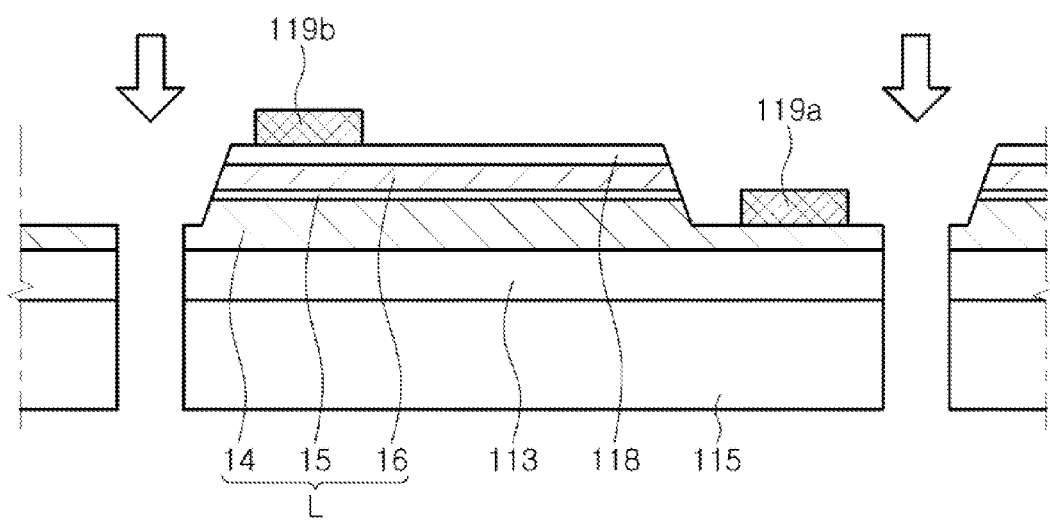

Next, as illustrated in FIG. 24F, first and second electrode pads 119a and 119b may be respectively formed on the exposed portion ME of the first conductivity-type semiconductor layer 14 and on the second conductivity-type semiconductor layer 16.

The growth substrate employed in the above-described embodiments may be a silicon substrate. In the case of the silicon substrate, the buffer layer 12 may have various structures. When the silicon substrate is used as a growth substrate 11 for a single crystalline nitride, a (111) plane of silicon may be used as a crystal growth plane, and the buffer layer 12 may include an AlN nucleation layer and a lattice buffer layer formed of an Al-containing nitride crystal. In addition to the buffer layer 12, an additional stress compensation layer may be used to compensate stresses caused by a difference in thermal expansion coefficient between the silicon substrate and the single crystalline nitride.

FIGS. 25A to 25D are cross-sectional views illustrating various examples of a buffer layer and a stress compensation layer usable in a process of growing a nitride semiconductor material using a silicon substrate.

Figure 25A:
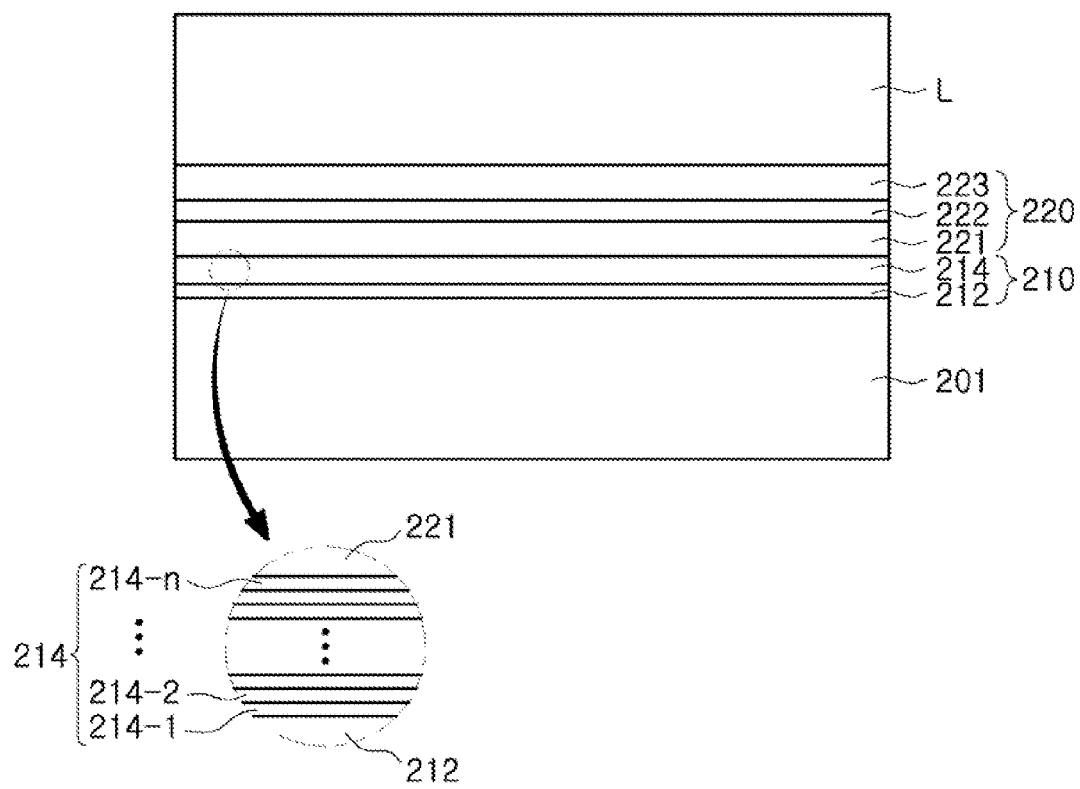
FIGS. 25A to 25D are cross-sectional views illustrating various examples of a buffer structure employable in the exemplary embodiments.

As illustrated in FIG. 25A, a buffer layer 210, a stress compensation layer 220, and a nitride laminated semiconductor structure L may be sequentially disposed on a silicon substrate 201.

The silicon substrate 201 may be a substrate formed of a silicon material only or a substrate partially including a silicon material. For example, a silicon-on-insulator (SOI) substrate may be used. An upper surface of the silicon substrate 201 may be a (111) plane.

The buffer layer 210 may include a nucleation layer 212 disposed on the silicon substrate 201, and a lattice buffer layer 214 disposed on the nucleation layer 212. The nucleation layer 212 may be AlN. The nucleation layer 212 may be provided to prevent a melt-back phenomenon. In addition, the nucleation layer 212 may provide a growth plane having improved wettability in order to favor crystal growth. For example, the nucleation layer 212 may have a size of several ten nanometers to several hundred nanometers (e.g., 10-900 nm).

The lattice buffer layer 214 may bend threading dislocations to reduce defects. As a thickness of the lattice buffer layer 214 increases, compressive stress relaxation in a first nitride semiconductor layer 221 which will be grown in a subsequent process may be reduced and defects may also be reduced. The thickness of the lattice buffer layer 214 may be several hundred nanometers to several micrometers.

The lattice buffer layer 214 may have a single composition throughout its thickness. However, as illustrated in FIG. 25A, the lattice buffer layer 214 may be a graded layer of $Al_xIn_yGa_{1-x-y}N$ ($0 \leq x$, $y \leq 1$, and $x+y \leq 1$). The graded structure according to the exemplary embodiment of the present disclosure may include a plurality of layers 214-1, 214-2, . . . and 214-n, and the plurality of layers 214-1, 214-2, . . . and 214-n may have a step-graded structure in which the composition of Al is gradually reduced from layer 214-1 to layer 214-n. In some embodiments, the lattice buffer layer 214 having the graded structure may be implemented in a ternary AlGaN in which the Al composition is controlled. In other embodiments, the lattice buffer layer 214 may not have a step-graded structure but may instead have a linearly graded structure in which the composition of Al is gradually (e.g., linearly) reduced through the thickness of the layer 214.

Such a lattice buffer layer 214 may gradually reduce a lattice mismatch between the AlN nucleation layer 212 and the first nitride semiconductor layer 221. In particular, since the lattice buffer layer 214 effectively generates a compressive stress during grain growth, it may reduce a tensile stress generated during cooling.

The stress compensation layer 220 may include a first nitride semiconductor layer 221, an intermediate layer 222, and a second nitride semiconductor layer 223, sequentially stacked on the lattice buffer layer 214. The first nitride semiconductor layer 221 may be a nitride crystal having a greater lattice constant than the lattice buffer layer 214. The first nitride semiconductor layer 221 may include $Al_xIn_yGa_{1-x-y}N$ ($0 \leq x$, $y \leq 1$, and $x+y<1$), for example, GaN. The first nitride semiconductor layer 221 may receive a compressive stress at an interface with the lattice buffer layer 214.

The compressive stress may be decreased as the thickness of the first nitride semiconductor layer 221 increases. When the thickness of the first nitride semiconductor layer 221 becomes greater than a threshold (e.g., greater than about 2 μm), it is difficult to suppress the tensile stress generated due to the difference in thermal expansion coefficient between the substrate 201 and the first nitride semiconductor layer 221 while cooled to room temperature after the growth process is finished, and even cracking may occur.

The intermediate layer 222 may be disposed on the first nitride semiconductor layer 221 to compensate for the tensile stress generated during cooling. The intermediate layer 222 may be a nitride crystal having a smaller lattice constant than the first nitride semiconductor layer 221. For example, the intermediate layer 222 may be $Al_xG_{a1-x}N$ ($0.4<x<1$).

The second nitride semiconductor layer 223 may be disposed on the intermediate layer 222. The second nitride semiconductor layer 223 may have a compressive stress. The compressive stress of the second nitride semiconductor layer 223 may compensate a relatively weak compressive stress or tensile stress applied to the first nitride semiconductor layer 221 to suppress crack generation. The second nitride semiconductor layer 223 may include $Al_xIn_yGa_{1-x-y}N$ ($0 \leq x$, $y \leq 1$, and $x+y<1$), similar to the first nitride semiconductor layer 221. For example, the second nitride semiconductor layer 223 may be GaN. At least one of the first and second nitride semiconductor layers 221 and 223 may be, but is not limited to, an undoped nitride layer. The nitride laminated semiconductor structure L may be the laminated semiconductor structure L described in the above exemplary embodiments.

Figure 25B:
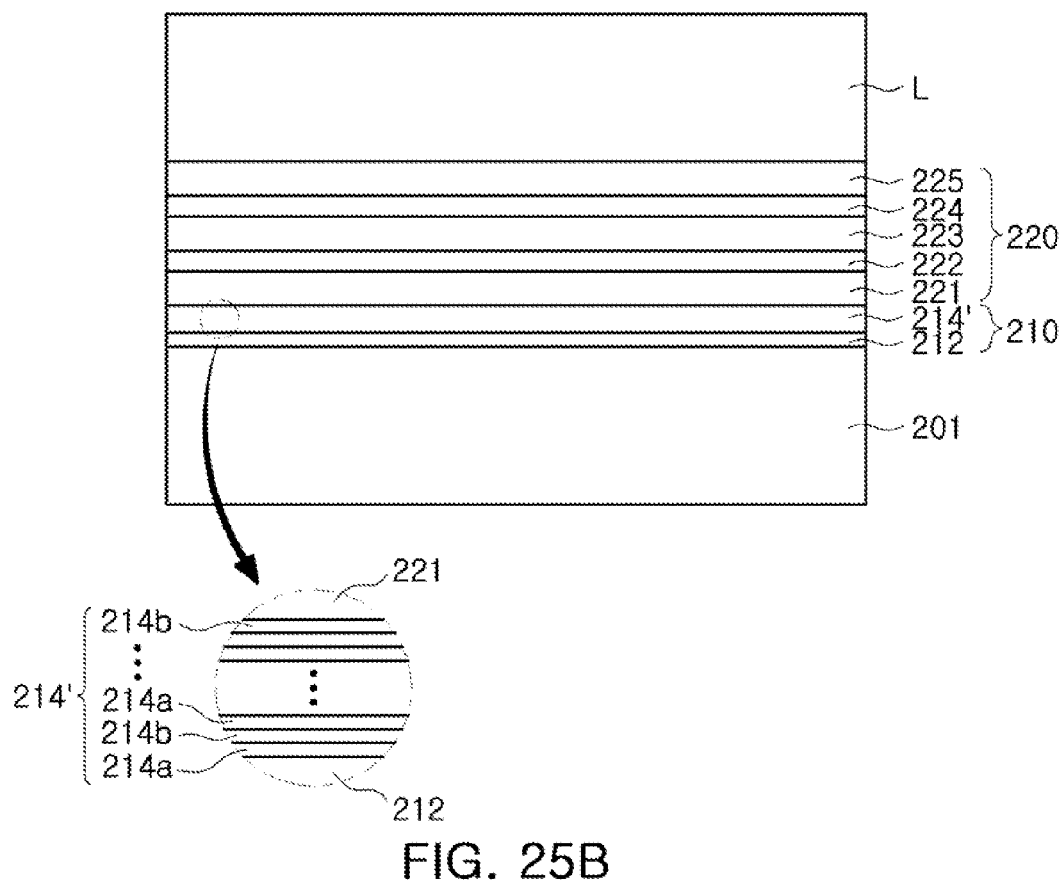

Referring to FIG. 25B, a buffer layer 210, a stress compensation layer 220, and a nitride laminated semiconductor structure L sequentially disposed on a silicon substrate 201 are illustrated, similar to FIG. 25A.

The buffer layer 210 may include an AlN nucleation layer 212 and a lattice buffer layer 214', similar to the buffer layer 210 illustrated in FIG. 25A. However, the lattice buffer layer 214' according to this exemplary embodiment may have a different structure from the lattice buffer layer 214 of buffer layer 210 illustrated in FIG. 25A.

The lattice buffer layer 214' may have a superlattice structure in which two or more layers 214a and 214b having different compositions are alternately stacked. For example, the lattice buffer layer 214' may be a superlattice layer of $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$ or $y1 \neq y2$, $x1+y1 \leq 1$, and $x2+y2 \leq 1$). As in the exemplary embodiment, the lattice buffer layer 214' having the superlattice structure may also release the stress between the silicon substrate 201 and the first nitride semiconductor layer 221.

The stress compensation layer 220 according to the exemplary embodiment of the present disclosure may further include a second intermediate layer 224 and a third nitride semiconductor layer 225, in addition to the first and second nitride semiconductor layers 221 and 223 and the first intermediate layer 222 disposed therebetween, as described with reference to FIG. 25A.

The second intermediate layer 224 and the third nitride semiconductor layer 225 may perform a similar function to the first intermediate layer 222 and the second nitride semiconductor layer 223. That is, the second intermediate layer 224 may be disposed on the second nitride semiconductor layer 223 to compensate the tensile stress during cooling. The second intermediate layer 224 may be a nitride crystal having a smaller lattice constant than the second nitride semiconductor layer 223. For example, the second intermediate layer 224 may be $Al_xGa_{1-x}N$ ($0.4<x<1$) similar to the first intermediate layer 222.

The third nitride semiconductor layer 225 may be disposed on the second intermediate layer 224. The third nitride semiconductor layer 225 may have a compressive stress, and such a compressive stress of the third nitride semiconductor layer 225 may compensate a relatively weak compressive stress or tensile stress applied to the first and second nitride semiconductor layers 221 and 223 (particularly, 223) thereunder to suppress crack generation.

The third nitride semiconductor layer 225 may include $Al_xIn_yGa_{1-x-y}N$ ($0 \leq x$, $y \leq 1$, and $x+y<1$) similar to the second nitride semiconductor layer 223. For example, the third nitride semiconductor layer 225 may be GaN.

Figure 25C:
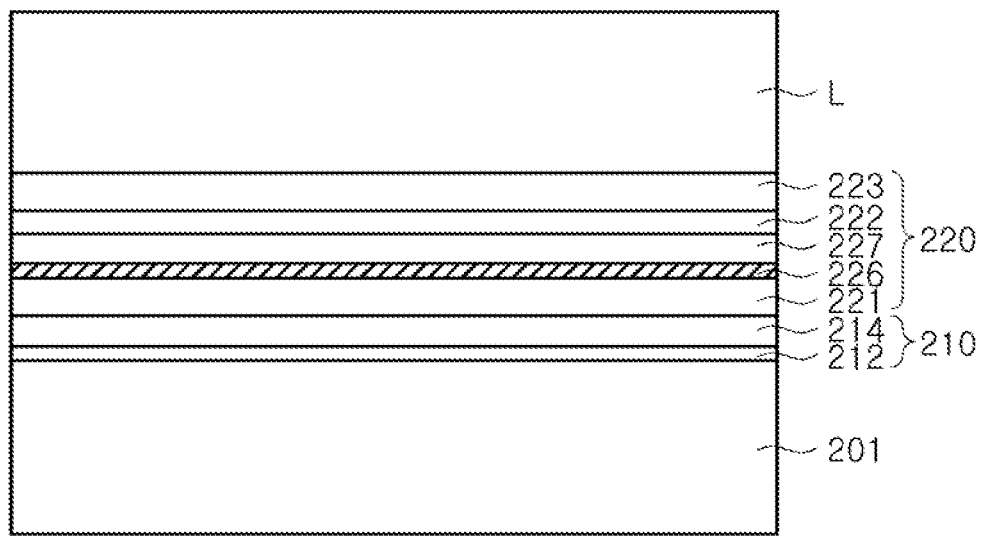

Referring to FIG. 25C, a buffer layer 210, a stress compensation layer 220, and a nitride laminated semiconductor structure L are sequentially disposed on a silicon substrate 201, similar to FIG. 25A. However, unlike the example illustrated in FIG. 25A, a mask layer 226 and a coalesced nitride layer 227 formed on the mask layer 226 may be further included.

The mask layer 226 may be disposed on the first nitride semiconductor layer 221.

Most of the threading dislocations in the first nitride semiconductor layer 221 may be blocked by the mask layer 226, and the remaining threading dislocations may be bent by the subsequently grown coalesced nitride layer 227. As a result, a defect density of the subsequently grown coalesced nitride layer 227 may be significantly reduced. The thickness and defect density of the coalesced nitride layer 227 may differ depending on growth conditions, for example, variables such as temperature, pressure, and a mole composition ratio of V/III sources.

The mask layer 226 may be formed of silicon nitride ($SiN_x$) or titanium nitride (TiN). For example, a $SiN_x$ mask layer 226 may be formed using silane ($SiH_4$) and an ammonia gas. The mask layer 226 may not fully cover a surface of the first nitride semiconductor layer 221. Accordingly, depending on a degree of covering the first nitride semiconductor layer 221 by the mask layer 226, an exposed area of the first nitride semiconductor layer 221 may be determined and a morphology of initial islands of the nitride crystal grown thereon may become different. For example, when the exposed area of the nitride semiconductor layer is reduced by increasing an area of the $SiN_x$ mask layer, the density of initial islands of the coalesced nitride layer 227 grown on the mask layer 226 may be reduced, but the size of coalesced islands may relatively increase. Accordingly, the thickness of the coalesced nitride layer 227 may also increase.

When the mask layer 226 is further included, stresses between the nitride semiconductor layer may be decoupled by the mask layer 226, and thus a compressive stress transmitted to the coalesced nitride layer 227 may be partially blocked. In addition, while growing islands are coalesced, a relative tensile stress may be generated in the coalesced nitride layer 227. As a result, the first nitride semiconductor layer 221 may receive a strong compressive stress and, on the other hand, the coalesced nitride layer 227 disposed on the mask layer 226 may receive a relatively weak compressive stress or tensile stress due to stress decoupling and island coalescence. Since, when the thickness of a layer having a relatively smaller compressive stress is beyond a critical point, cracks are generated during a cooling process, the thickness of the coalesced nitride layer 227 may be appropriately selected to satisfy the conditions in which cracks are not generated and the defect density is reduced.

Figure 25D:
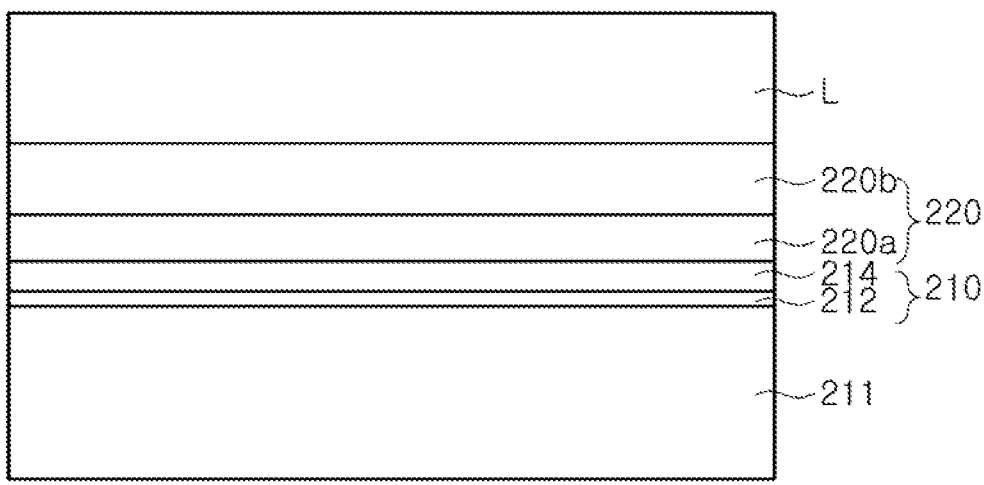

Referring to FIG. 25D, a buffer layer 210, a stress compensation layer 220, and a nitride laminated semiconductor structure L sequentially disposed on a silicon substrate 201 are illustrated.

The stress compensation layer 220 according to the exemplary embodiment of the present disclosure may include first and second nitride semiconductor layers 220a and 220b grown under different growth conditions from each other. By growing the first nitride semiconductor layer 220a in a two-dimensional mode so that the increase of surface roughness is controlled, the generation of twist grain boundaries at an interface with the second nitride semiconductor layer 220b may be reduced.

The first nitride semiconductor layer 220a may be formed in a first growth condition so as to have a surface roughness ratio of 3 or less with respect to the surface roughness of the buffer layer 210, and the second nitride semiconductor layer 220b may be formed on the first nitride semiconductor layer 220a in a second growth condition. Here, the second growth condition is different from the first growth condition to have a greater three-dimensional growth mode than the first growth condition. That is, at least one of the temperature, the pressure, and the mole composition ratio of V/III sources of the second growth condition may be different from that of the first growth condition.

In terms of temperature, a growth temperature of the first nitride semiconductor layer 220a may be set to be lower than a growth temperature of the second nitride semiconductor layer 220b. For example, the growth temperature of the first nitride semiconductor layer 220a may be in the range of higher than 900° C. and lower than 1040° C., preferably in the range of 930° C. to 1030° C. Under the growth temperature condition, it is possible to increase crystallinity and effectively reduce the twist grain boundaries in the first nitride semiconductor layer 220a.

Next, the second nitride semiconductor layer 220b may be grown in the second growth condition different from the first growth condition in order to enhance the three-dimensional growth mode. For example, the temperature range of the second growth condition may be set to be higher than that of the first growth condition of the second nitride semiconductor layer 220b. As described above, the second nitride semiconductor layer 220b may be grown at a temperature of 1040° C. or less by controlling a volume fraction of hydrogen in a nitrogen source gas to be 40% or less. The first nitride semiconductor layer 220a may also be grown at a temperature lower than 1040° C. by controlling a volume fraction of hydrogen, similar to the growth condition of the second nitride semiconductor layer 220b.

Meanwhile, the first growth condition of the first nitride semiconductor layer 220a may be set by controlling the pressure or the mole composition ratio of V/III sources. Generally, the lower the pressure, the greater the crystallinity and the compressive stress may be. Further, the greater the mole composition ratio of V/III sources, the greater the crystallinity and the compressive stress may be. For example, the pressure of the first growth condition may be in the range of 20 to 500 torr. The pressure of the second growth condition may be in the range of 50 to 300 torr.

The thickness of the first nitride semiconductor layer 220a may be in the range of 2 to 1000 nm. As the thickness of the first nitride semiconductor layer 220a increases, the generation of twist grain boundaries at an interface between the first nitride semiconductor layer 220a and the second nitride semiconductor layer 220b may be reduced. However, when the first nitride semiconductor layer 220a is thin, the crystallinity of the entire thin film may be deteriorated. This is because the first nitride semiconductor layer 220a is grown at a relatively lower temperature than the second nitride semiconductor layer 220b and thus has more defects. Therefore, it may be better to decrease the thickness of the first nitride semiconductor layer 220a and reduce the generation of the twist grain boundaries.

When the twist grain boundaries are reduced, the defects of the second nitride semiconductor layer 220b stacked on the first nitride semiconductor layer 220a may be reduced. That is, when the first nitride semiconductor layer 220a has a thickness of 2 to 1000 nm and a surface roughness ratio of 3 or less with respect to the surface roughness of the buffer layer 210, the defects of the second nitride semiconductor layer 220b stacked on the first nitride semiconductor layer 220a may be reduced. Accordingly, since the same level of crystallinity may be obtained at a small thickness, the entire structure may be formed to be thin. For example, the entire thickness of the buffer layer 210 and the stress compensation layer 220 may be 6 μm or less even without using a mask layer. Accordingly, a process time and cost for grain growth may be reduced.

The second nitride semiconductor layer 220b may be formed of $Al_xIn_yGa_{1-x-y}N$ (0≤x, y≤1, and x+y<1). The second nitride semiconductor layer 220b may be continuously (or directly) grown on the first nitride semiconductor layer 220a without any additional growth of a layer having a different composition. The second nitride semiconductor layer 220b may have the same composition as the first nitride semiconductor layer 220a. For example, the first and second nitride semiconductor layers 220a and 220b may be GaN. In some embodiments, the first nitride semiconductor layer 220a may be undoped GaN, and the second nitride semiconductor layer 220b may be n-type GaN.

The above-described buffer layer and stress compensation layer may be removed together during the substrate removal process or after the substrate is removed. In some embodiments, when the stress compensation layer has sufficient conductivity, it may not be removed and may be provided as a contact area. In other embodiments, the buffer layer and the stress compensation layer may be selectively removed to expose the contact area of the first conductivity-type semiconductor layer.

Figure 26:
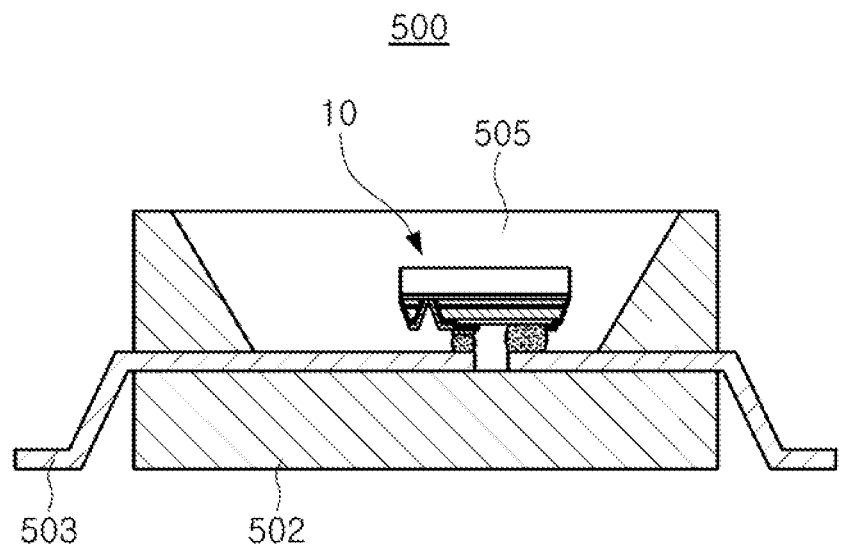
FIGS. 26 and 27 are cross-sectional views illustrating semiconductor light-emitting device packages according to exemplary embodiments.
Figure 27:
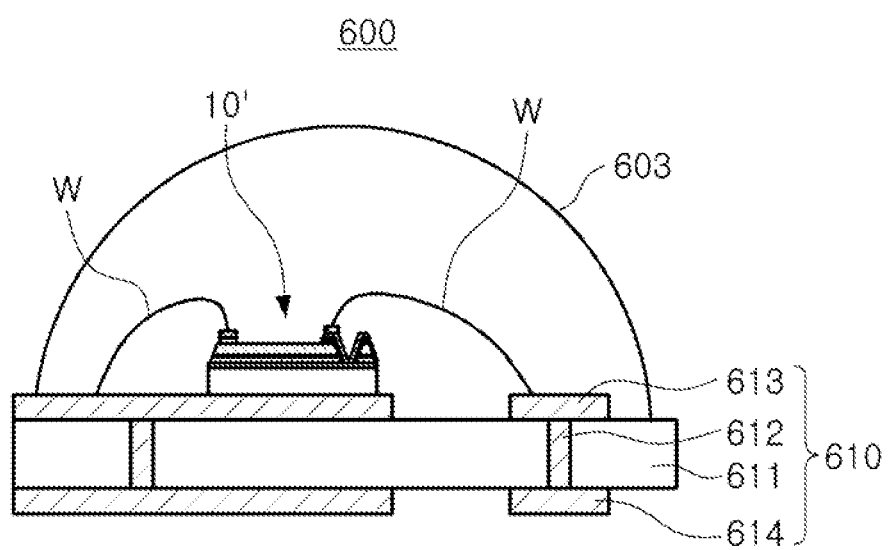

FIGS. 26 and 27 are cross-sectional views illustrating semiconductor light-emitting device packages according to exemplary embodiments of the present disclosure.

A semiconductor light-emitting device package 500 illustrated in FIG. 26 may include the semiconductor light-emitting device 10 illustrated in FIG. 26, a package body 502, and a pair of lead frame 503.

The semiconductor light-emitting device 10 may be mounted on lead frame 503, and each electrode thereof may be electrically connected to the lead frame 503. As necessary, the semiconductor light-emitting device 10 may be mounted on an area other than the lead frame 503, for example, on the package body 502. In addition, the package body 502 may have a cup (U) shape in order to improve reflectance of light, and an encapsulant 505 formed of a light-transmissive material may be formed in the reflective cup in order to encapsulate the semiconductor light-emitting device 10.

The semiconductor light-emitting device usable in the exemplary embodiment may advantageously employ another semiconductor light-emitting device having a flip-chip structure besides the semiconductor light-emitting device 10 illustrated in FIG. 1. Any of the semiconductor light-emitting devices (except the configuration related to the circuit substrate) illustrated in FIGS. 6, 9, 11, 13, 15, and 16A to 16C may be employed in the semiconductor light-emitting device package 500 illustrated in FIG. 26.

A semiconductor light-emitting device package 600 illustrated in FIG. 27 may include the semiconductor light-emitting device 10' illustrated in FIG. 17, a mounting board 610, and an encapsulant 603.

The semiconductor light-emitting device 10' may be mounted on the mounting board 610 and electrically connected to the mounting board 610 through one or more wires W.

The mounting board 610 may include a substrate body 611, one or more upper electrode(s) 613, one or more lower electrode(s) 614, and one or more through-electrode(s) 612 connecting one upper electrode 613 to one lower electrode 614. The mounting board 610 may be a PCB, an MCPCB, an MPCB, a FPCB, or the like, and the structure of the mounting board 610 may be embodied in various forms.

The encapsulant 603 may have a dome-shaped lens structure having a convex upper surface. In some embodiments, the encapsulant 603 may have a convex or concave lens structure to adjust an orientation angle of light emitted through the upper surface of the encapsulant 603.

As needed, a wavelength-conversion material, such as a phosphor or a quantum dot, may be disposed in the encapsulants 505 and 603 or on a surface of the semiconductor light-emitting devices 10 and 10'.

The phosphor or the quantum dot may be appropriately selected from the above-described phosphors and quantum dots.

For example, the phosphor may be at least one of phosphors excited by light emitted from the semiconductor light-emitting device 10 and 10' and may emit light having a different wavelength than the light emitted by devices 10 and 10'. Through the phosphors, light having various colors may be emitted.

When the semiconductor light-emitting devices 10 and 10' emit blue light, a light-emitting device package including at least one of yellow, green, and red phosphors may emit light having a variety of color temperatures depending on a mixing ratio of the phosphors. Alternatively, a light-emitting device package including the semiconductor light-emitting devices 10 and 10' with a green or red phosphor may emit green or red light. By combining the light-emitting device package emitting white light and the light-emitting device package emitting green or red light, a color temperature and a color rendering index (CRI) of white light may be controlled. In addition, the light-emitting device package 100 may be configured to include at least one of light-emitting devices emitting at least one of purple, blue, green, red, or infrared light. In this case, the light-emitting device package 100 or a module product including the light-emitting device package 100 may be controlled to have a CRI level ranging from a sodium (Na) lamp level (CRI: 40) to a solar light level (CRI: 100) and may generate white light having various color temperatures ranging from 2000K to 20000K. Further, as necessary, the light-emitting device package 100 may generate visible light having purple, blue, green, red, orange colors, or infrared light to adjust an illumination color according to a surrounding atmosphere or mood. Further, the light source apparatus may generate light having a special wavelength stimulating plant growth.

Figure 28:
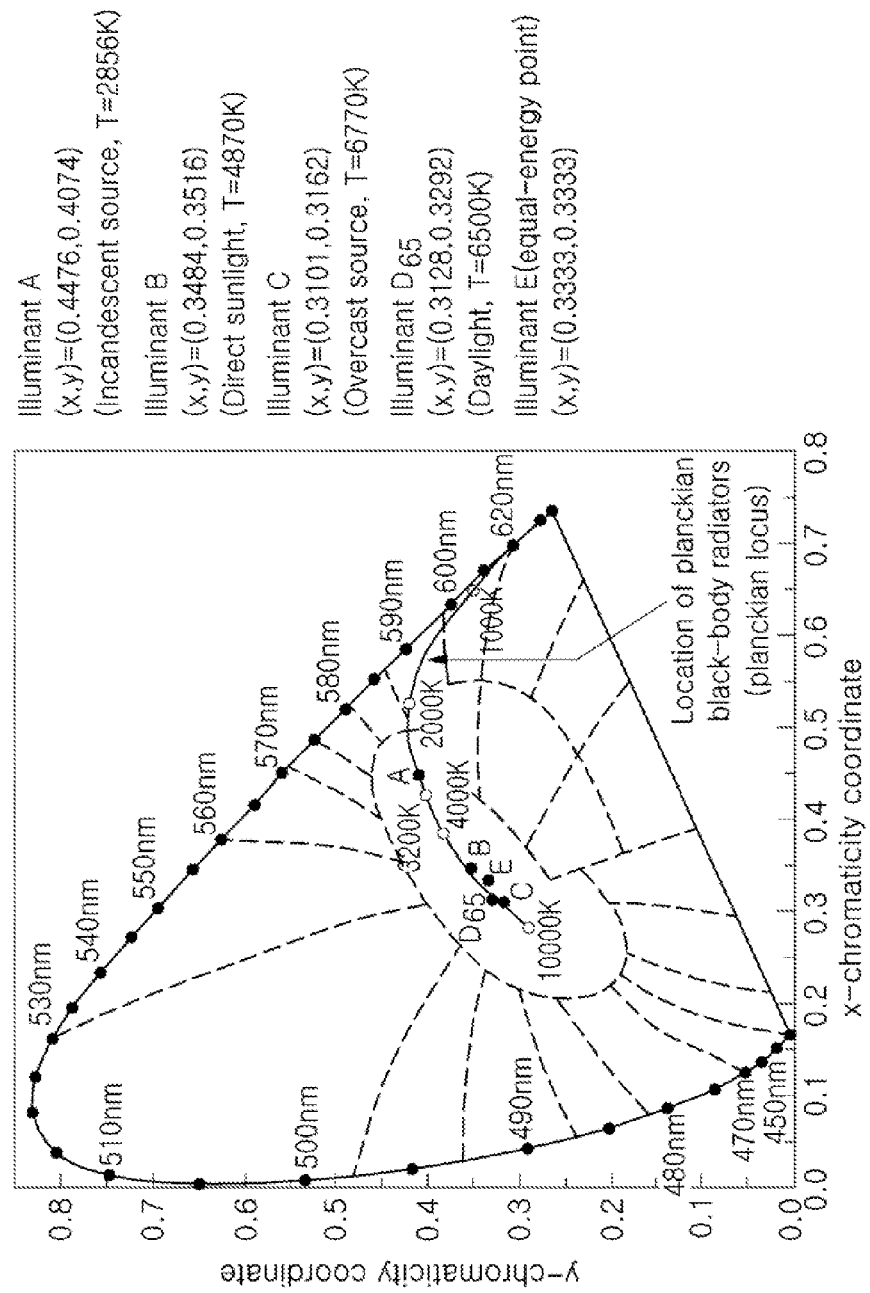
FIG. 28 is a CIE 1931 chromaticity coordinate system for describing a wavelength conversion material employable in an exemplary embodiment.

Referring to the CIE 1931 chromaticity coordinate system illustrated in FIG. 28, white light generated by combining yellow, green, and red phosphors, and/or green and red LEDs with UV or a blue LED may have two or more peak wavelengths and may be positioned in a segment linking (x, y) coordinates (0.4476, 0.4074), (0.3484, 0.3516), (0.3101, 0.3162), (0.3128, 0.3292), and (0.3333, 0.3333) of the CIE 1931 chromaticity coordinate system illustrated in FIG. 28. Alternatively, the white light may be positioned in a region surrounded by a spectrum of the segment and the black body radiation spectrum. A color temperature of the white light corresponds to 2000K to 20000K.

In some exemplary embodiments, a white light-emitting device package having a color temperature of 4000K, a white light-emitting device package having a color temperature of 3000K, and a red light-emitting device package may be disposed in a white light-emitting package module. The color temperature of the white light-emitting package module may be controlled to be within the range of 2000K to 4000K by combining the light-emitting device packages. In addition, a white light-emitting package module having a CRI Ra of 85 to 99 may be fabricated. Such a light source module may be advantageously utilized in a bulb-type illumination apparatus which will be illustrated in FIG. 31.

In other embodiments, a white light-emitting device package having a color temperature of 5000K and a white light-emitting device package having a color temperature of 2700K may be disposed in a white light-emitting package module. The color temperature of the white light-emitting package module may be controlled to be within the range of 2700K to 5000K by combining the light-emitting device packages. In addition, a white light-emitting package module having a CRI Ra of 85 to 99 may be fabricated. Such a light source module may be advantageously utilized in a bulb-type illumination apparatus which will be illustrated in FIG. 31.

The number of the light-emitting device packages may differ according to basic color temperature settings. When the basic color temperature settings are around 4000K, the number of white light-emitting device packages corresponding to a color temperature of 4000K may be more than the number of white light-emitting device package corresponding to a color temperature of 3000K or the number of red light-emitting device packages.

In this manner, one or more semiconductor light-emitting device(s) according to the above-described exemplary embodiment and a package including one or more of such device(s) may be advantageously used in various applications.

Figure 29:
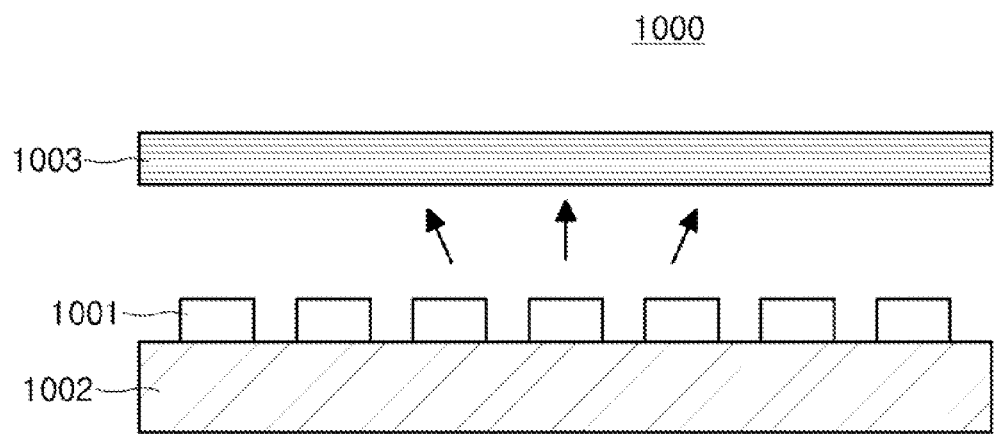
FIGS. 29 and 30 illustrate examples in which a semiconductor light-emitting device according to an exemplary embodiment is applied to a backlight unit.
Figure 30:
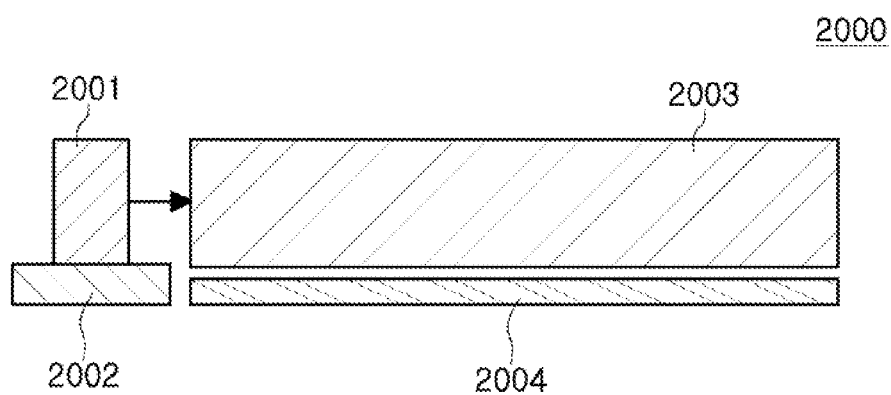

FIGS. 29 and 30 illustrate examples in which a semiconductor light-emitting device according to an exemplary embodiment of the present disclosure is incorporated into a backlight unit.

Referring to FIG. 29, a backlight unit 1000 may include a light source 1001 mounted on a substrate 1002, and one or more optical sheets 1003 disposed on the light source 1001. The light source 1001 may include the above-described semiconductor light-emitting device or a package including the semiconductor light-emitting device.

The light source 1001 in the backlight unit 1000 illustrated in FIG. 29 emits light toward a top surface where a liquid crystal display (LCD) is disposed. On the contrary, in another backlight unit 2000 illustrated in FIG. 30, a light source 2001 mounted on a substrate 2002 emits light in a lateral direction, and the emitted light may be incident to a light guide plate 2003 and converted to the form of surface light. Light passing through the light guide plate 2003 is emitted upwardly, and a reflective layer 2004 may be disposed on a bottom surface of the light guide plate 2003 to improve light extraction efficiency.

Figure 31:
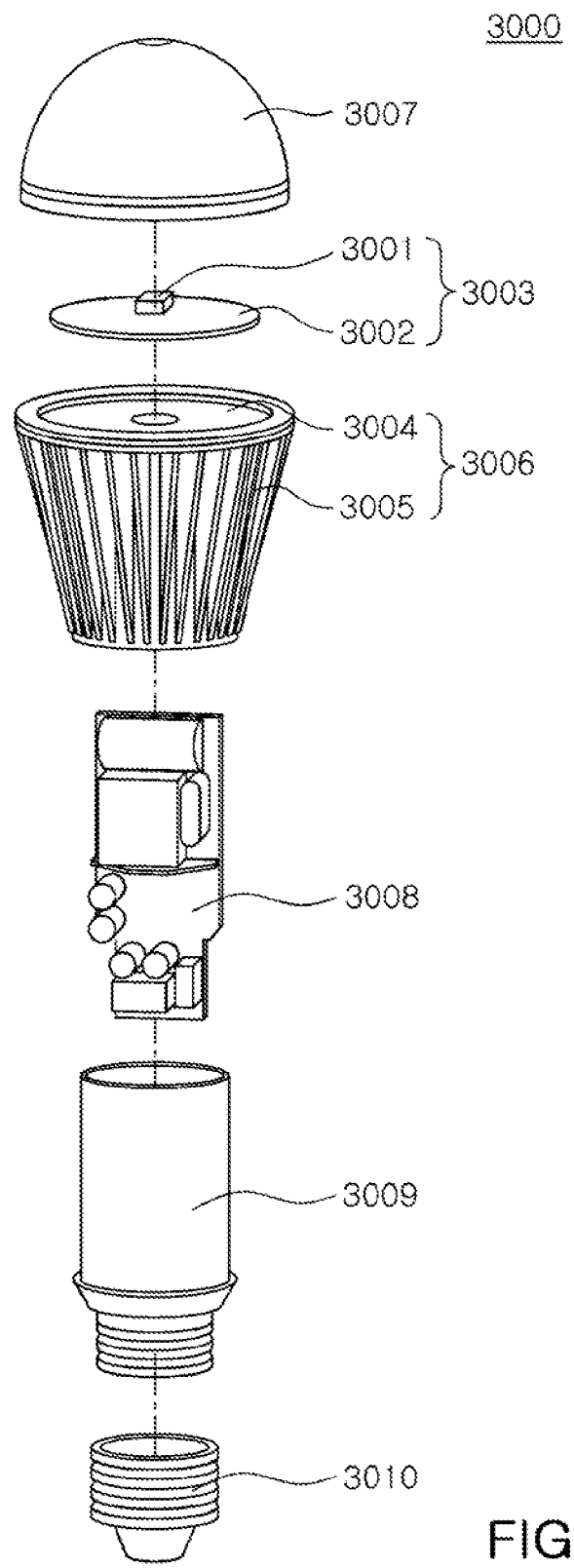
FIG. 31 illustrates an example of an illumination apparatus including a semiconductor light-emitting device according to an exemplary embodiment.

FIG. 31 is an exploded perspective view illustrating an illumination apparatus including a semiconductor light-emitting device according to an exemplary embodiment of the present disclosure.

The illumination apparatus 3000 of FIG. 31 is illustrated as a bulb-type lamp as an example, and includes a light-emitting module 3003, a driving unit 3008, and an external connection portion 3010.

In addition, external structures, such as external and internal housings 3006 and 3009 and a cover 3007, may be further included. The light-emitting module 3003 may include a light source 3001, that is, one or more of the above-described semiconductor light-emitting device or a package including the semiconductor light-emitting device, and a circuit board 3002 with the light source 3001 mounted thereon. For example, first and second electrodes of the semiconductor light-emitting device may be electrically connected to an electrode pattern of the circuit board 3002. In this exemplary embodiment, a single light source 3001 is mounted on the circuit board 3002, but a plurality of light sources 3001 may be mounted as needed.

The external housing 3006 may function as a heat dissipation unit, and include a heat dissipation plate 3004 in direct contact with the light-emitting module 3003 to enhance a heat dissipation effect, and a heat radiation fin 3005 surrounding side surfaces of the illumination apparatus 3000. The cover 3007 may be installed on the light-emitting module 3003, and have a convex lens shape. The driving unit 3008 may be installed in the internal housing 3009 and connected to the external connection portion 3010, such as a socket structure, to receive power from an external power source.

In addition, the driving unit 3008 may function to convert the power to an appropriate current source capable of driving the light source 3001 of the light-emitting module 3003. For example, the driving unit 3008 may be configured as an AC-DC converter, a rectifying circuit component, or the like.

Figure 32:
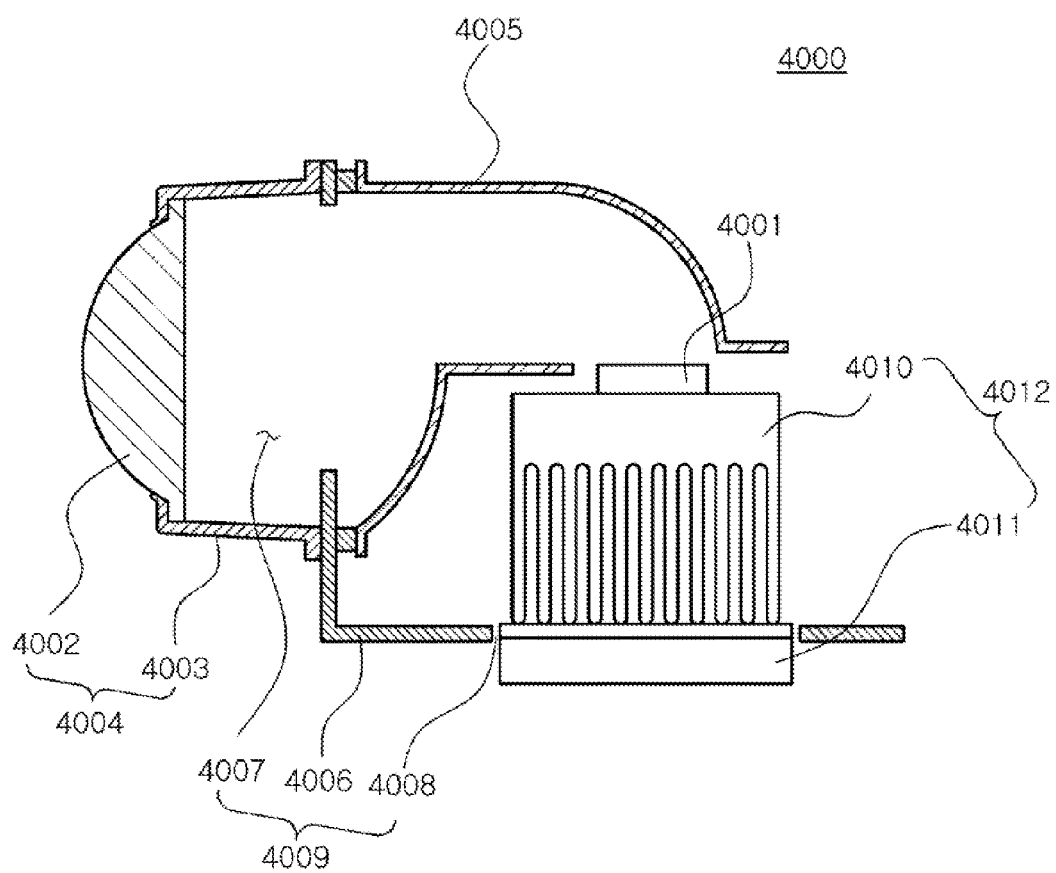
FIG. 32 illustrates an example of a headlamp including a semiconductor light-emitting device according to an exemplary embodiment.

FIG. 32 illustrates an example in which a semiconductor light-emitting device according to an exemplary embodiment of the present disclosure is applied to a headlamp.

Referring to FIG. 32, a headlamp 4000 used as a vehicle lamp, or the like, may include a light source 4001, a reflective unit 4005, and a lens cover unit 4004. The lens cover unit 4004 may include a hollow-type guide 4003 and a lens 4002. The light source 4001 may include the above-described semiconductor light-emitting device or a package including the semiconductor light-emitting device.

The headlamp 4000 may further include a heat dissipation unit 4012 dissipating heat generated by the light source 4001 outwardly. In order to effectively dissipate heat, the heat dissipation unit 4012 may include a heat sink 4010 and a cooling fan 4011. In addition, the headlamp 4000 may further include a housing 4009 fixedly supporting the heat dissipation unit 4012 and the reflective unit 4005. The housing 4009 may have a body 4006 and a central hole 4008 formed in one surface thereof, in which the heat dissipation unit 4012 is coupledly installed.

The housing 4009 may include a front hole 4007 formed on the other surface integrally connected to the one surface and bent in a right angle direction. The front hole 4007 may fix the reflective unit 4005 to be disposed over the light source 4001. Accordingly, a front side of the housing 4009 may be open by the reflective unit 4005. The reflective unit 4005 is fixed to the housing 4009 such that the opened front side corresponds to the front hole 4007, and thereby light reflected by the reflective unit 4005 may pass through the front hole 4007 to be emitted outwardly.

As set forth above, according to the exemplary embodiments of the present disclosure, a chip-on-board (COB) type semiconductor light-emitting device having various structures may be provided using a simple support substrate other than a support substrate having an electrode structure. In particular, in a flip-chip structure, since the semiconductor light-emitting device has a heat dissipation path that does not pass through the support substrate, a superior heat dissipating performance may be provided. In particular, the structure may be usefully applied to a process of fabricating the nitride semiconductor light-emitting device using a silicon substrate.

While exemplary embodiments have been shown and described above, it will be apparent to those skilled in the art that modifications and variations could be made without departing from the scope of the present disclosure as defined by the appended claims.

What is claimed is:
1. A semiconductor light-emitting device, comprising:
a laminated semiconductor structure including a first surface and a second surface opposing each other, a first conductivity-type semiconductor layer and a second conductivity-type semiconductor layer respectively forming the first surface and the second surface, and an active layer disposed between the first conductivity-type semiconductor layer and the second conductivity-type semiconductor layer;

a first electrode disposed on the first surface of the laminated semiconductor structure and connected to the first conductivity-type semiconductor layer;

a second electrode disposed on a majority of the second surface of the laminated semiconductor structure and connected to the second conductivity-type semiconductor layer;

a connecting electrode connected to the second electrode and extending to the first surface of the laminated semiconductor structure;

a support substrate disposed on the second electrode; and an insulating layer disposed to insulate the connecting electrode from the active layer and the first conductivity-type semiconductor layer.

2. The semiconductor light-emitting device of claim 1, wherein the second electrode includes a light-transmissive electrode, and the support substrate includes a light-transmissive substrate.

3. The semiconductor light-emitting device of claim 2, wherein the first electrode includes a reflective electrode.

4. The semiconductor light-emitting device of claim 3, further comprising first and second conductive bumps respectively disposed on portions of the first electrode and the connecting electrode on the first surface.

5. The semiconductor light-emitting device of claim 1, wherein the laminated semiconductor structure includes a through-hole extending from the first surface to the second surface to expose a portion of the second electrode, and the connecting electrode is connected to the exposed portion of the second electrode, disposed on an inner sidewall of the through-hole, and extends to the first surface of the laminated semiconductor structure.

6. The semiconductor light-emitting device of claim 5, further comprising an etch-stop layer disposed on the portion of the second electrode connected to the through-hole.

7. The semiconductor light-emitting device of claim 6, wherein the etch-stop layer includes a conductive material and is disposed between the second electrode and the support substrate.

8. The semiconductor light-emitting device of claim 7, wherein at least a section of the portion of the second electrode is removed to expose a portion of the etch-stop layer, and the connecting electrode is connected to the exposed portion of the etch-stop layer.

9. The semiconductor light-emitting device of claim 7, further comprising at least one finger electrode connected to the etch-stop layer and extending into a space between the second electrode and the support substrate.

10. The semiconductor light-emitting device of claim 6, wherein the etch-stop layer includes an insulating material, and is located to surround the exposed portion of the second electrode.

11. The semiconductor light-emitting device of claim 6, further comprising a planarization layer located between the second electrode and the support substrate, and having a planarized surface bonded to the support substrate.

12. The semiconductor light-emitting device of claim 5, wherein the insulating layer is disposed on the inner sidewall of the through-hole and extends to the first surface of the laminated semiconductor structure.

13. The semiconductor light-emitting device of claim 12, wherein the insulating layer extends to cover a portion of the first electrode, and the connecting electrode extends onto the extending portion of the insulating layer.

14. The semiconductor light-emitting device of claim 1, further comprising an insulating member surrounding side surfaces of the laminated semiconductor structure.

15. The semiconductor light-emitting device of claim 14, wherein the connecting electrode is disposed on the side surfaces of the laminated semiconductor structure, and the insulating layer is disposed between the connecting electrode and the side surfaces of the laminated semiconductor structure.

16. The semiconductor light-emitting device of claim 14, wherein the insulating member includes a light-transmissive adhesive material and is disposed between the second surface of the laminated semiconductor structure and the support substrate to bond the laminated semiconductor structure to the support substrate.

17. The semiconductor light-emitting device of claim 1, further comprising an electrode protection layer disposed between the second electrode and the support substrate and configured to protect the second electrode.

18. The semiconductor light-emitting device of claim 1, wherein the first conductivity-type semiconductor layer is an n-type semiconductor layer and the second conductivity-type semiconductor layer is a p-type semiconductor layer.

19. A semiconductor light-emitting device, comprising:

a laminated semiconductor structure including a first surface and a second surface opposing each other, a first conductivity-type semiconductor layer and a second conductivity-type semiconductor layer respectively forming the first surface and the second surface, and an active layer disposed between the first conductivity-type semiconductor layer and the second conductivity-type semiconductor layer;

a first electrode disposed on the first surface of the laminated semiconductor structure and connected to the first conductivity-type semiconductor layer;

a second electrode disposed on a majority of the second surface of the laminated semiconductor structure, connected to the second conductivity-type semiconductor layer, and formed of a light-transmissive electrode;

a connecting electrode connected to the second electrode to extend to the first surface of the laminated semiconductor structure, wherein a portion of the connecting electrode disposed on the first surface is provided as a pad area;

a light-transmissive substrate disposed on the second electrode; and an insulating layer disposed to insulate the connecting electrode from the active layer and the first conductivity-type semiconductor layer, wherein the insulating layer extends to cover a portion of the first electrode, and the pad area of the connecting electrode is disposed on the extended portion of the insulating layer.

20. The semiconductor light-emitting device of claim 19, wherein the connecting electrode is disposed on side surfaces of the laminated semiconductor structure, and the insulating layer is disposed between the connecting electrode and the side surfaces of the laminated semiconductor structure, and further comprising an insulating member surrounding the side surfaces and the first surface of the laminated semiconductor structure and formed of a light-transmissive adhesive material to be bonded to the light-transmissive substrate.

* * * * *